United States Patent
Gan et al.

(10) Patent No.: US 12,267,163 B2
(45) Date of Patent: Apr. 1, 2025

(54) RETRANSMITTED DATA SENDING METHOD, RETRANSMITTED DATA RECEIVING METHOD, AND APPARATUS

(71) Applicant: Huawei Technologies Co., Ltd., Shenzhen (CN)

(72) Inventors: Ming Gan, Shenzhen (CN); Shimon Shilo, Hod Hasharon (IL); Xun Yang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 656 days.

(21) Appl. No.: 17/517,367

(22) Filed: Nov. 2, 2021

(65) Prior Publication Data

US 2022/0060280 A1    Feb. 24, 2022

Related U.S. Application Data

(63) Continuation of application No. PCT/CN2020/088282, filed on Apr. 30, 2020.

(30) Foreign Application Priority Data

May 5, 2019   (CN) .......................... 201910368702.8

(51) Int. Cl.
H03M 13/11     (2006.01)
H03M 13/00     (2006.01)
(Continued)

(52) U.S. Cl.
CPC .......... H04L 1/0061 (2013.01); H04L 1/0068 (2013.01); H04L 1/1835 (2013.01); H04L 1/1861 (2013.01)

(58) Field of Classification Search
CPC ... H04L 1/0061; H04L 1/0068; H04L 1/1835; H04L 1/1861
See application file for complete search history.

(56) References Cited

U.S. PATENT DOCUMENTS 9,876,614 B1    1/2018 Sun et al.
2017/0230149 A1   8/2017 Wang et al.
(Continued)

FOREIGN PATENT DOCUMENTS

CN       106301710 A      1/2017
WO       2015006640 A1    1/2015
WO       WO-2020098938 A1 *  5/2020 ........... H04L 1/0008

OTHER PUBLICATIONS

"3rd Generation Partnership Project; Technical Specification Group Radio Access Network; Study on NR-based Access to Unlicensed Spectrum; (Release 16)," 3GPP TR 38.889 V0.2.0, pp. 1-49, 3rd Generation Partnership Project, Valbonne, France (Oct. 2018).

(Continued)

*Primary Examiner* — Yemane Mesfin
*Assistant Examiner* — Jia Hao Deng
(74) *Attorney, Agent, or Firm* — Leydig, Voit & Mayer, Ltd.

(57) ABSTRACT

This application discloses a retransmitted data sending method, a retransmitted data receiving method, and a related apparatus, and relates to the field of communications technologies. In this solution, a transmit end generates a retransmitted codeword based on information bits of each codeword corresponding to an incorrect MPDU, where the retransmitted codeword includes a codeword having some of information bits included in the incorrect MPDU. For the codeword having some of information bits included in the incorrect MPDU, the transmit end punctures a correctly received information bit in the codeword, and then sends the information bit. In this way, a receive end may directly perform combined decoding or joint decoding on an LLR of a codeword of a retransmitted MPDU and an LLR of a codeword of an MPDU that is incorrectly received last time. This improves transmission efficiency and transmission reliability.

20 Claims, 16 Drawing Sheets

(51) Int. Cl.
  *H04L 1/00* (2006.01)
  *H04L 1/1812* (2023.01)
  *H04L 1/1829* (2023.01)
  *H04W 84/12* (2009.01)

(56) References Cited

U.S. PATENT DOCUMENTS

2020/0344007 A1* 10/2020 Chen .................. H04L 1/1819
2020/0389259 A1* 12/2020 Zhang ................. H04L 1/1896

OTHER PUBLICATIONS

"IEEE Standard for Information technology—Telecommunications and information exchange between systems Local and metropolitan area networks—Specific requirements; Part 11: Wireless LAN Medium Access Control (MAC) and Physical Layer (PHY) Specifications," IEEE Std 802.11™-2016, Total 3534 pages (Dec. 7, 2016).

"IEEE Standard for Information technology—Telecommunications and information exchange between systems Local and metropolitan area networks—Specific requirements; Part 11: Wireless LAN Medium Access Control (MAC) and Physical Layer (PHY) Specifications; Amendment 4: Enhancements for Very High Throughput for Operation in Bands below 6 GHz," IEEE Std 802.11ac™-2013, Total 425 pages (Dec. 11, 2013).

"Draft Standard for Information technology—Telecommunications and information exchange between systems Local and metropolitan area networks—Specific requirements; Part 11: Wireless LAN Medium Access Control (MAC) and Physical Layer (PHY) Specifications; Amendment 6: Enhancements for High Efficiency WLAN," IEEE P802.11ax™/D2.2, Total 620 pages (Feb. 2018).

Shilo et al., "HARQ for EHT—Further Information," doc.: IEEE 802.11-18/1955r0, Total 10 pages (Nov. 2018).

* cited by examiner

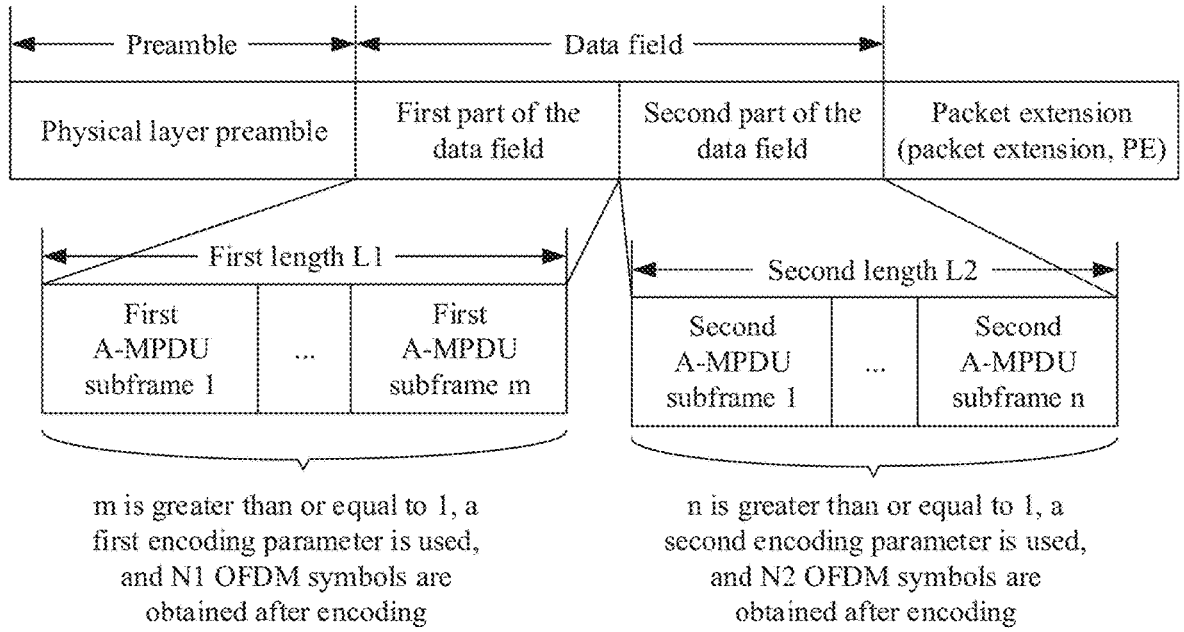

FIG. 11

S600: A receive end receives at least one first A-MPDU subframe, where one first A-MPDU subframe includes a first-type MPDU, and the first A-MPDU subframe is encoded by using a previous-transmission encoding parameter to encapsulate the first A-MPDU frame into a previously transmitted PPDU S601: Receive an aggregate media access control protocol data unit A-MPDU, where the A-MPDU includes at least one first A-MPDU subframe and at least one second A-MPDU subframe, one first A-MPDU subframe includes one first-type MPDU, and one second A-MPDU subframe includes one second-type MPDU S602: Decode the PPDU by separately using a first encoding parameter and a second encoding parameter, to obtain the at least one first A-MPDU subframe and the at least one second A-MPDU subframe

FIG. 12

RETRANSMITTED DATA SENDING METHOD, RETRANSMITTED DATA RECEIVING METHOD, AND APPARATUS

CROSS-REFERENCE TO RELATED APPLICATIONS

This application is a continuation of International Application No. PCT/CN2020/088282, filed on Apr. 30, 2020, which claims priority to Chinese Patent Application No. 201910368702.8, filed on May 5, 2019. The disclosures of the aforementioned applications are hereby incorporated by reference in their entireties.

TECHNICAL FIELD

This application relates to the field of communications technologies, and in particular, to a retransmitted data sending method, a retransmitted data receiving method, and an apparatus.

BACKGROUND

In a communications system, signal transmission may fail due to a time-varying characteristic and multipath fading of a wireless channel. Methods such as a forward error correction (FEC) coding technology and an automatic repeat request (ARQ) are usually used for error control. For example, in a wireless local area network (WLAN), when an access point (AP) sends data to a station (STA), if the STA successfully receives the data, the STA feeds back an acknowledgment (ACK) frame to the AP; or if the STA fails to receive the data, the STA does not feed back any frame. If the AP does not receive any feedback, the AP retransmits the sent data, to perform error control through retransmission.

Based on the ARQ, a hybrid ARQ (hybrid automatic repeat request, HARQ) is introduced into standards such as long term evolution (LTE). A receive end pre-stores data received for the first time, and when receiving retransmitted data, the receive end combines the data received for the first time and the data received during the retransmission, to increase a decoding success rate. Because the HARQ may further increase a success rate of receiving the retransmitted data, a HARQ mechanism is usually used in a deep attenuation area or an edge area in a wireless network. The mechanism may usually enable a transmit end to use a higher modulation and coding scheme (MCS), thereby improving transmission efficiency.

Because retransmission requires a buffer to store data that needs to be combined, no retransmission mechanism is introduced in previous standards such as 802.11a/g/n/ac/ax. In a future WLAN system, for example, a next-generation WLAN (802.11be) system, due to improvement of hardware performance, a retransmission technology that can improve transmission reliability and efficiency is likely to be selected as one of technologies of a next-generation Wi-Fi standard. Therefore, how to design a retransmission technology suitable for the WLAN system is significant.

SUMMARY

Embodiments of this application provide a data retransmission method and apparatus, to improve reliability and transmission efficiency of a wireless communications system. The technical solutions are as follows:

According to a first aspect, a retransmitted data sending method is provided, applied to a transmit end. The method includes: determining a first MPDU that needs to be retransmitted in a previously transmitted aggregate media access control protocol data unit A-MPDU, where the first MPDU is included in a first A-MPDU subframe of the A-MPDU, at least one previously transmitted LDPC codeword obtained after the first A-MPDU subframe is encoded includes a first LDPC codeword, and information bits of the first LDPC codeword correspond to a first information bit set in the first A-MPDU subframe and a second information bit set excluded in the first A-MPDU subframe; and obtaining a second LDPC codeword based on the information bits of the first LDPC codeword; and sending at least one retransmitted LDPC codeword obtained after the first A-MPDU subframe is encoded, where the at least one retransmitted LDPC codeword includes a punctured codeword, and the puncture codeword is all or some of encoded bits obtained after the second information bit set in the second LDPC codeword is punctured.

In a possible implementation, the at least one retransmitted LDPC codeword further includes at least one unpunctured codeword, and all information bits corresponding to the at least one unpunctured codeword are included in the first A-MPDU subframe.

In a possible implementation, that information bits of the first LDPC codeword correspond to a first information bit set in the first A-MPDU subframe and a second information bit set excluded in the first A-MPDU subframe includes: The information bits of the first LDPC codeword are information bits obtained after the first information bit set and the second information bit set are scrambled by using a scrambling sequence, or the information bits of the first LDPC codeword are the first information bit set and the second information bit set.

In a possible implementation, the obtaining a second LDPC codeword based on the information bits of the first LDPC codeword includes: obtaining the previously transmitted first LDPC codeword, and using the first LDPC codeword as the second LDPC code; or encoding the information bits of the first LDPC codeword by using a retransmission encoding parameter, to obtain the second LDPC codeword, where the retransmission encoding parameter is the same as an encoding parameter (a code length and a code rate) used for the first LDPC codeword; or encoding the information bits of the first LDPC codeword by using a retransmission parity-check matrix, to obtain the second LDPC codeword, where the retransmission parity-check matrix has a preset relationship with a parity-check matrix used for the first LDPC.

In a possible implementation, the information bits of the first LDPC codeword include the first information bit set and the second information bit set, and the obtaining a second LDPC codeword based on the information bits of the first LDPC codeword includes:

scrambling the information bits of the first LDPC codeword by using a retransmission scrambling sequence, to obtain scrambled to-be-encoded bits; and encoding the scrambled to-be-encoded information bits by using a retransmission encoding parameter, to obtain the second LDPC codeword, where the retransmission scrambling sequence is the same as a scrambling sequence used to scramble the information bits of the first LDPC codeword, and the retransmission encoding parameter is the same as an encoding parameter of the first LDPC codeword; or scrambling the information bits of the first LDPC codeword by using a retransmission scrambling sequence, to obtain scrambled to-be-encoded bits; and encoding the scrambled to-be-encoded information bits by using a retransmission parity-check matrix, to obtain the second LDPC codeword, where the retransmission scrambling sequence is the same as a scrambling sequence used to scramble the previously transmitted information bits of the first LDPC codeword, and the retransmission parity-check matrix has a preset relationship with a parity-check matrix of the first LDPC codeword.

In a possible implementation, the at least one retransmitted codeword obtained after the first A-MPDU subframe is encoded is carried in a physical layer protocol data unit PPDU, and a preamble of the PPDU includes one or a combination of the following:

an MPDU retransmission indication, where a first value of the MPDU retransmission indication is used to indicate that the PPDU includes a retransmitted MPDU; a modulation and coding scheme indication, where the modulation and coding scheme indication is a special value, and the special value is used to indicate that the PPDU includes only a retransmitted MPDU; a retransmitted-MPDU length indication, used to indicate a total length of an A-MPDU subframe that includes a retransmitted MPDU in the PPDU; or a scrambler seed indication, used to indicate a scrambler seed used to scramble a retransmitted MPDU.

According to a second aspect, a retransmitted data receiving method is provided, applied to a receive end. The method includes: determining a first MPDU that needs to be retransmitted in a previously transmitted first aggregate media access control protocol data unit A-MPDU, where the first MPDU is included in a first A-MPDU subframe of the A-MPDU, at least one previously transmitted LDPC codeword obtained after the first A-MPDU subframe is encoded includes a first LDPC codeword, and information bits of the first LDPC codeword correspond to a first information bit set in the first A-MPDU subframe and a second information bit set excluded in the first A-MPDU subframe; and receiving at least one retransmitted LDPC codeword that is obtained after the first A-MPDU subframe is encoded and that is retransmitted by a transmit end, where the at least one retransmitted codeword includes a punctured codeword, the punctured codeword is all or some of encoded bits obtained after the second information bit set of a second LDPC codeword is punctured, and the second LDPC codeword is generated based on the information bits of the first LDPC codeword; and performing combined decoding or joint decoding on the at least one retransmitted LDPC codeword and the at least one previously received previously-transmitted LDPC codeword, to obtain the first A-MPDU subframe.

In a possible implementation, the at least one retransmitted LDPC codeword further includes at least one unpunctured codeword, and all information bits corresponding to the at least one unpunctured codeword are included in the first A-MPDU subframe.

In a possible implementation, the information bits of the first LDPC codeword correspond to the first information bit set in the first A-MPDU subframe and the second information bit set excluded in the first A-MPDU subframe, and the performing combined decoding or joint decoding includes: supplementing the second information bit set to the punctured codeword, to obtain the second LDPC codeword; and decoding the at least one retransmitted LDPC codeword and the at least one previously received previously-transmitted LDPC codeword by using a retransmission decoding parameter, to obtain the first A-MPDU subframe, where the retransmission decoding parameter is the same as a decoding parameter used to decode the previously transmitted first LDPC codeword.

Alternatively, in a possible implementation, the information bits of the first LDPC codeword are information bits obtained after the first information bit set and the second information bit set are scrambled by using a scrambling sequence, and the performing combined decoding or joint decoding includes:

supplementing the second information bit set to the punctured codeword, to obtain the second LDPC codeword; performing combined or joint decoding on the at least one retransmitted LDPC codeword and the at least one previously received previously-transmitted LDPC codeword by using a retransmission decoding parameter, to obtain a scrambled first A-MPDU subframe; and descrambling the scrambled first A-MPDU subframe by using a retransmission random scrambling sequence, to obtain a descrambled first A-MPDU subframe, where the retransmission decoding parameter is the same as a decoding parameter used to decode the previously received first A-MPDU subframe, and the retransmission scrambling sequence is the same as a scrambling sequence used to descramble the previously received scrambled first A-MPDU subframe.

In a possible implementation, the performing combined decoding or joint decoding further includes: deleting the second information bit set from information bits obtained after the combined decoding or joint decoding, to obtain the first A-MPDU subframe.

In a possible implementation, the at least one corresponding retransmitted codeword obtained after the first A-MPDU is encoded is carried in a physical layer protocol data unit, and a preamble of the PPDU includes one or a combination of the following: an MPDU retransmission indication, where a first value of the MPDU retransmission indication is used to indicate that the PPDU includes a retransmitted MPDU; a modulation and coding scheme indication, where the modulation and coding scheme indication is a special value, and the special value is used to indicate that the PPDU includes only a retransmitted MPDU; a retransmitted-MPDU length indication, used to indicate a total length of an A-MPDU subframe that includes a retransmitted MPDU in the PPDU; or a scrambler seed indication, used to indicate a scrambler seed used to scramble a retransmitted MPDU.

According to a third aspect, a PPDU sending method is provided, applied to a transmit end. The method includes: generating an aggregate media access control protocol data unit A-MPDU, where the A-MPDU includes at least one first A-MPDU subframe and at least one second A-MPDU subframe, one first A-MPDU subframe includes one retransmitted media access control protocol data unit MPDU, one second A-MPDU subframe includes one initially transmitted MPDU, a total length of the at least one first A-MPDU subframe is a first length L1, a total length of the at least one second A-MPDU subframe is a second length L2, and a total length of the A-MPDU subframes is a third length L3; determining a first encoding parameter based on an encoding parameter of the previously transmitted first A-MPDU subframe, and determining a second encoding parameter based on the second length L2; encoding and encapsulating the at least one first A-MPDU subframe and the at least one second A-MPDU subframe into a data field of a physical layer protocol data unit PPDU by separately using the first encoding parameter and the second encoding parameter; and sending the PPDU.

In a possible implementation, the first encoding parameter includes an encoding code length and an encoding code rate, and the encoding code length and the encoding code rate are the same as an encoding code length and an encoding code rate of the at least one previously transmitted first A-MPDU subframe.

Alternatively, the first encoding parameter includes a parity-check matrix, and the parity-check matrix has a preset relationship with a parity-check matrix of the at least one previously transmitted first A-MPDU subframe.

In a possible implementation, the data field of the PPDU includes N1 OFDM symbols corresponding to the at least one first A-MPDU subframe, and N2 OFDM symbols corresponding to the at least one second A-MPDU subframe. Determining the second encoding parameter based on the second length L2 includes: determining, based on the second length L2, a quantity N2 of the OFDM symbols corresponding to the at least one second A-MPDU subframe; determining, based on the quantity N2 of the OFDM symbols, a quantity $N_{avbit}$ of encoded bits required by the at least one second A-MPDU subframe; and determining the second encoding parameter based on $N_{avbit}$.

In a possible implementation, $$N2 = m_{STBC} \times \left\lceil \frac{8 \times L2 + N_{service}}{m_{STBC} \times N_{DBPS}} \right\rceil,$$

and $$N_{avbit} = N2 \times N_{CBPS}.$$

When an STBC method is used, $m_{STBC}=2$, otherwise, $m_{STBC}=1$. $N_{DBPS}$ is a quantity of information bits that can be carried by each OFDM symbol. $N_{service}$ is a length of a service field in a PPDU structure. $N_{CBPS}$ is a quantity of encoded bits that can be carried by each OFDM symbol.

In a possible implementation, the determining the second encoding parameter based on $N_{avbit}$ includes: determining, based on a preset correspondence between an encoded bit and a code length, an encoding code length included in the second encoding parameter.

In a possible implementation, a preamble of the PPDU includes a length indication, and the length indication is used to indicate the first length L1 or the second length L2.

According to a fourth aspect, a PPDU receiving method is provided, applied to a receive end. The method includes: receiving a physical layer protocol data unit PPDU, where a data field of the PPDU includes a first part obtained after at least one first A-MPDU subframe is encoded by using a first encoding parameter and a second part obtained after at least one second A-MPDU subframe is encoded by using a second encoding parameter, one first A-MPDU subframe includes one retransmitted MPDU, one second A-MPDU subframe includes one initially transmitted MPDU, a total length of the at least one first A-MPDU subframe is a first length L1, a total length of the at least one second A-MPDU subframe is a second length L2, and a total length of the A-MPDU subframes is a third length L3; decoding the PPDU by separately using the first encoding parameter and the second encoding parameter, to obtain the at least one first A-MPDU subframe and the at least one second A-MPDU subframe, where the first encoding parameter is determined based on an encoding parameter of the previously transmitted first A-MPDU subframe, and the second encoding parameter is determined based on the second length L2.

In a possible implementation, the second encoding parameter includes an encoding code length and an encoding code rate, and the encoding code length and the encoding code rate are the same as an encoding code length and an encoding code rate of the at least one previously transmitted first A-MPDU subframe. Alternatively, the first encoding parameter includes a parity-check matrix, and the parity-check matrix has a preset relationship with a parity-check matrix of the at least one previously transmitted first A-MPDU subframe.

In a possible implementation, a quantity N2 of OFDM symbols corresponding to the at least one second MPDU is determined based on the second length L2. A quantity $N_{avbit}$ of encoded bits required by the at least one second MPDU is determined based on the quantity N2 of the OFDM symbols. The second encoding parameter is determined based on $N_{avbit}$.

In a possible implementation, $$N2 = m_{STBC} \times \left\lceil \frac{8 \times L2 + N_{service}}{m_{STBC} \times N_{DBPS}} \right\rceil,$$

and $$N_{avbit} = N2 \times N_{CBPS}$$

When an STBC method is used, $m_{STBC}=2$, otherwise, $m_{STBC}=1$. $N_{DBPS}$ is a quantity of information bits that can be carried by each OFDM symbol. $N_{service}$ is a length of a service field in a PPDU structure. $N_{CBPS}$ is a quantity of encoded bits that can be carried by each OFDM symbol.

In a possible implementation, that the second encoding parameter is determined based on $N_{avbit}$ includes: determining, based on a preset correspondence between an encoded bit and a code length, an encoding code length included in the second encoding parameter.

In a possible implementation, a preamble of the PPDU includes a length indication, and the length indication is used to indicate the first length L1 or the second length L2. The method further includes: determining the second length L2 based on the length indication.

In a possible implementation, the method further includes: determining the second length L2 based on an L-Length field in the preamble of the PPDU.

According to a fifth aspect, a sending apparatus is provided, and the apparatus is used for a transmit end. The sending apparatus is configured to implement the method and the function of the transmit end in either the first aspect or the third aspect. The sending apparatus includes a processing module, a sending module, a receiving module, and optionally, a storage module.

According to a sixth aspect, a receiving apparatus is provided, and the apparatus is used for a transmit end. The receiving apparatus is configured to implement the method and the function of the transmit end in either the second aspect or the fourth aspect. The receiving apparatus includes a processing module, a sending module, a receiving module, and optionally, a storage module.

According to a seventh aspect, a sending apparatus is provided. The apparatus is used for a transmit end and includes a memory and a processor. The memory is coupled to the processor. The memory is configured to store a computer program, and the computer program includes program instructions. The processor is configured to invoke the program instructions, to implement the method according to either the first aspect or the third aspect.

According to an eighth aspect, a receiving apparatus is provided. The apparatus is used for a receive end and includes a memory and a processor. The memory is coupled to the processor. The memory is configured to store a computer program, and the computer program includes program instructions. The processor is configured to invoke the program instructions, to implement the data transmission method according to either the second aspect or the fourth aspect.

According to a ninth aspect, a computer-readable storage medium is provided. The computer-readable storage medium stores a computer program. The computer program includes at least one segment of code. The at least one segment of code may be executed by a computer, to control the computer to perform the data transmission method according to any one of the first aspect to the fourth aspect.

According to a tenth aspect, a computer program is provided. When the computer program is executed by a computer, the computer program is used to perform the data transmission method according to any one of the first aspect to the fourth aspect.

Optionally, all or a part of the computer program may be stored in a storage medium that is packaged together with a processor, or may be stored in a memory that is not packaged together with the processor.

According to an eleventh aspect, a chip is provided. The chip includes a processor, configured to invoke, from a memory, and run instructions stored in the memory, so that a communications device in which the chip is installed is enabled to perform the methods in the foregoing aspects.

According to a twelfth aspect, an embodiment of this application further provides another chip. The chip may be a part of a receive end or a transmit end. The chip includes an input interface, an output interface, and a circuit. The input interface, the output interface, and the circuit are connected to each other through an internal connection path. The circuit is configured to perform the methods in the foregoing examples.

According to a thirteenth aspect, another chip is provided. The chip includes an input interface, an output interface, and a processor. Optionally, the chip further includes a memory. The input interface, the output interface, the processor, and the memory are connected to each other through an internal connection path. The processor is configured to execute code in the memory, and when the code is executed, the processor is configured to perform the methods in the foregoing aspects.

According to a fourteenth aspect, an apparatus is provided, and is configured to implement the methods in the foregoing aspects.

According to a fifteenth aspect, a communications system is provided, including a transmit end and at least one receive end. The transmit end includes the sending apparatus according to the fifth aspect, and the receive end includes the receiving apparatus according to the sixth aspect. Alternatively, the transmit end includes the sending apparatus according to the seventh aspect, and the receive end includes the receiving apparatus according to the eighth aspect.

According to the technical solutions of this application, MPDU retransmission based on an A-MPDU structure is implemented, and retransmission in a WLAN can be supported, to further improve transmission reliability and transmission efficiency of a WLAN system. In addition, a receive end may directly perform combined decoding or joint decoding on an LLR of a retransmitted codeword and an LLR of a previously transmitted codeword. This reduces complexity and decoding time of the receive end, and improves transmission efficiency.

BRIEF DESCRIPTION OF DRAWINGS

FIG. 3 is a schematic diagram of a structure of a retransmitted MPDU according to an embodiment of this application;

FIG. 5a is a schematic diagram of a structure of a previously sent A-MPDU according to an embodiment of this application;

FIG. 8a is a schematic diagram of a structure of another previously sent A-MPDU according to an embodiment of this application;

FIG. 11 is a schematic diagram of a structure of a PPDU according to an embodiment of this application;

FIG. 12 is a schematic flowchart of a PPDU receiving method according to an embodiment of this application;

DESCRIPTION OF EMBODIMENTS

Figure 1:
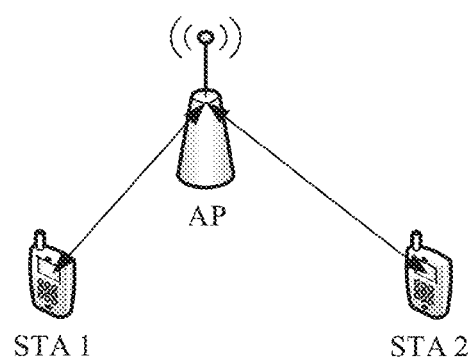
FIG. 1 is a schematic diagram of an application scenario according to an embodiment of this application.

To make objectives, technical solutions, and advantages of this application clearer, the following further describes implementations of this application in detail with reference to the accompanying drawings.

In a wireless communications system, signal transmission may fail due to a time-varying characteristic and multipath fading of a wireless channel. Therefore, methods such as a forward error correction (FEC) coding technology and an automatic repeat request (ARQ) are usually used for error control.

A retransmission technology means that a transmit end resends data that is unsuccessfully received or correctly received by a receive end. The retransmission technologies may include the ARQ and a HARQ. Compared with the ARQ, the HARQ may further increase a success rate of receiving retransmitted data. A HARQ technology in LTE generally has two implementations: chase combining (CC) and incremental redundancy (IR).

The chase combining is also referred to as a soft combination. In a CC-type retransmission process, a transmit end may retransmit an encoded bit that is the same as a previously incorrectly transmitted previously-transmitted encoded bit, and the retransmitted encoded bit includes an information bit and a check bit. A receive end combines the retransmitted encoded bit with the previously received previously-transmitted encoded bit. Herein, a log-likelihood ratio (LLR) of a to-be-decoded encoded bit that is incorrectly transmitted last time is combined with an LLR of a currently received encoded bit, and then a combined LLR value is decoded.

In an incremental redundancy retransmission process, a transmitter may retransmit a retransmitted encoded bit. The retransmitted encoded bit is different from a previously transmitted previously-transmitted encoded bit. For example, the transmitter retransmits an additional check bit or a newly generated check bit. Alternatively, the transmitter retransmits some information bits and check bits or another part of an encoded codeword. The retransmitted encoded bit may have different redundancy versions. A receive end performs joint decoding on original information and information of the additionally received retransmitted encoded bit. A smaller quantity of bits are transmitted by using HARQ IR. Therefore, HARQ IR has higher efficiency compared with HARQ CC. However, because an encoding codebook needs to be redesigned, complexity is higher.

In a wireless communications system, for example, a cellular communications system supporting LTE or 5G, a transmit end sends a single data packet. The single data packet includes only one data sub-packet, and does not aggregate a plurality of data sub-packets. If the data packet is incorrectly sent, incorrectly received, or unsuccessfully received, the transmit end first encodes a to-be-retransmitted data packet, scrambles an encoded bit, then performs constellation point mapping modulation, carrier signal multiplying, and the like, and finally sends the data packet to a receive end through a transmit antenna. After receiving a signal, correspondingly, the receive end sequentially performs constellation point demapping and descrambling, and performs combined decoding or joint decoding on an LLR of each descrambled encoded bit and an LLR of each encoded bit that is received last time, to obtain an information bit of the data packet through decoding. When a data packet aggregates a plurality of data sub-packets, or a data frame aggregates a plurality of data subframes, how to retransmit some of the plurality of data subframes to improve transmission reliability and transmission efficiency is still an unsolved technical problem. Therefore, the embodiments of this application provide a retransmitted data sending method and apparatus, to improve transmission efficiency and reliability of the wireless communications system.

The solutions in the embodiments of this application are applicable to a plurality of wireless communications systems, such as the cellular communications system and a wireless local area network (WLAN) communications system. The cellular communications system may support a plurality of communication protocols, for example, a 5G NR communication standard protocol, and may also support a future cellular communication protocol. The WLAN communications system may also support a plurality of WLAN communication protocols, such as the Institute of Electrical and Electronics Engineers (IEEE) 802.11ax protocol and a next-generation protocol or a more next-generation protocol of the IEEE 802.11ax protocol.

The solutions in the embodiments of this application may be applied to communication between a transmit end and a receive end in the foregoing communications system. The transmit end and the receive end may be wireless communications apparatuses or chips that support wireless communication, for example, may be a base station and a terminal or chips in a base station and a terminal in the cellular communications system, or may be an access point and a station or chips in an access point and a station in the WLAN communications system. For example, the terminal and the station may also be referred to as user terminals, user apparatuses, access apparatuses, subscriber stations, subscriber units, mobile stations, user agents, user devices, or other devices. The user terminals may include various handheld devices, vehicle-mounted devices, wearable devices, and computing devices that have a wireless communication function, or another processing device connected to a wireless modem, and include various forms of user equipment (UE), mobile stations (MS), terminals, terminal devices, portable communications devices, handheld devices, portable computing devices, entertainment devices, game devices or systems, global positioning system devices, any other suitable devices configured to perform network communication via wireless media, or the like. In addition, the base station or the access point may include various forms of macro base stations, micro base stations, relay stations, wireless access points, and the like.

For ease of description, a WLAN is used as an example for description in the embodiments of this application. The WLAN may include a plurality of basic service sets (BSS). A basic service set shown in FIG. 1 includes an access point (AP) station and a non-access point station (Non-AP STA). The access point station is usually referred to as an access point for short, namely, an AP, and the non-access point station is usually referred to as a station for short, namely, a STA. Each basic service set may include one AP and a plurality of STAs associated with the AP. The access point is an apparatus having a wireless transceiver function, and may provide a service for the station. The station is an apparatus having a wireless transceiver function, and may access a wireless local area network based on the access point. Therefore, in this application scenario, a transmit end may be an access point or a station, and a receive end may also be an access point or a station. In other words, the method in the embodiments of this application may be applied to communication between access points, communication between an access point and a station, and communication between stations.

For ease of understanding, an embodiment of this application first describes a general data sending and data receiving process. Because sequences of scrambling and decoding are different, the data sending and data receiving process may be divided into two cases: In a first process, encoding is performed before scrambling; and in a second process, scrambling is performed before encoding.

In an implementation of the first process, a transmit end generates a MAC frame at a media access control (MAC) layer, where the MAC frame includes a plurality of information bits; and transfers the MAC frame to a physical layer. At the PHY layer, the transmit end performs processing such as encoding, scrambling, and constellation point mapping on the MAC frame, then adds a physical layer preamble to the MAC frame, encapsulates the MAC frame into a physical layer protocol data unit (PHY protocol data unit, PPDU) or a physical layer data packet, and sends the physical layer protocol data unit or the physical layer data packet through an antenna. After receiving the PPDU, correspondingly, a receive end sequentially performs processing such as constellation point demapping, descrambling, and decoding at the PHY layer to obtain the MAC frame, so as to obtain the information bits. In an implementation of the second process, a transmit end may perform processing such as first scrambling and then encoding on a MAC frame to obtain a PHY data unit, and send the PHY data unit through an antenna. Correspondingly, a receive end first decodes the received PHY data unit, and then performs descrambling, to obtain the MAC frame.

It should be noted that the transmit end and the receive end may further perform other baseband processing, radio frequency processing, and the like. Details are not described in this embodiment of this application. In the data receiving and sending process, a plurality of types of coding may be used, for example, block coding and convolutional coding. For ease of description, coding of a low density parity check (LDPC) code is used as an example for description in the embodiments of this application. The method in the embodiments of this application may also be applied to a case in which data is sent and received by using other block coding.

In the WLAN, data, control signaling, management signaling, or the like is transmitted between the AP and the STA by using a media access control protocol data unit (MAC Protocol Data Unit, MPDU). The MPDU generally includes a frame header, a frame body, and a frame check sequence (FCS). The frame body is used to carry data, management information, or control information, where the data, the management information, or the control information is transmitted from an upper layer. For some specific types of MPDUs, for example, an acknowledgment frame, a frame body may not exist. The FCS is used to check whether the MPDU is correctly transmitted. The frame header may include at least one of the following fields: a frame control (Frame Control) field, a duration or identifier (Duration/ID) field, an address information field, a sequence control field, a quality of service control (QoS Control) field, and a high throughput control (HT Control) field. For explanations of the fields, refer to the IEEE802.11 protocol. Details are not described herein in this embodiment of this application.

Figure 2:
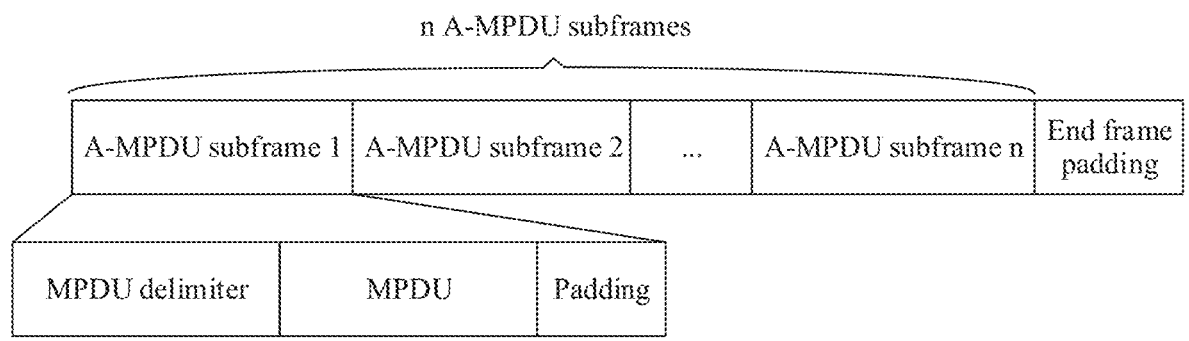
FIG. 2 is a schematic diagram of a frame structure of an A-MPDU according to an embodiment of this application.

To improve WLAN performance, currently, a frame aggregation technology is used at a MAC layer to aggregate a plurality of MPDUs into one aggregate MPDU (A-MPDU). The A-MPDU aggregates the plurality of MPDUs and is sent by using a unified physical layer preamble. This effectively reduces overheads caused by channel contention and a physical layer preamble, and improves transmission efficiency. FIG. 2 is a schematic diagram of a structure of an A-MPDU in the IEEE 802.11 standard. As shown in FIG. 2, the A-MPDU includes n A-MPDU subframes, where n is an integer greater than or equal to 1. Optionally, refer to FIG. 2. The A-MPDU may further include an end of frame (EOF) padding field located after the n A-MPDU subframes. Each A-MPDU subframe includes an MPDU delimiter and an MPDU. Optionally, the A-MPDU subframe may further include a padding field. The MPDU delimiter is used to separate a plurality of aggregated MPDUs.

Specially, an A-MPDU including only one delimiter and one MPDU is also referred to as a single MPDU (S-MPDU). In the 802.11 standard, for the MPDU and the S-MPDU, a mechanism of replying with a simple Ack (acknowledgment) frame is used, and whether to send the acknowledgment frame indicates whether the MPDU or the S-MPDU is successfully received; and for an A-MPDU including at least two MPDUs, a block acknowledgment (Block Ack) frame or a multi-station block acknowledgment (Multi-STA Block Ack) frame is used for a reply. The foregoing two types of block acknowledgment frames each include a bitmap. One bit in the bitmap corresponds to one MPDU, and is used to indicate whether the corresponding MPDU in the A-MPDU is correctly received, where 1 indicates that the corresponding MPDU is correctly received, and 0 indicates that the corresponding MPDU is incorrectly received. If each MPDU in the aggregated frame A-MPDU is incorrectly received or is not received, a STA does not feed back acknowledgment information.

Optionally, the MPDU delimiter includes at least one of the following fields: an EOF field, a reserved bit field, an MPDU length field, a cyclic redundancy code (CRC) field, and a delimiter signature field. Content included in the MPDU delimiter and a sequence of the fields are not limited in this embodiment of this application.

For the structure of the A-MPDU, a possible data retransmission implementation 1 is provided.

Figure 3:
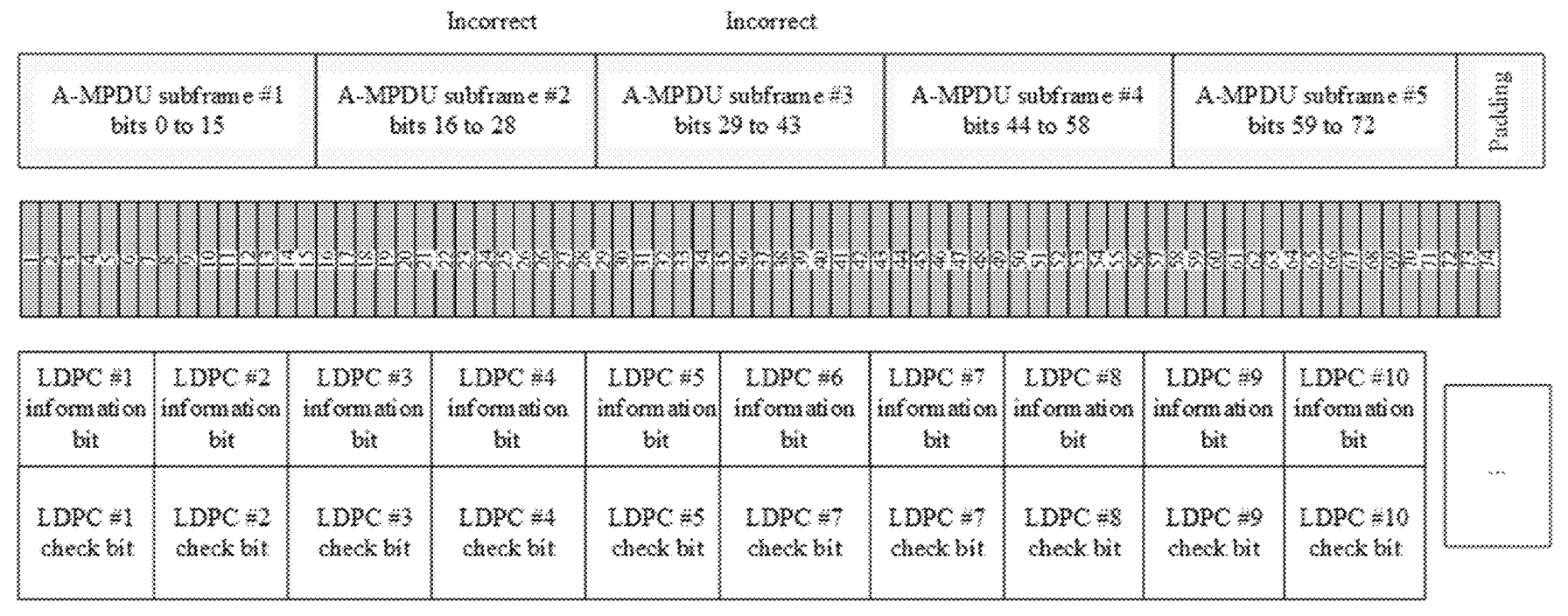

According to an existing MPDU acknowledgment feedback method, if a receive end feeds back that one or more MPDUs in a plurality of previously transmitted MPDUs are incorrectly received, a transmit end usually retransmits the MPDU. Specifically, the transmit end encodes the MPDU, and then sends the MPDU. However, even if the transmit end encodes the retransmitted MPDU by using an LDPC with a same code length, code rate, and parity-check matrix, because information bits included in each LDPC codeword are staggered or different, the entire retransmitted LDPC codeword is different from a previously transmitted LDPC codeword. In this case, the receive end cannot perform combined decoding or joint decoding on LLRs of a retransmitted encoded bit and a previously received encoded bit. FIG. 3 is a schematic diagram of the retransmitted MPDU. For example, it is assumed that a length of a used LDPC codeword is 14, and a code rate is 1/2. In other words, a corresponding information bit length is 7, and a check bit length is 7. As shown in FIG. 3, LDPC codewords 3, 5, 7, and 9 span two MPDUs (where an A-MPDU subframe is referred to as an MPDU for short herein). If an MPDU 2 and an MPDU 3 are incorrectly received, the transmit end needs to perform LDPC re-encoding on the MPDU 2 and the MPDU 3. An LDPC codeword generated after the re-encoding is based on information bits 16 to 22, but a first LDPC codeword associated with the previously incorrectly received MPDU 2 is generated based on information bits 15 to 21. Generated check bits are different because the information bits are different. Therefore, the receive end cannot perform combined decoding or joint decoding on an LLR of an encoded bit of the retransmitted LDPC codeword and an LLR of an encoded bit of the previously transmitted LDPC codeword. It should be noted that the parameters of the LDPC codeword in the foregoing example are merely examples, and there are three types of LDPC code lengths used in the 802.11n/ac/ax protocol: 648, 1296, and 1944. LDPC codewords with the three code lengths each further include four code rates: 1/2, 2/3, 3/4, and 5/6.

The following describes in detail several other implementations of this application with reference to more accompanying drawings.

Embodiment 1 is for the foregoing first process (to be specific, a transmit end first encodes and then scrambles a MAC layer frame, and correspondingly, a receive end first descrambles and then decodes a PHY layer data unit). A retransmitted data sending method according to an embodiment of this application is described in detail, to improve transmission reliability and transmission efficiency of a wireless communications system.

Figure 4:
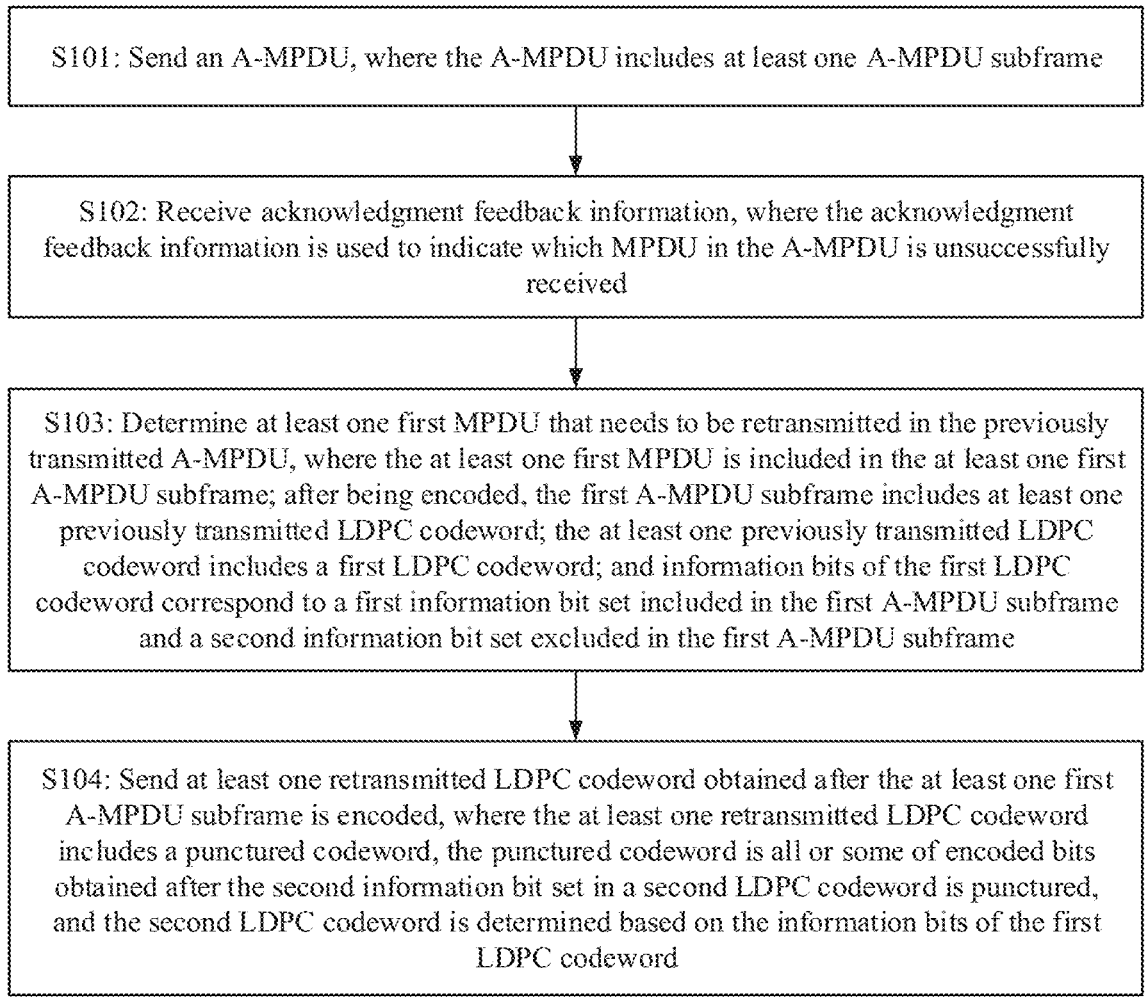
FIG. 4 is a schematic flowchart of a retransmitted data sending method according to an embodiment of this application.

FIG. 4 is a schematic flowchart of the retransmitted data sending method according to an embodiment of this application. The method includes the following steps.

S101: Send an aggregate media access control protocol data unit A-MPDU, where the A-MPDU includes at least one A-MPDU subframe.

The A-MPDU is assembled at a MAC layer and then transferred to a PHY layer. Optionally, at the PHY layer, the transmit end performs operations such as LDPC encoding, scrambling, and constellation point mapping on the A-MPDU, then adds a physical layer preamble (where the physical layer preamble usually includes a non-HT (non-high throughput) (legacy) preamble and a next-generation physical layer preamble) to form a PPDU, and sends the PPDU through an antenna of the transmit end.

Optionally, the A-MPDU includes at least two A-MPDU subframes. For example, an A-MPDU shown in FIG. 5a includes five A-MPDU subframes, which are respectively an A-MPDU subframe 1 to an A-MPDU subframe 5. It should be noted that this method is also applicable to a case in which the A-MPDU includes one subframe.

Optionally, the method further includes: scrambling at least one LDPC codeword by using a scrambling sequence. In step S101, the transmit end first performs encoding, and then performs scrambling. Optionally, a periodicity of a scrambler sequence may be 127 bits. For example, the 127-bit sequence is 00001110 11110010 11001001 00000010 00100110 00101110 10110110 00001100 11010100 11100111 10110100 00101010 11111010 01010001 10111000 1111111. In an implementation of the scrambling, exclusive OR is performed on encoded bits included in the at least one LDPC codeword from a first bit to a last bit and the scrambling sequence whose periodicity is 127 bits. For example, the at least one LDPC codeword includes 200 encoded bits. First, exclusive OR is performed on the first 127 encoded bits in the 200 encoded bits and the 127-bit scrambling sequence. Then, exclusive OR is performed on the last 73 encoded bits in the 200 encoded bits and the first 73 bits in the 127-bit scrambling sequence, to obtain a scrambled bit sequence. For ease of description, an encoding parameter used to encode the A-MPDU in step S101 may be referred to as a previous-transmission encoding parameter, and a scrambling sequence used to scramble the A-MPDU in step S101 may be referred to as a previous-transmission scrambling sequence.

The solution in this embodiment of this application is applicable to an A-MPDU including a plurality of MPDUs, but also applicable to an A-MPDU including one MPDU. In addition, the transmit end sends and encapsulates the A-MPDU into a physical layer protocol data unit (PPDU). The PPDU may be transmitted in single-user (SU) mode, or may be sent in multi-user (MU) mode. The multi-user mode is further classified into an OFDMA mode, a MU-MIMO mode, or a hybrid mode of OFDMA and MU-MIMO.

Optionally, S102: Receive acknowledgment feedback information sent by the receive end, where the acknowledgment feedback information is used to indicate which MPDU in the A-MPDU is unsuccessfully received.

The receive end receiving the A-MPDU sends the acknowledgment feedback information to the transmit end based on an actual receiving situation of the receive end, to notify the transmit end of an MPDU in the A-MPDU transmitted this time that is unsuccessfully received. The transmit end determines a to-be-retransmitted MPDU based on an acknowledgment feedback frame and a sending situation of the transmit end. Unsuccessful receiving may also be referred to as a receiving failure, a sending failure, or the like. Optionally, in step S102, the receive end feeds back that at least one first MPDU is unsuccessfully received.

A method for sending an acknowledgment feedback by the receive end is not limited in this application. The receive end may use negative acknowledgment information, or a bitmap in a block acknowledgment frame, or a bitmap in a Multi-STA Block Ack frame to notify the transmit end that an MPDU is unsuccessfully received or fails to be received, but a legacy preamble corresponding to the MPDU is correctly received, or information that can identify the transmit end and the receive end of the MPDU is correctly received. In other words, the transmit end is notified of an MPDU that can be retransmitted according to a HARQ rule. The NACK may be a single frame or a part of the Multi-STA Block Ack. Different from the current two reply manners: an acknowledgment frame and no reply, the NACK notifies the transmit end that all MPDUs sent this time are incorrectly received, where there may be one or more MPDUs that are incorrectly received, but a physical layer preamble corresponding to the MPDUs is correctly received, or information that can identify the transmit end and the receive end of all the MPDUs transmitted this time is correctly received.

Figure 5A:
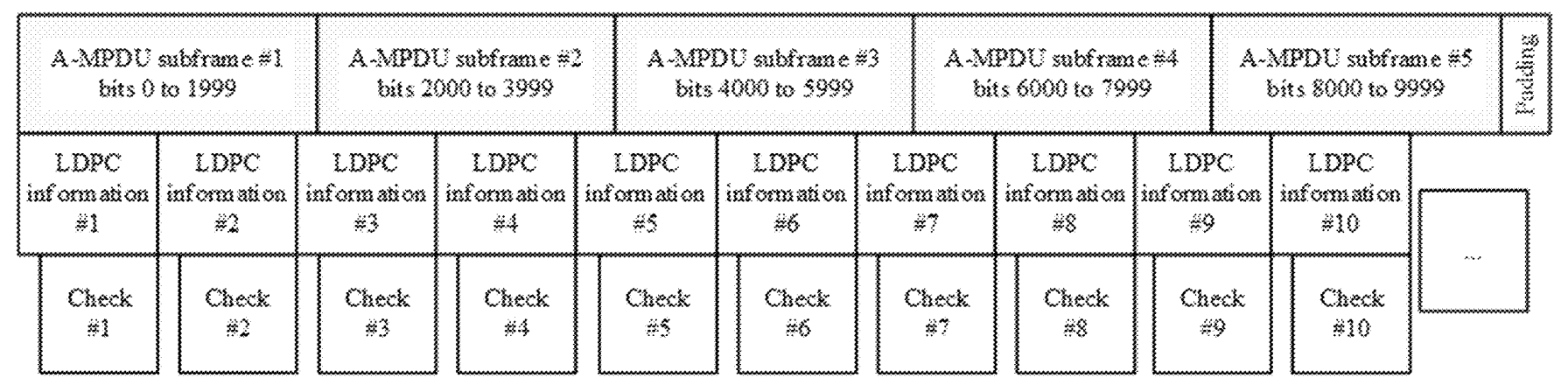

For example, as shown in FIG. 5a, in the A-MPDU subframes, an MPDU 2 in the A-MPDU subframe 2 and an MPDU 2 in the A-MPDU subframe 3 are unsuccessfully received, and the acknowledgment feedback frame carries indication information, to indicate that the MPDU 2 and the MPDU 3 in the A-MPDU are unsuccessfully received. For example, the indication information is a bitmap and includes five bits, and the first bit to the fifth bit respectively correspond to MPDUs in the A-MPDU subframes 1 to 5. In an example, a value 0 indicates a receiving failure, and a value 1 indicates a receiving success. In this case, a value of the five bits may be 10011. Certainly, the value 1 may alternatively indicate a receiving failure, and the value 0 may alternatively indicate a receiving success. This is not limited in this embodiment of this application.

For a case in which all the MPDUs included in the A-MPDU are unsuccessfully received, there may be a plurality of feedback manners. In a first feedback manner, a no-reply manner may be used. To be specific, the receive end does not feed back acknowledgment information to the transmit end, and the receive end may learn that all the MPDUs are unsuccessfully received. In a second feedback manner different from the first feedback manner, NACK information is used as an acknowledgment feedback, to notify the receive end that all the MPDUs included in the A-MPDU sent this time are unsuccessfully received. Optionally, the NACK information may be separately encapsulated into a frame, or may be a part of a Multi-STA Block Ack frame, to notify that all the MPDUs included in the A-MPDU sent this time are unsuccessfully received.

S103: Determine the at least one first MPDU that needs to be retransmitted in the previously transmitted aggregate media access control protocol data unit A-MPDU.

The at least one first MPDU that needs to be retransmitted is included in at least one first A-MPDU subframe of the previously transmitted A-MPDU.

The previously transmitted A-MPDU (or A-MPDU subframe) refers to an A-MPDU (or A-MPDU subframe) transmitted before step S103, namely, the A-MPDU (or A-MPDU subframe) transmitted in step S101. The A-MPDU (or A-MPDU subframe) transmitted in step S101 may be the previously transmitted A-MPDU (or A-MPDU subframe) retransmitted in S103 or an A-MPDU (or A-MPDU subframe) transmitted for the first time. This is not limited in this embodiment of this application. For ease of description, the A-MPDU (or A-MPDU subframe) transmitted in step S101 is referred to as a previously transmitted A-MPDU (or A-MPDU subframe) herein.

The transmit end may determine, in a plurality of manners, a previously transmitted MPDU that needs to be retransmitted. For example, the previously transmitted MPDU that needs to be retransmitted may be determined based on the feedback acknowledgment frame sent by the receive end, a service requirement of the transmit end, or the feedback acknowledgment sent by the receive end and an actual situation of the transmit end. It should be noted that, for a case in which the MPDU that needs to be retransmitted is determined without using the feedback acknowledgment frame sent by the receive end or another case, step S102 may be omitted or the receive end ignores the feedback acknowledgment frame in step S102. Therefore, it may be understood that step S102 is optional.

Optionally, the MPDU that needs to be retransmitted may be an MPDU that is unsuccessfully received by the receive end during previous transmission, and an MPDU that does not need to be retransmitted may be an MPDU that is successfully received by the receive end in the previous transmission or an MPDU that is incorrectly received and that does not need to be retransmitted. For example, a life time of the MPDU expires.

During the previous transmission, at least one previously transmitted LDPC codeword obtained after the at least one first A-MPDU subframe is encoded may include two types: a head-to-tail spanning LDPC codeword and a non-head-to-tail spanning LDPC codeword. The at least one first A-MPDU may include a head-to-tail spanning LDPC codeword and a non-head-to-tail spanning LDPC codeword, or either thereof. The at least one previously transmitted LDPC codeword obtained after the first A-MPDU subframe is encoded may also be understood as all or at least one of LDPC codewords of which all or some information bits are included in the first A-MPDU subframe.

Some information bits of the head-to-tail spanning LDPC codeword are included in the at least one first A-MPDU subframe (a subframe corresponding to the MPDU that needs to be retransmitted). All information bits of the non-head-to-tail spanning LDPC codeword are included in the at least one first A-MPDU subframe (the subframe corresponding to the MPDU that needs to be retransmitted). The head-to-tail spanning LDPC codeword may be understood as a codeword of which only some information bits are included in the A-MPDU subframe of the MPDU that needs to be retransmitted or in A-MPDU subframes of consecutive to-be-retransmitted MPDUs. The non-head-to-tail spanning LDPC codeword may be understood as a codeword of which all information bits are included in the A-MPDU subframe of the MPDU that needs to be retransmitted or in A-MPDU subframes of consecutive to-be-retransmitted MPDUs.

In an example, the at least one previously transmitted LDPC codeword includes a first LDPC codeword, and the first LDPC codeword is a head-to-tail spanning LDPC codeword. Information bits of the first LDPC codeword correspond to a first information bit set included in the at least one first A-MPDU subframe and a second information bit set excluded in the at least one first A-MPDU subframe. In this embodiment of this application, the information bits are first encoded, and then encoded bits are scrambled. Therefore, the information bits of the first LDPC codeword include the first information bit set and the second information bit set. In an example, the second information bit set may be a second information bit set in a correctly received second A-MPDU subframe adjacent to the at least one first A-MPDU subframe.

Because of different quantities of MPDUs that need to be retransmitted and different locations of the MPDUs that need to be retransmitted, the MPDUs that need to be retransmitted include but are not limited to the following cases or a combination thereof:

Case 1: There is only one MPDU that needs to be retransmitted, that is, one first MPDU.

During the previous transmission, after LDPC encoding is performed on a first A-MPDU subframe, the first A-MPDU subframe includes at least one previously transmitted LDPC codeword, where a first LDPC codeword (a head-to-tail spanning LDPC codeword) is included. Information bits of the first LDPC codeword correspond to the first information bit set included in the first A-MPDU subframe and the second information bit set excluded in the first A-MPDU subframe. In the A-MPDU, the second information bit set may be information bits adjacent to the first information bit set, and may be included in the second A-MPDU subframe adjacent to the first A-MPDU subframe. An MPDU of the second A-MPDU subframe is correctly received. For example, as shown in FIG. 5a, if the MPDU that needs to be retransmitted is the MPDU 2 included in the A-MPDU subframe 2, the first LDPC codeword includes LDPC codewords 3 and 5. If the MPDU that needs to be retransmitted is an MPDU 5 in the A-MPDU subframe 5, the first LDPC codeword includes codewords 9 and 11.

Case 2: There are at least two MPDUs that need to be retransmitted, and in the previously transmitted A-MPDU, A-MPDU subframes corresponding to the at least two MPDUs are not adjacent.

For example, the MPDUs that need to be retransmitted include a first MPDU and a second MPDU. In the previously transmitted A-MPDU, the first MPDU and the second MPDU respectively correspond to a first A-MPDU subframe and a second A-MPDU subframe that are not adjacent. During the previous transmission, after LDPC encoding is performed on the first A-MPDU subframe, the first A-MPDU subframe includes a first LDPC codeword 1, and after LDPC encoding is performed on the second A-MPDU subframe, the second A-MPDU subframe includes a first LDPC codeword 2. Information bits of the first LDPC codeword 1 correspond to a first information bit set 1 included in the first A-MPDU subframe and a second information bit set 1 excluded in the first A-MPDU subframe. Information bits of the first LDPC codeword 2 correspond to a first information bit set 2 included in the second A-MPDU subframe and a second information bit set 2 excluded in the second A-MPDU subframe. For example, as shown in FIG. 5a, if the MPDUs that need to be retransmitted are the MPDU 2 in the A-MPDU subframe 2 and an MPDU 5 in the A-MPDU subframe 5, the first LDPC codeword 1 includes LDPC codewords 3 and 5, and the first LDPC codeword 2 includes an LDPC codeword 9.

Case 3: There are at least two MPDUs that need to be retransmitted, and in the previously transmitted A-MPDU, A-MPDU subframes corresponding to the at least two MPDUs that need to be retransmitted are adjacent. In other words, the at least two MPDUs are consecutive. The first LDPC codeword is a codeword whose head and tail span at least two adjacent A-MPDU subframes.

For example, there is a plurality of MPDUs that need to be retransmitted, and the MPDUs correspond to a plurality of adjacent A-MPDU subframes. A first MPDU and a second MPDU are in the previously transmitted A-MPDU, and respectively correspond to a first A-MPDU subframe and a second A-MPDU subframe. In addition, the first A-MPDU subframe is a first subframe in the plurality of adjacent A-MPDU subframes, and the second A-MPDU subframe is a last subframe in the plurality of adjacent A-MPDU subframes. During the previous transmission, after LDPC encoding is performed on the plurality of adjacent A-MPDU subframes, the subframes include a first LDPC codeword 1 and a first LDPC codeword 2. The first LDPC codeword 1 and the first LDPC codeword 2 are LDPC codewords corresponding to information bits of the first and last subframes of the plurality of adjacent subframes. Information bits of the first LDPC codeword 1 correspond to a first information bit set 1 included in the first A-MPDU subframe and a second information bit set 1 excluded in the first A-MPDU subframe. Information bits of the first LDPC codeword 2 correspond to a first information bit set 2 included in the second A-MPDU subframe and a second information bit set 2 excluded in the second A-MPDU subframe. For example, as shown in FIG. 5a, if the MPDUs that need to be retransmitted include the MPDU 2 in the A-MPDU subframe 2, the MPDU 3 in the A-MPDU subframe 3, and an MPDU 4 in the A-MPDU subframe 4, the first LDPC codeword 1 is an LDPC codeword 3, and the first LDPC codeword 2 is a codeword 9.

Consecutive to-be-retransmitted MPDUs are adjacent MPDUs or MPDUs having adjacent sequence numbers (Sequence Numbers) in the previously transmitted A-MPDU (either is available, and the former one is used as an example below). For example, the previously transmitted A-MPDU includes an MPDU 1, an MPDU 2, an MPDU 4, and an MPDU 5, the MPDU 2 and the MPDU 4 are incorrect, and other MPDUs are correctly received. In this case, the MPDU 2 and the MPDU 4 may be referred to as consecutive to-be-retransmitted MPDUs.

Case 4: There are at least three MPDUs that need to be retransmitted, and in the previously A-MPDU, A-MPDU subframes corresponding to at least two MPDUs that need to be retransmitted are adjacent, and an A-MPDU subframe corresponding to at least one MPDU that needs to be retransmitted is not adjacent to another A-MPDU subframe. It may be understood that the first LDPC codeword in Case 4 may be considered as a combination of those in Case 1 and Case 3, or a combination of those in Case 2 and Case 3. Details are not described herein again.

In an example, the first MPDU that needs to be retransmitted may be an MPDU that is unsuccessfully received by the receive end. In this case, the information bits of the first LDPC codeword are included in the first information bit set (unsuccessfully received) in the first A-MPDU subframe and the second information bit set. Optionally, the second information bit set may be information bits in an MPDU successfully received by the receive end. For example, as shown in FIG. 5a, it is assumed that the transmit end determines that the MPDU 2 in the A-MPDU subframe 2 is unsuccessfully received by the receive end, and the MPDU 3 in the A-MPDU subframe 3 is successfully received. In this case, an LDPC codeword 3 and an LDPC codeword 5 are first LDPC codewords.

S104: Send at least one retransmitted LDPC codeword obtained after the at least one first A-MPDU subframe is encoded, where the at least one retransmitted LDPC codeword includes a punctured codeword, the punctured codeword is all or some of encoded bits obtained after the second information bit set in a second LDPC codeword is punctured, and the second LDPC codeword is determined based on the information bits of the first LDPC codeword. The at least one retransmitted LDPC codeword obtained after the first A-MPDU subframe is encoded may also be understood as all or at least one of LDPC codewords of which all or some information bits are included in the first A-MPDU subframe.

In step S104, the transmit end retransmits the first MPDU that is determined in step S103 and that needs to be retransmitted. A plurality of first MPDUs that need to be retransmitted may be sequentially encapsulated into a plurality of consecutive first A-MPDU subframes based on a previous transmission sequence, and then encoded into at least one retransmitted LDPC codeword. Optionally, the at least one retransmitted LDPC codeword further includes at least one unpunctured codeword, and all information bits of the at least one unpunctured codeword are included in the first A-MPDU subframe.

"Puncturing" may be understood as "deleting", and "puncturing" a bit in a codeword may be understood as "deleting" the bit in the codeword. It should be noted that not all retransmitted LDPC codewords include a second information bit set, only a head-to-tail spanning LDPC codeword includes a second information bit set, and only in this case, the second information bit set needs to be punctured.

For the several cases of the first LDPC codeword, several cases of puncturing information bits in the second LDPC are described.

In Case 2, there are at least two MPDUs that need to be retransmitted, and in the previously transmitted A-MPDU, the A-MPDU subframes corresponding to the at least two MPDUs are not adjacent. During retransmission, the at least two MPDUs are constructed as adjacent A-MPDU subframes, that is, included in at least two adjacent A-MPDU subframes, and a sequence is the same as a sequence during the previous transmission. The transmit end generates the second LDPC codeword based on the information bits of the first LDPC codeword, and there is a specific correspondence between a location of the first LDPC codeword and a location of the second LDPC codeword. The transmit end may puncture second information bit sets of all or some of second LDPC codewords. For example, only first and last second LDPC codewords in a plurality of second LDPC codewords are punctured, and a second LDPC codeword in the middle may or may not be punctured. For example, as shown in FIG. 5c, the previously transmitted MPDU 2 and MPDU 4 need to be retransmitted. In an implementation, as shown in FIG. 5c, the LDPC codeword 3 and the LDPC codeword 9 are punctured, and the LDPC codeword 5 and an LDPC codeword 7 are not punctured. According to this method, receiving complexity of the receive end can be reduced. In another manner (not shown in FIG. 5c), the LDPC codeword 3, the LDPC codeword 9, the LDPC codeword 5, and the LDPC codeword 7 are all punctured.

According to this method, information bits that do not need to be retransmitted may be punctured, to effectively reduce retransmission overheads.

Figure 5B:
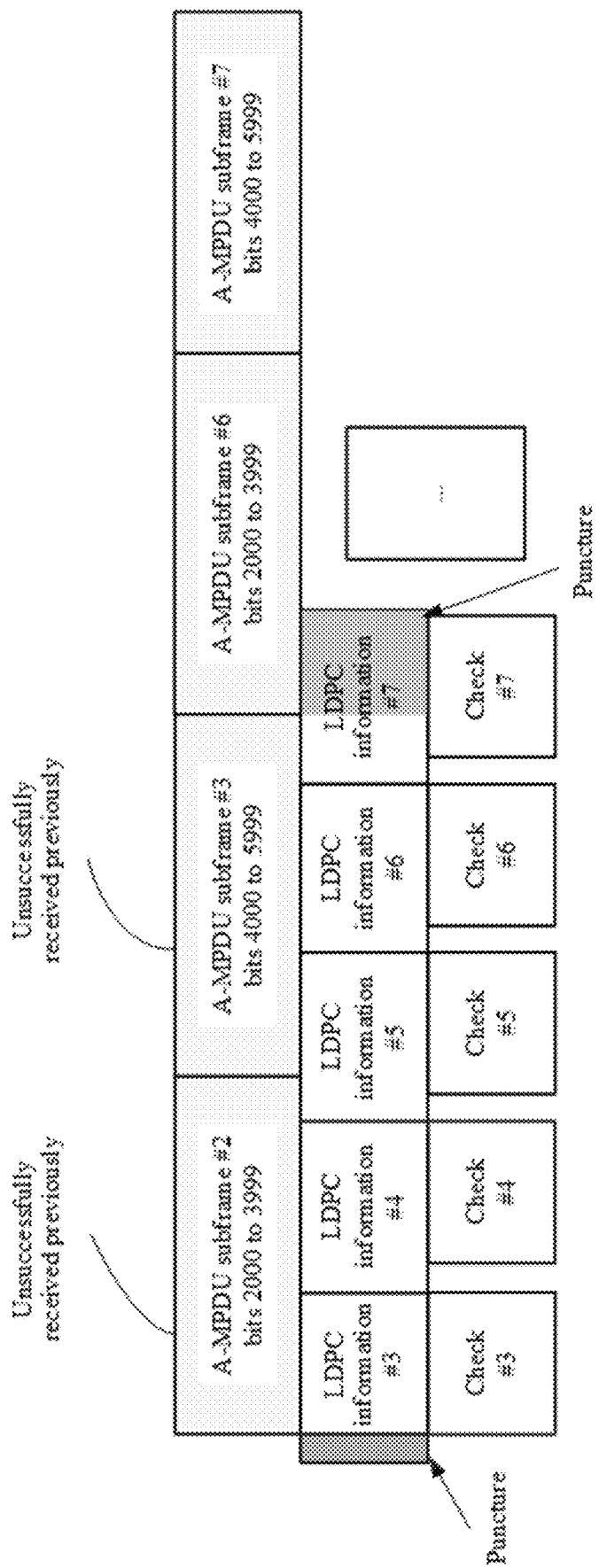
FIG. 5b is a schematic diagram of a structure of a retransmitted A-MPDU according to an embodiment of this application.
Figure 5C:
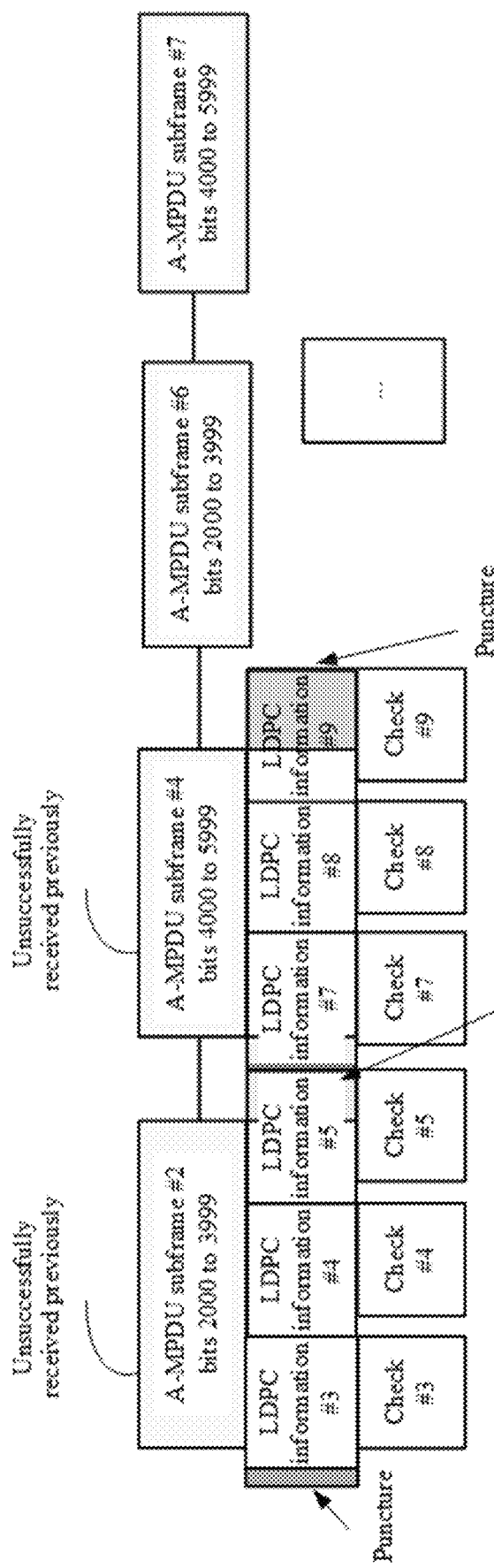
FIG. 5c is a schematic diagram of a structure of another retransmitted A-MPDU according to an embodiment of this application.

For Case 3, for example, as shown in FIG. 5b, the previously transmitted MPDU 2 and MPDU 3 need to be retransmitted, the retransmitted codeword includes the second LDPC codeword, and the LDPC codeword 3 and an LDPC codeword 7 are second LDPC codewords. A second information bit set 1 (bits corresponding to a gray area) of the LDPC codeword 3 is punctured, and a second information bit set 2 (bits corresponding to a gray area) of the LDPC codeword 7 is punctured.

For Case 4, which is similar to Case 2, a second LDPC codeword in the middle may or may not be punctured. Details are not described herein again.

In S104, the transmit end obtains the second LDPC codeword based on the information bits of the previously transmitted first LDPC codeword. A method for obtaining the second LDPC codeword includes but is not limited to the following implementations.

Manner 1: The transmit end obtains the second LDPC codeword in a chase combining CC manner.

Implementation 1: The transmit end obtains the previously transmitted first LDPC codeword, and uses the first LDPC codeword as the second LDPC codeword.

In other words, the transmit end stores at least one previously transmitted LDPC codeword. The transmit end obtains at least one previously transmitted previously-transmitted codeword, and uses the at least one codeword as at least one retransmitted codeword. Specifically, the first LDPC codeword is directly used as the second LDPC codeword (but a correctly received information bit needs to be punctured), and another previously transmitted codeword other than the first LDPC codeword is used as another retransmitted codeword other than the second LDPC codeword, so that the at least one first A-MPDU subframe does not need to be re-encoded, to reduce complexity and a delay of the transmit end. A case corresponding to the first LDPC codeword is described in detail in step S103, and details are not described herein again.

Implementation 2: The transmit end encodes the information bits of the first LDPC codeword by using a retransmission encoding parameter, to obtain the second LDPC codeword (but a correctly received information bit needs to be punctured). The retransmission encoding parameter is the same as an encoding parameter used for the first LDPC codeword. Optionally, the encoding parameter includes an LDPC code length and a code rate. Certainly, the retransmission encoding parameter may also be used to obtain another retransmitted LDPC codeword. A group of encoding parameters (namely, a code length and a code rate) corresponds to one LDPC parity-check matrix.

Manner 2: The transmit end may obtain the second LDPC codeword in an IR manner.

Implementation 3: The information bits of the first LDPC codeword are encoded by using a retransmission parity-check matrix, to obtain the second LDPC codeword (but a correctly received information bit needs to be punctured). The first LDPC codeword and the second LDPC codeword are both generated based on a same LDPC parity-check matrix, but different parts of encoded bits generated by the LDPC parity-check matrix are transmitted, and the different parts may overlap. Certainly, a similar method may also be used to obtain another LDPC retransmitted codeword.

Implementation 4: A retransmitted LDPC codeword and a previously transmitted LDPC codeword are generated based on different check matrices, and there is a preset relationship between a parity-check matrix on which the retransmitted LDPC codeword is based and a parity-check matrix on which the previously transmitted LDPC codeword is based. In other words, a retransmission parity-check matrix is extended by adding a column and a row to a previous-transmission parity-check matrix. The LDPC codeword generated based on the retransmission parity-check matrix includes the previously transmitted LDPC codeword. Therefore, during retransmission, the previously transmitted LDPC codeword may be removed from LDPC codewords generated this time. Certainly, a similar method may also be used to obtain another LDPC retransmitted codeword.

In Implementation 3 and Implementation 4, a new check bit is generated for an information bit included in at least one previously transmitted LDPC codeword corresponding to a to-be-retransmitted MPDU or consecutive to-be-retransmitted MPDUs. The check bit and the corresponding information bit are combined to form at least one new retransmitted LDPC codeword. Generally, an information bit set (including a bit quantity and corresponding bits) included in the at least one retransmitted LDPC codeword is the same as an information bit set included in the at least one previously transmitted previously-transmitted LDPC codeword. In other words, the previously transmitted LDPC codeword and the retransmitted LDPC codeword are generated by using a same mother LDPC codebook. To be specific, information bits included in the previously transmitted LDPC codeword and the retransmitted LDPC codeword are the same. Check bits are different subsets of check bits of the mother LDPC codeword. Optionally, different subsets may overlap. Optionally, some or all information bits (information bits that are incorrectly received) that are included in the at least one retransmitted LDPC codeword and that need to be retransmitted may also be punctured. This depends on a codebook design in HARQ IR, and is not limited in this application.

It should be noted that, in Implementations 1 to 4, an example in which the second LDPC codeword is generated based on the first LDPC is used. However, Implementations 1 to 4 are also applicable to a case in which an information bit of another to-be-retransmitted LDPC codeword other than the first LDPC codeword is used to generate the retransmitted LDPC codeword. Details are not described herein again.

In an example, in step S104, the at least one first MPDU retransmitted by the transmit end and at least one second MPDU transmitted for the first time may further be encapsulated into one physical layer protocol data unit for sending. The at least one second MPDU transmitted for the first time in the A-MPDU may be encoded by using a same encoding parameter. Optionally, the at least one MPDU transmitted for the first time and the at least one retransmitted first MPDU may be encoded by using different encoding parameters or may be encoded by using the same encoding parameter.

FIG. 5b shows an example of retransmission of the MPDU 2 and the MPDU 3 according to an embodiment of this application. FIG. 5a shows an example of the previously transmitted A-MPDU. In step S101, the transmit end sends the A-MPDU shown in FIG. 5a to the receive end, where the previously transmitted A-MPDU includes the A-MPDU subframe 1 to the A-MPDU subframe 5. Optionally, in step S102, the transmit end receives the acknowledgment feedback sent by the receive end. In step S103, the transmit end determines that the MPDUs that need to be retransmitted are the MPDU 2 in the A-MPDU subframe 2 and the MPDU 3 in the A-MPDU subframe 3. In step S104, as shown in FIG.

5b, the transmit end retransmits the MPDU 2 and the MPDU 3, and the transmit end determines that the LDPC codeword 3 and the LDPC codeword 5 are second LDPC codewords. An information bit (a dark area 1 in FIG. 5b) in the LDPC codeword 3 is punctured, and an information bit (a dark area 2 in FIG. 5b) in the LDPC codeword 5 is punctured. Optionally, the transmit end further sends an A-MPDU subframe 6 and an A-MPDU subframe 7. The two subframes may be data transmitted for the first time.

Optionally, before the at least one retransmitted LDPC codeword is sent, the method further includes: scrambling the at least one retransmitted LDPC codeword, and sending the at least one scrambled retransmitted LDPC codeword. Optionally, the scrambling operation is after the encoding operation. Therefore, each time the A-MPDU is transmitted, a different scrambling sequence may be used for scrambling.

The descriptions mentioned in this embodiment are still applicable to another embodiment unless otherwise specified in the another embodiment.

According to the method in this embodiment of this application, an information bit corresponding to the retransmitted LDPC codeword is the same as an information bit corresponding to the previously transmitted LDPC codeword, and corresponding check bits are also the same. In this way, the receive end may directly perform combined decoding or joint decoding on an LLR of the retransmitted LDPC codeword and an LLR of the previously transmitted LDPC codeword, to reduce complexity and decoding time of the receive end, and improve transmission efficiency. In addition, the method in this embodiment of this application may be applied to a scenario in which a plurality of MPDUs are aggregated, to implement MPDU retransmission based on an A-MPDU structure, and the method can support retransmission in a WLAN, to further improve stability of a WLAN system.

Embodiment 2 is for the foregoing first process (to be specific, a transmit end first encodes and then scrambles a MAC layer frame, and correspondingly, a receive end first descrambles and then decodes a PHY layer data unit). A retransmitted data receiving method according to an embodiment of this application is described in detail, to improve transmission reliability and transmission efficiency of a wireless communications system. Embodiment 2 corresponds to the embodiment.

Figure 6:
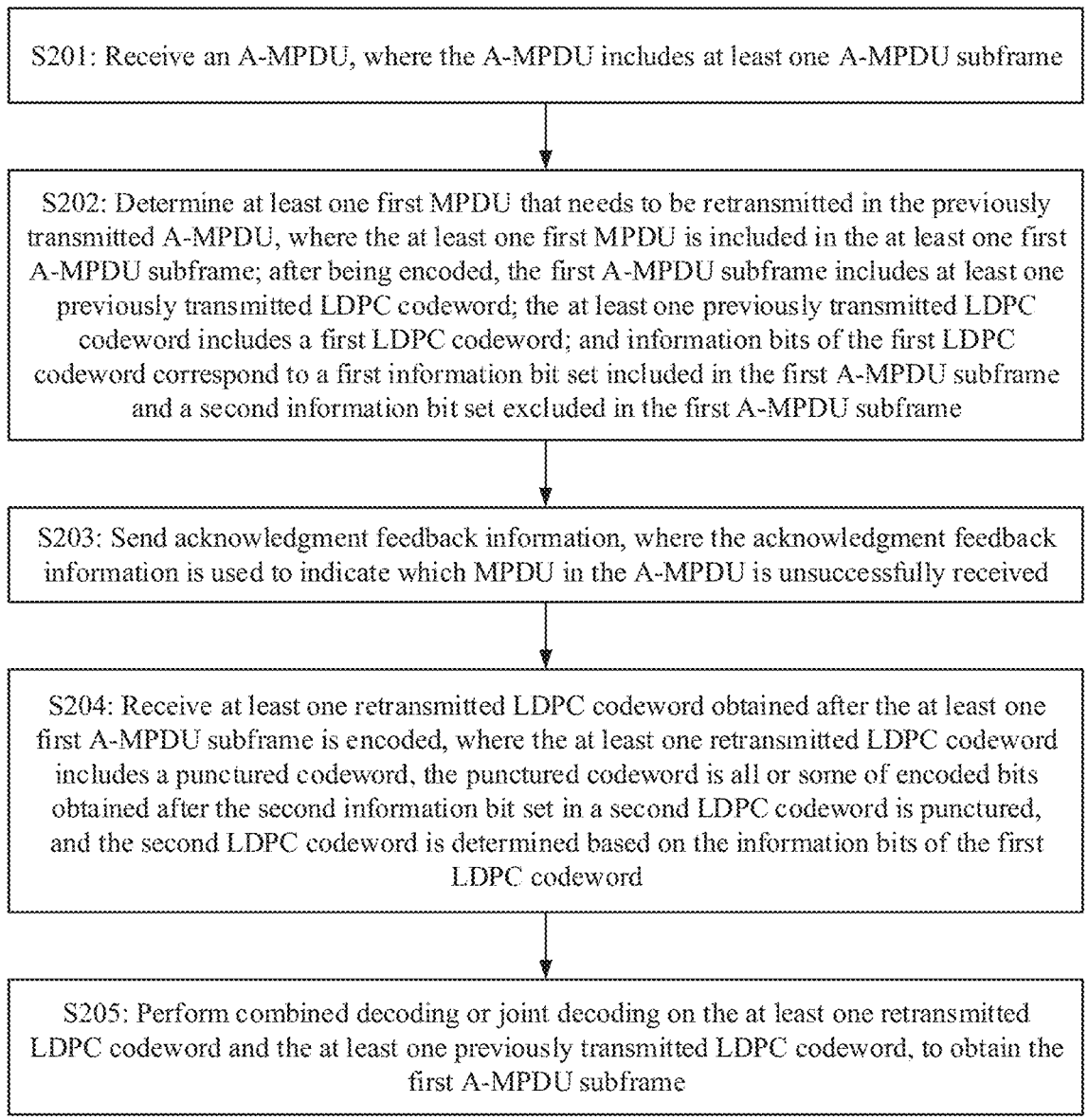
FIG. 6 is a schematic flowchart of a retransmitted data receiving method according to an embodiment of this application.

FIG. 6 is a schematic flowchart of the retransmitted data receiving method according to an embodiment of this application. The method includes the following steps.

S201: Receive an aggregate media access control protocol data unit A-MPDU, where the A-MPDU includes at least one A-MPDU subframe, the at least one A-MPDU subframe includes a first A-MPDU subframe, and the first A-MPDU subframe includes one first MPDU.

Correspondingly, the receive end performs processing such as constellation point demapping, descrambling, and decoding on a received physical layer protocol data unit, to obtain the A-MPDU through parsing. For detailed descriptions of the A-MPDU, refer to step S101 in the foregoing embodiment. Details are not described herein again.

S202: The receive end determines at least one first MPDU that needs to be retransmitted in the previously transmitted A-MPDU, where the first MPDU is included in the first A-MPDU subframe of the A-MPDU.

There is a plurality of methods for the receive end to determine the MPDU that needs to be retransmitted. In an implementation, the receive end may determine, based on an MPDU that is determined in step S202 and that is unsuccessfully received, the at least one first MPDU that needs to be retransmitted. In this case, step S202 may be performed before step S203. In another implementation, the receive end may determine, based on MPDU retransmission information carried in a PPDU received in step S204, the at least one first MPDU that needs to be retransmitted.

Optionally, S203: The receive end sends an acknowledgment feedback frame, where the acknowledgment feedback is used to indicate which MPDU in the A-MPDU is unsuccessfully received.

Optionally, in S202, the receive end determines that at least one first MPDU fails to be transmitted. The receive end identifies the MPDU that is unsuccessfully received in the A-MPDU, and performs acknowledge feedback on the received MPDU, where the feedback includes no reply, and replying in manners such as a NACK, an ACK, a Block ACK, and a Multi-STA Block Ack. Specific information of the reply manner is described in detail in step S102.

S204: Receive at least one retransmitted LDPC codeword obtained after the at least one first A-MPDU subframe is encoded, where the at least one retransmitted LDPC codeword includes a punctured codeword, the punctured codeword is all or some of encoded bits obtained after a second information bit set in a second LDPC codeword is punctured, and the second LDPC codeword is determined based on information bits of a first LDPC codeword.

It should be noted that the receive end receives a PPDU carrying the retransmitted MPDU. The PPDU includes the at least one first MPDU in the at least one first A-MPDU subframe, and the first MPDU is retransmitted. Optionally, the PPDU may further include another non-retransmitted MPDU, for example, an MPDU transmitted for the first time.

During the previous transmission, at least one previously transmitted LDPC codeword obtained after the at least one first A-MPDU subframe is encoded may include two types: a head-to-tail spanning LDPC codeword and a non-head-to-tail spanning LDPC codeword. Certainly, the at least one previously transmitted LDPC codeword may alternatively include only a head-to-tail spanning LDPC codeword.

Some information bits of the head-to-tail spanning LDPC codeword are included in the at least one first A-MPDU subframe (a subframe corresponding to the MPDU that needs to be retransmitted). All information bits of the non-head-to-tail spanning LDPC codeword are included in the at least one first A-MPDU subframe (the subframe corresponding to the MPDU that needs to be retransmitted). The head-to-tail spanning LDPC codeword may be referred to as a codeword whose head and tail span the MPDU that needs to be retransmitted or consecutive to-be-retransmitted MPDUs. The non-head-to-tail spanning LDPC codeword may be referred to as a codeword whose head and tail are included in the MPDU that needs to be retransmitted or the consecutive to-be-retransmitted MPDUs.

Information bits of the first LDPC codeword correspond to a first information bit set included in the at least one first A-MPDU subframe and the second information bit set excluded in the at least one first A-MPDU subframe. In an example, the second information bit set may be a second information bit set in a second A-MPDU subframe, adjacent to the first A-MPDU subframe, that is unsuccessfully received.

S205: Perform combined decoding or joint decoding on the at least one retransmitted LDPC codeword and the at least one previously received previously-transmitted LDPC codeword, to obtain the first A-MPDU subframe.

It should be noted that decoding and encoding are mutually corresponding operations. Therefore, an encoding parameter and a decoding parameter for encoding and decoding same information need to match or correspond to each other.

The at least one retransmitted LDPC codeword further includes at least one unpunctured codeword, and all information bits of the at least one unpunctured codeword are included in the first A-MPDU subframe that needs to be retransmitted. The at least one unpunctured codeword is a non-head-to-tail spanning LDPC codeword.

For the punctured codeword, before the combined decoding or joint decoding, the transmit end needs to supplement the second information bit set to the punctured codeword, to obtain the second LDPC codeword. For the unpunctured codeword, supplement is not required. Further, the at least one retransmitted LDPC codeword and the at least one previously received previously-transmitted LDPC codeword are decoded by using a retransmission decoding parameter, to obtain the at least one first A-MPDU subframe. The retransmission decoding parameter is the same as a decoding parameter used to decode the previously transmitted first LDPC codeword. It should be noted that decoded information bits include the second information bit set that is excluded in the at least one first A-MPDU subframe. Therefore, the second information bit set further needs to be deleted after decoding, to obtain the at least one first A-MPDU subframe, so as to implement retransmission of the at least one first MPDU.

Optionally, the at least one retransmitted LDPC codeword sent by the transmit end is a scrambled LDPC codeword. In this case, optionally, before decoding, the receive end further descrambles the at least one retransmitted LDPC codeword, to obtain a descrambled LDPC codeword. The scrambling operation is after the encoding operation. Therefore, each time the A-MPDU is transmitted, a different scrambling sequence may be used for scrambling.

For HARQ CC, the receive end performs combined decoding on an LLR of an LDPC codeword of the retransmitted first MPDU and an LLR of an LDPC codeword of the previously received first MPDU. For HARQ IR, the receive end performs joint decoding on an LLR of the LDPC codeword of the retransmitted MPDU and an LLR of an LDPC codeword of an MPDU that is incorrectly received last time.

Optionally, the method further includes: performing acknowledgment feedback on each MPDU in the A-MPDU in the PPDU, where the acknowledgment feedback method includes manners such as no reply, a NACK, an ACK, a Block ACK, and a Multi-STA Block Ack. For specific details, refer to step S102. Details are not described herein again.

The descriptions mentioned in this embodiment are still applicable to another embodiment unless otherwise specified in the another embodiment.

According to the method in this embodiment of this application, an information bit corresponding to the retransmitted LDPC codeword is the same as an information bit corresponding to the previously transmitted LDPC codeword, and corresponding check bits are also the same. In this way, the receive end may directly perform combined decoding or joint decoding on an LLR of the retransmitted LDPC codeword and an LLR of the previously transmitted LDPC codeword, to reduce complexity and decoding time of the receive end, and improve transmission efficiency. In addition, the method in this embodiment of this application may be applied to a scenario in which a plurality of MPDUs are aggregated, to implement MPDU retransmission based on an A-MPDU structure, and the method can support retransmission in a WLAN, to further improve stability of a WLAN system.

Embodiment 3 is for the foregoing second process (to be specific, a transmit end first scrambles and then encodes a MAC layer frame, and correspondingly, a receive end first decodes and then descrambles a PHY layer data unit). A retransmitted data sending method according to an embodiment of this application is described in detail, to improve transmission reliability and transmission efficiency of a wireless communications system.

Figure 7:
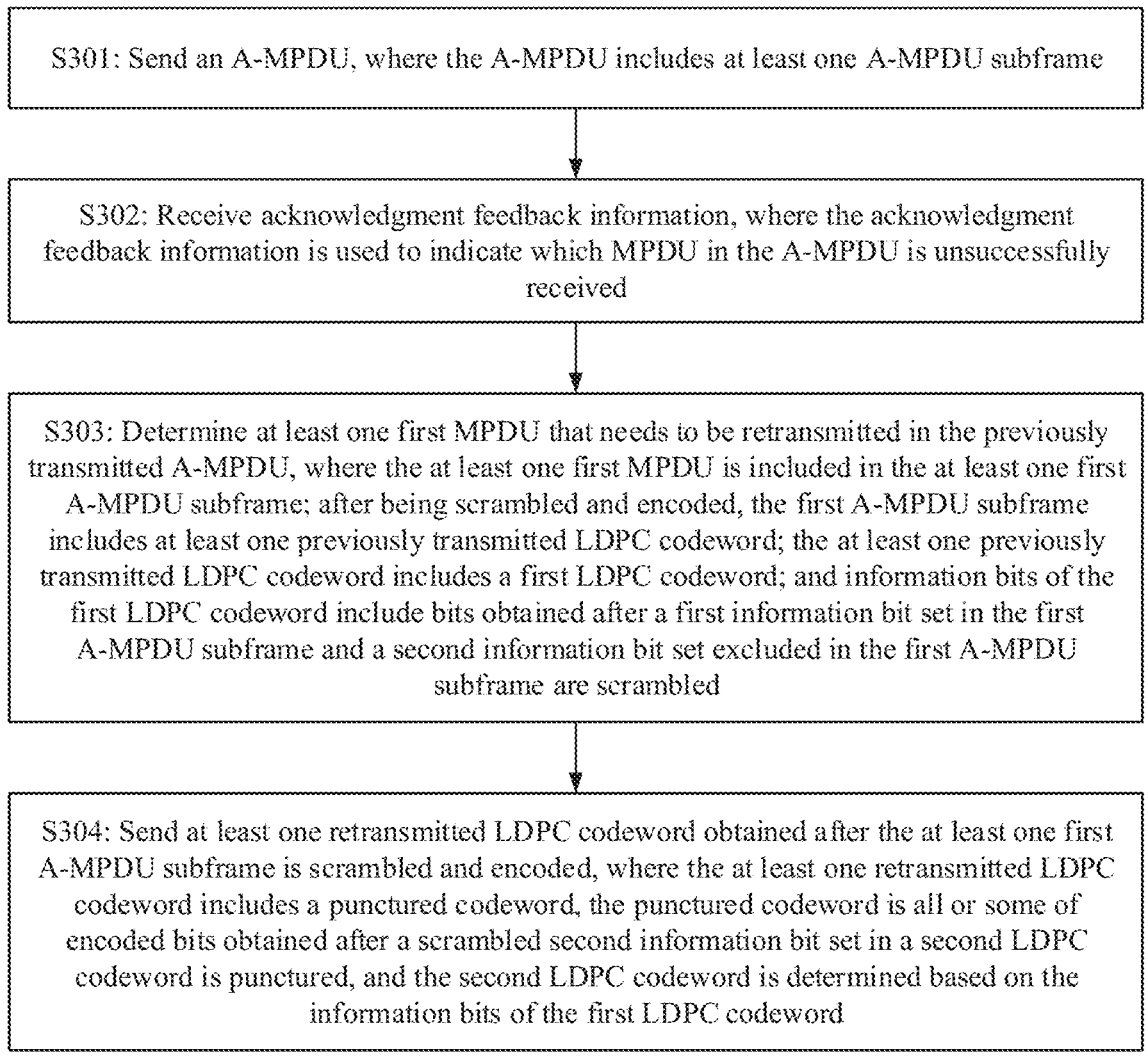
FIG. 7 is a schematic flowchart of another retransmitted data sending method according to an embodiment of this application.

FIG. 7 is a schematic flowchart of the retransmitted data receiving method according to an embodiment of this application. The method includes the following steps.

Step S301: Send an aggregate media access control protocol data unit A-MPDU, where the A-MPDU includes at least one A-MPDU subframe, and optionally, the A-MPDU further includes another A-MPDU subframe.

A difference between step S301 and step S101 lies in that the A-MPDU is first assembled at a MAC layer and then transferred to a PHY layer. At the PHY layer, the transmit end first scrambles the A-MPDU, and then performs LDPC encoding. Optionally, after an LDPC codeword is obtained, operations such as constellation point mapping are performed. Then, a physical layer preamble (where the physical layer preamble usually includes a Non-HT (non-high throughput) (legacy) preamble and a next-generation physical layer preamble) is added to form a PPDU, and the PPDU is sent through an antenna of the transmit end.

In step S301, the transmit end first performs scrambling, and then performs encoding. Optionally, a periodicity of a scrambler sequence may be 127 bits. For example, the 127-bit sequence is 00001110 11110010 11001001 00000010 00100110 00101110 10110110 00001100 11010100 11100111 10110100 00101010 11111010 01010001 10111000 1111111. In an implementation of the scrambling, exclusive OR is performed on information bits of the A-MPDU from a first bit to a last bit and the scrambling sequence whose periodicity is 127 bits. For example, the A-MPDU includes 200 information bits. First, exclusive OR is performed on the first 127 information bits in the A-MPDU and the 127-bit scrambling sequence. Then, exclusive OR is performed on the last 73 information bits in the A-MPDU and the first 73 bits in the 127-bit scrambling sequence, to obtain a scrambled bit sequence. For ease of description, a scrambling sequence used for scrambling the A-MPDU in step S301 may be referred to as a previous-transmission scrambling sequence, and an encoding parameter used for encoding the A-MPDU in step S301 may be referred to as a previous-transmission encoding parameter.

Figure 8A:
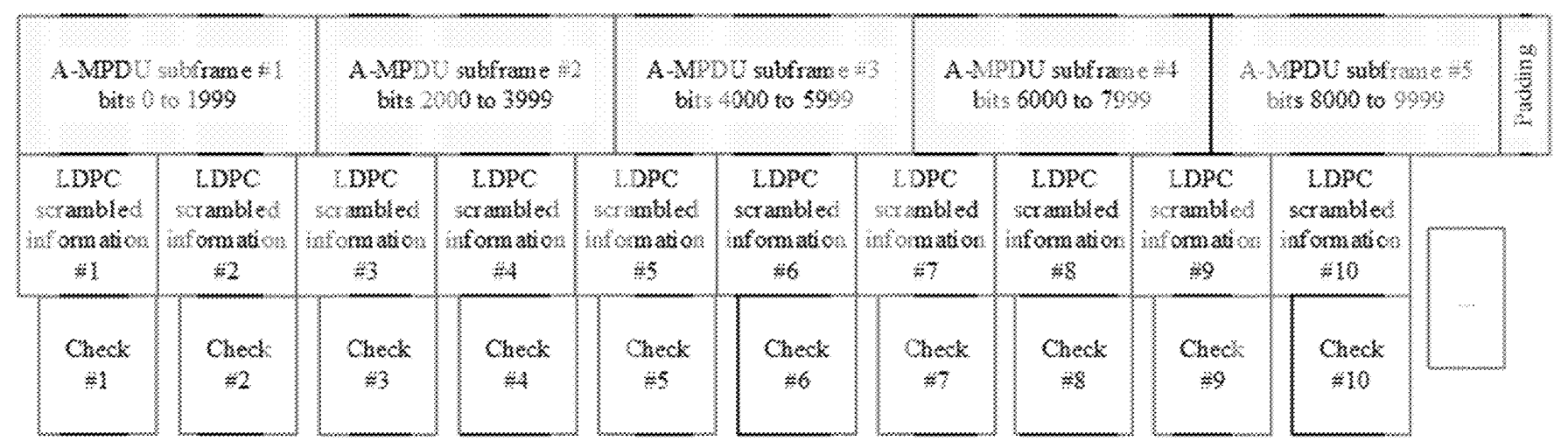

As shown in FIG. 8a, the A-MPDU sent in step S301 includes an A-MPDU subframe 1 to an A-MPDU subframe 5. The A-MPDU is scrambled and encoded by sequentially using the previous-transmission scrambling sequence and the previous-transmission encoding parameter, to obtain an LDPC codeword 1 to an LDPC codeword 10.

Step S302: Receive acknowledgment feedback information, where the acknowledgment feedback information is used to indicate which MPDU in the A-MPDU is unsuccessfully received. Step S302 is similar to step S102, and details are not described herein again.

Optionally, in step S302, the acknowledgment feedback information sent by the receive end indicates that at least one first MPDU is unsuccessfully received.

Step S303: Determine the at least one first MPDU that needs to be retransmitted in the previously transmitted aggregate media access control protocol data unit A-MPDU.

The at least one first MPDU that needs to be retransmitted is included in at least one first A-MPDU subframe of the previously transmitted A-MPDU. A plurality of manners in which the transmit end determines a previously transmitted MPDU that needs to be retransmitted are similar to those in step S103, and details are not described herein again.

The previously transmitted A-MPDU (or A-MPDU subframe) refers to an A-MPDU (or A-MPDU subframe) transmitted before step S303, namely, the A-MPDU (or A-MPDU subframe) transmitted in step S301. The A-MPDU (or A-MPDU subframe) transmitted in step S301 may be the previously transmitted A-MPDU (or A-MPDU subframe) retransmitted in S303 or an A-MPDU (or A-MPDU subframe) transmitted for the first time. This is not limited in this embodiment of this application. For ease of description, the A-MPDU (or A-MPDU subframe) transmitted in step S301 is referred to as a previously transmitted A-MPDU (or A-MPDU subframe) herein. It should be noted that step S303 is similar to step S103, and a difference lies in that, in step S303, the at least one previously transmitted first A-MPDU subframe is first scrambled and then encoded into at least one previously transmitted LDPC codeword. Therefore, in this embodiment (Embodiment 3), an LDPC codeword obtained after the at least one previously transmitted first A-MPDU subframe is first scrambled and then encoded is the at least one previously transmitted LDPC codeword. In addition, an LDPC codeword obtained after previously transmitted first information bit set and second information bit set are first scrambled and then encoded is a first LDPC codeword.

During the previous transmission, the at least one previously transmitted LDPC codeword obtained after the at least one first A-MPDU subframe is first scrambled and then encoded may include two types: a head-to-tail spanning LDPC codeword and a non-head-to-tail spanning LDPC codeword. Certainly, the at least one previously transmitted LDPC codeword may alternatively include only a head-to-tail spanning LDPC codeword.

Some information bits of the head-to-tail spanning LDPC codeword are included in bits obtained after the at least one first A-MPDU subframe (a subframe corresponding to the MPDU that needs to be retransmitted) is scrambled. All information bits of the non-head-to-tail spanning LDPC codeword are included in the bits obtained after the at least one first A-MPDU subframe (the subframe corresponding to the MPDU that needs to be retransmitted) is scrambled. The head-to-tail spanning LDPC codeword is a codeword whose head and tail span the MPDU that needs to be retransmitted or consecutive to-be-retransmitted MPDUs. The non-head-to-tail spanning LDPC codeword is a codeword whose head and tail are included in the MPDU that needs to be retransmitted or the consecutive to-be-retransmitted MPDUs.

The at least one previously transmitted LDPC codeword includes a first LDPC codeword, and the first LDPC codeword is a head-to-tail spanning LDPC codeword. Different from that in step S103, information bits of the first LDPC codeword are information bits obtained after the first information bit set and the second information bit set are scrambled by using the scrambling sequence. The first information bit set is included in the first A-MPDU subframe, and the second information bit set is excluded in the first A-MPDU subframe.

Similar to that in step S103, in an example, the second information bit set may be a second information bit set in a second A-MPDU subframe, adjacent to the first A-MPDU subframe, that does not need to be retransmitted. Optionally, if the first MPDU that needs to be retransmitted is an MPDU that is unsuccessfully received, and an MPDU that does not need to be retransmitted is an MPDU that is successfully received, the first information bit set is bits that are unsuccessfully received, and the second information bit is bits that are successfully received.

For a difference between quantities of MPDUs that need to be retransmitted and a difference between locations of the MPDUs that need to be retransmitted, and a description of the first LDPC codeword, refer to the descriptions in step S103. Details are not described herein again.

S304: Send at least one retransmitted LDPC codeword obtained after the at least one first A-MPDU subframe is scrambled and encoded, where the at least one retransmitted LDPC codeword includes a punctured codeword, the punctured codeword is all or some of encoded bits obtained after a scrambled second information bit set in a second LDPC codeword is punctured, and the second LDPC codeword is determined based on the information bits of the first LDPC codeword.

In step S304, the transmit end retransmits the first MPDU that needs to be retransmitted and that is determined in step S303. A plurality of first MPDUs that need to be retransmitted may be sequentially arranged into a plurality of consecutive first A-MPDU subframes based on a previous transmission sequence, and then scrambled and encoded into at least one retransmitted LDPC codeword. Optionally, the at least one retransmitted LDPC codeword further includes at least one unpunctured codeword, and all information bits of the at least one unpunctured codeword are included in the bits obtained after the at least one A-MPDU subframe is scrambled. The unpunctured codeword is a non-head-to-tail spanning LDPC codeword. "Puncturing" may be understood as "deleting", and "puncturing" a bit in a codeword may be understood as "deleting" the bit in the codeword. It may be understood that not all retransmitted LDPC codewords include a scrambled second information bit set, and only a scrambled second information bit set in a head-to-tail spanning LDPC codeword needs to be punctured.

In S304, the transmit end obtains the second LDPC codeword based on the information bits of the previously transmitted first LDPC codeword. A method for obtaining the second LDPC codeword includes but is not limited to the following implementations.

Implementations in which CC is used include:

Implementation 1: The transmit end obtains the previously transmitted first LDPC codeword, and uses the first LDPC codeword as the second LDPC codeword.

In other words, the transmit end stores at least one previously transmitted LDPC codeword. The transmit end obtains at least one previously transmitted previously-transmitted codeword, and uses the at least one codeword as at least one retransmitted codeword. Specifically, the first LDPC codeword is directly used as the second LDPC codeword, and another previously transmitted codeword other than the first LDPC codeword is used as another retransmitted codeword other than the second LDPC codeword, so that the at least one first A-MPDU subframe does not need to be re-encoded, to reduce complexity and a delay of the transmit end. A case corresponding to the first LDPC codeword is described in detail in step S103, and details are not described herein again.

Implementation 2: The transmit end encodes the information bits of the first LDPC codeword by using a retransmission encoding parameter, to obtain the second LDPC codeword. The retransmission encoding parameter is the same as a previous-transmission encoding parameter used for the first LDPC codeword. Optionally, the encoding parameter includes an LDPC code length and a code rate. Certainly, the retransmission encoding parameter may also be used to obtain another retransmitted LDPC codeword. In another implementation, the first information bit set and the second information bit set corresponding to the first LDPC codeword may be directly scrambled and then encoded, to obtain the second LDPC codeword. It may be understood that another retransmitted codeword may also be obtained in a similar manner, and details are not described again. Optionally, the encoding parameter includes one or a combination of the following: a code length, a code rate, a parity-check matrix, a generator matrix, and the like. A pair of parameters (namely, a code rate and a code length) corresponds to one parity-check matrix or generator matrix.

Implementations in which IR is used include:

Implementation 3: The information bits of the first LDPC codeword are encoded by using a retransmission parity-check matrix, to obtain the second LDPC codeword. The first LDPC codeword and the second LDPC codeword are both generated based on a same LDPC parity-check matrix, but different parts of encoded bits generated by the LDPC parity-check matrix are transmitted, and the different parts may overlap. Certainly, the retransmission parity-check matrix may also be used to obtain another retransmitted LDPC codeword.

Implementation 4: A retransmitted LDPC codeword and a previously transmitted LDPC codeword are generated based on different check matrices, and there is a preset relationship between a parity-check matrix on which the retransmitted LDPC codeword is based and a parity-check matrix on which the previously transmitted LDPC codeword is based. In other words, a retransmission parity-check matrix is extended by adding a column and a row to a previous-transmission parity-check matrix. The LDPC codeword generated based on the retransmission parity-check matrix includes the previously transmitted LDPC codeword. Therefore, during retransmission, the previously transmitted LDPC codeword may be removed from LDPC codewords generated this time. Certainly, a similar method may also be used to obtain another LDPC retransmitted codeword.

In Implementation 3 and Implementation 4, a new check bit is generated for an information bit included in at least one previously transmitted LDPC codeword corresponding to a to-be-retransmitted MPDU or consecutive to-be-retransmitted MPDUs. The check bit and the corresponding information bit are combined to form at least one new retransmitted LDPC codeword. Generally, an information bit set (including a bit quantity and corresponding bits) included in the at least one retransmitted LDPC codeword is the same as an information bit set included in the at least one previously transmitted previously-transmitted LDPC codeword. In other words, the previously transmitted LDPC codeword and the retransmitted LDPC codeword are generated by using a same mother LDPC codebook. To be specific, information bits included in the previously transmitted LDPC codeword and the retransmitted LDPC codeword are the same. Check bits are different subsets of check bits of the mother LDPC codeword. Optionally, different subsets may overlap. Optionally, some or all scrambled information bits that are included in the at least one retransmitted LDPC codeword and that need to be retransmitted may also be punctured. This depends on a codebook design in HARQ IR, and is not limited in this application.

It should be noted that, in Implementations 1 to 4, an example in which the second LDPC codeword is generated based on the first LDPC is used. However, Implementations 1 to 4 are also applicable to a case in which an information bit of another to-be-retransmitted LDPC codeword other than the first LDPC codeword is used to generate the retransmitted LDPC codeword. Details are not described herein again.

In an example, in step S304, the at least one first MPDU retransmitted by the transmit end and at least one second MPDU transmitted for the first time may further be encapsulated into one physical layer protocol data unit for sending.

Encoding manners of retransmission, previous transmission, and first transmission may include but are not limited to the following:

In a first encoding manner, the repeatedly transmitted MPDU and the previously transmitted MPDU use a same scrambling sequence and a same encoding parameter. In an example, in S304, the at least one second MPDU transmitted for the first time in the A-MPDU and the retransmitted MPDU may be encoded by using a same encoding parameter and scrambled by using a periodic scrambler sequence generated by a same scrambler seed. In another example, the at least one second MPDU transmitted for the first time and the at least one retransmitted first MPDU may be encoded by using different encoding parameters, or may be encoded by using a same encoding parameter. Optionally, the at least one second MPDU transmitted for the first time and the at least one retransmitted first MPDU may be scrambled by using different periodic scrambling sequences (that is, corresponding to different scrambler seeds), or may be scrambled by using a same periodic scrambling sequence.

In a second encoding manner, the retransmitted MPDU and the previously transmitted MPDU use different scrambling sequences and a same encoding parameter. In an example, the retransmitted MPDU is scrambled by using a same periodic scrambling sequence as the MPDU transmitted for the first time. In this case, the transmit end needs to notify the receive end of a scrambler seed (corresponding to the periodic scrambling sequence) used for the A-MPDU subframe including the retransmitted MPDU. The scrambler seed may be indicated by using a physical layer preamble of a PPDU, including being indicated by several bits of a random field of the physical layer preamble, for example, a cyclic redundancy check (Cyclic redundancy check, CRC), but at the same time, bits in the scrambler seed are not all 0. For example, 1 bit is fixed to 1. Alternatively, the receive end is notified of the scrambler seed in a manner agreed upon by both parties, for example, by using a scrambler seed function transmitted last time. For example, the scrambler seed is obtained by adding 1 to a previous scrambler seed.

Figure 8B:
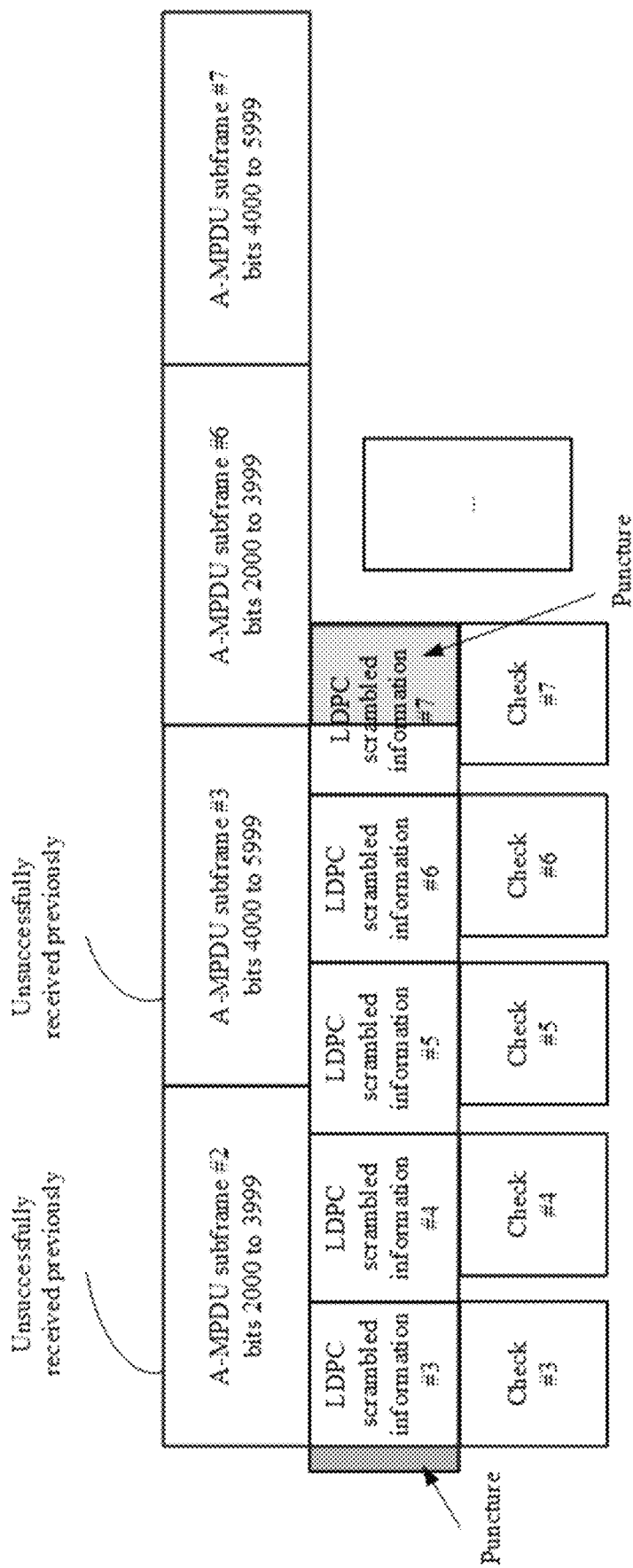
FIG. 8b is a schematic diagram of a structure of another retransmitted A-MPDU according to an embodiment of this application.

FIG. 8b shows an example of retransmission of an MPDU 2 and an MPDU 3. FIG. 8a shows an example of the previously transmitted A-MPDU. In step S301, the transmit end sends the A-MPDU shown in FIG. 8a to the receive end, where the previously transmitted A-MPDU includes the A-MPDU subframe 1 to the A-MPDU subframe 5, and after being scrambled and encoded, the A-MPDU is sent. Optionally, in step S302, the receive end sends acknowledgment feedback information to indicate that the MPDU 2 and the MPDU 3 are unsuccessfully received. In step S303, the transmit end determines that the MPDUs that need to be retransmitted are the MPDU 2 in the A-MPDU subframe 2 and the MPDU 3 in the A-MPDU subframe 3. In step S304, as shown in FIG. 8b, the transmit end retransmits the MPDU 2 and the MPDU 3, and the transmit end determines that the LDPC codeword 3 and the LDPC codeword 5 are second LDPC codewords (head-to-tail spanning LDPC codewords). A scrambled bit (a dark area in FIG. 8b) in the LDPC codeword 3 is punctured, and a scrambled bit (a dashed area in FIG. 8b) in the LDPC codeword 5 is punctured. Optionally, the transmit end further sends an A-MPDU subframe 6 and an A-MPDU subframe 7. The two subframes include MPDUs transmitted for the first time. A periodic scrambler sequence generated by a same scrambler seed may be used for a plurality of MPDUs transmitted for the first time in the A-MPDU (for example, an MPDU 6 in the A-MPDU subframe 6 and an MPDU 7 in the A-MPDU subframe 7). The scrambler seed may be randomly generated, or may be generated according to a specific rule. It may be understood that the plurality of MPDUs transmitted for the first time and the retransmitted MPDU may be scrambled by using different periodic scrambling sequences (that is, corresponding to different scrambler seeds).

Figure 8C:
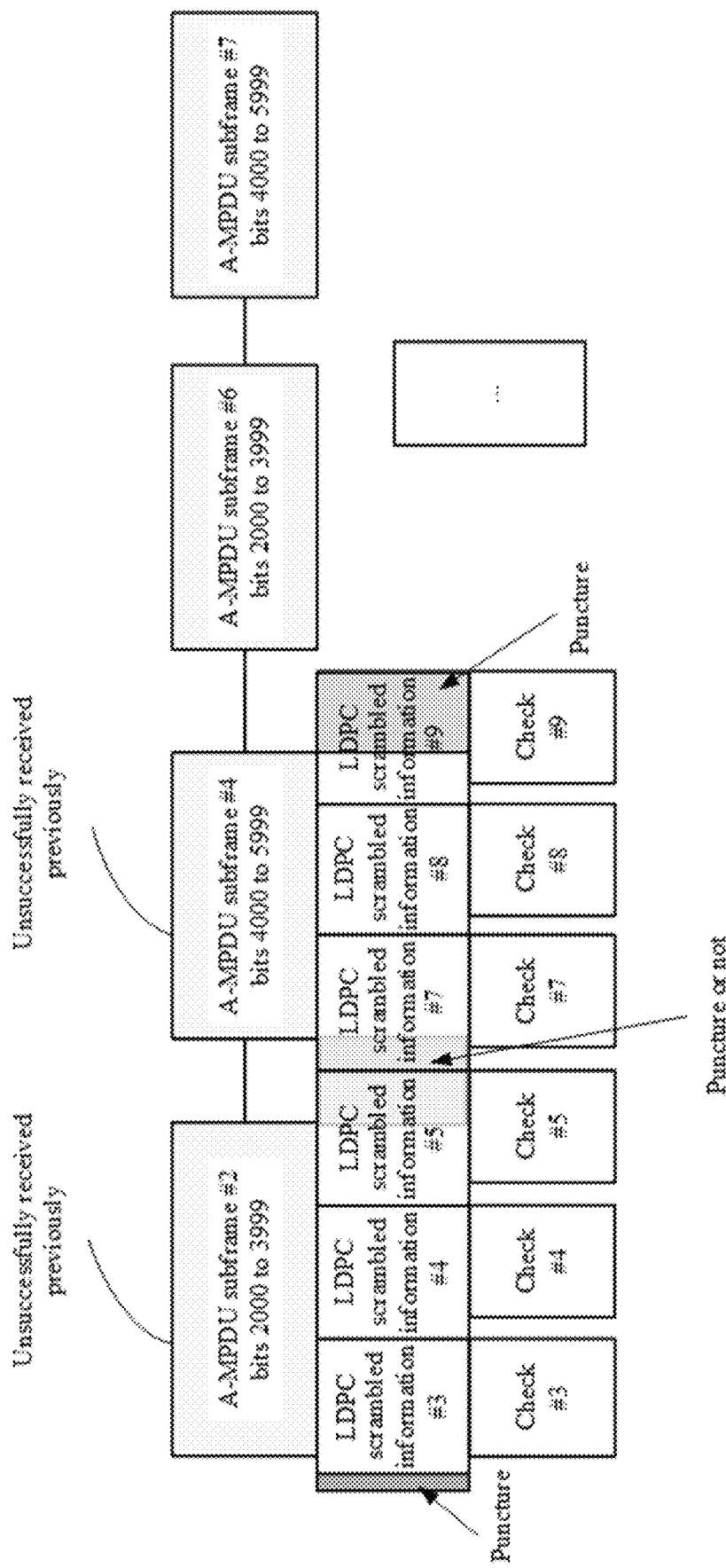
FIG. 8c is a schematic diagram of a structure of another retransmitted A-MPDU according to an embodiment of this application.

FIG. 8c shows an example of retransmission of the MPDU 2 and an MPDU 4. In step S304, as shown in FIG. 8b, the transmit end retransmits the MPDU 2 and the MPDU 4, and the transmit end determines that the LDPC codeword 3 and the LDPC codeword 9 are second LDPC codewords. In addition, the scrambled bit (a dark area in FIG. 8c) in the LDPC codeword 3 is punctured, and the scrambled bit (a dark area in FIG. 8c) in the LDPC codeword 9 is punctured. Information bits in the LDPC codeword 5 and the LDPC codeword 7 may or may not be punctured. If puncturing is performed, an information bit that does not need to be retransmitted (a correctly received information bit) may be punctured, to effectively reduce retransmission overheads. If puncturing is not performed, receiving complexity of the receive end may be reduced.

The descriptions mentioned in this embodiment are still applicable to another embodiment unless otherwise specified in the another embodiment.

According to the method in this embodiment of this application, an information bit corresponding to the retransmitted LDPC codeword is the same as an information bit corresponding to the previously transmitted LDPC codeword, and corresponding check bits are also the same. In this way, the receive end may directly perform combined decoding or joint decoding on an LLR of the retransmitted LDPC codeword and an LLR of the previously transmitted LDPC codeword, to reduce complexity and decoding time of the receive end, and improve transmission efficiency. In addition, in this embodiment, the retransmitted MPDU may be first scrambled and then encoded. This does not change an existing processing process, thereby improving compatibility, and reducing retransmission complexity of the transmit end. The method in this embodiment of this application may be applied to a scenario in which a plurality of MPDUs are aggregated, to implement MPDU retransmission based on an A-MPDU structure, and the method can support retransmission in a WLAN, to further improve stability of a WLAN system.

Embodiment 4 is for the foregoing second case (to be specific, a transmit end first scrambles and then encodes a MAC layer frame, and correspondingly, a receive end first decodes and then descrambles a PHY layer data unit). A retransmitted data receiving method according to an embodiment of this application is described in detail, to improve transmission reliability and transmission efficiency of a wireless communications system.

Figure 9:
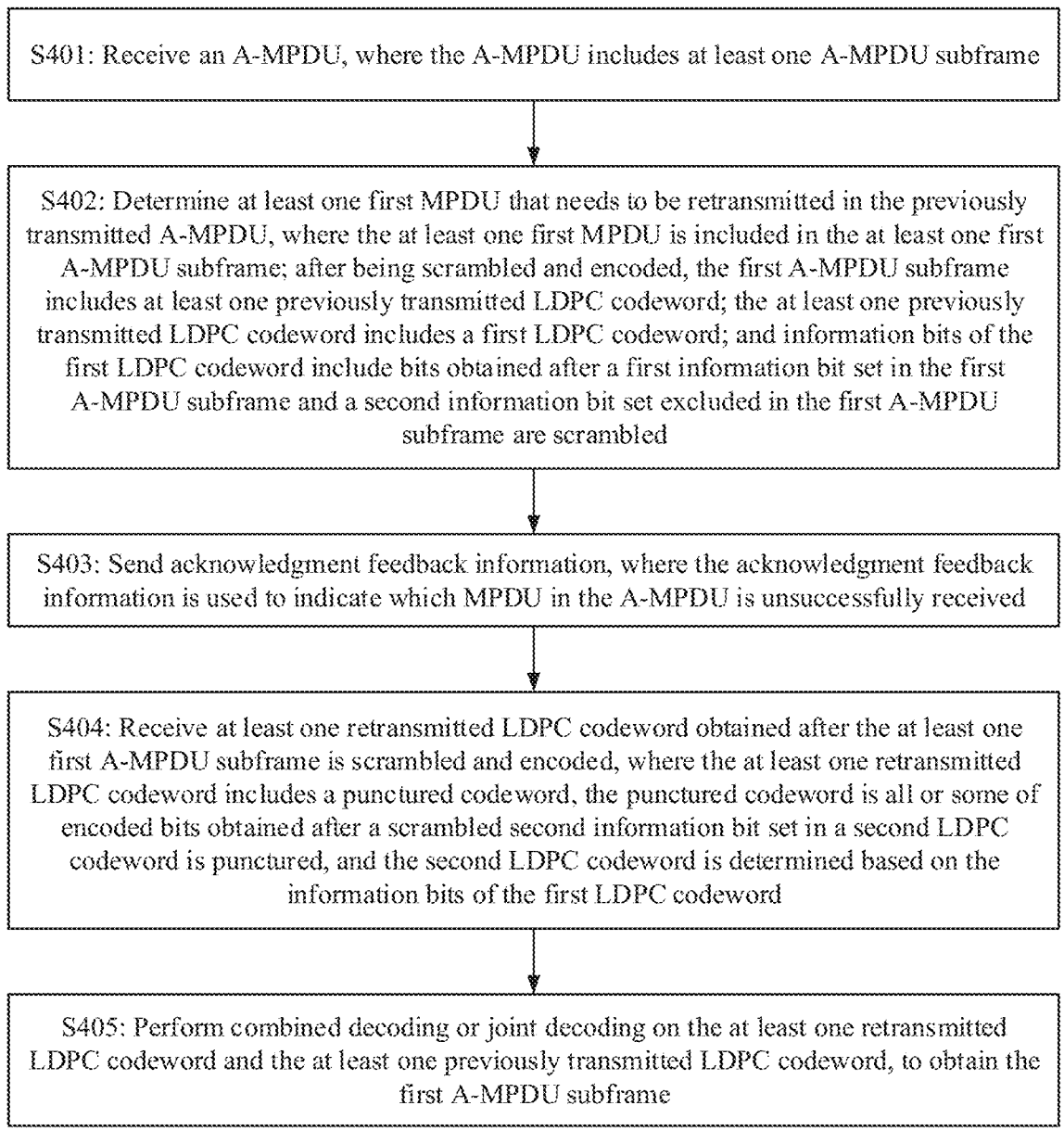
FIG. 9 is a schematic flowchart of another retransmitted data receiving method according to an embodiment of this application.

FIG. 9 is a schematic flowchart of the retransmitted data receiving method according to an embodiment of this application. The method includes the following steps.

S401: Receive an aggregate media access control protocol data unit A-MPDU, where the A-MPDU includes at least one A-MPDU subframe; and optionally, the A-MPDU further includes another A-MPDU subframe.

Correspondingly, optionally, the receive end performs processing such as constellation point demapping, decoding, and descrambling on a received physical layer protocol data unit, to obtain the A-MPDU through parsing. For detailed descriptions of the A-MPDU, refer to the foregoing embodiment. Details are not described herein again.

S402: Determine at least one first MPDU that needs to be retransmitted in the previously transmitted A-MPDU, where the at least one first MPDU is included in at least one first A-MPDU subframe.

For step S402, refer to step S202. Details are not described herein again.

A difference lies in that, after being scrambled and encoded, the first A-MPDU subframe includes at least one previously transmitted LDPC codeword. The at least one previously transmitted LDPC codeword includes a first LDPC codeword, and information bits of the first LDPC codeword include bits obtained after a first information bit set in the first A-MPDU subframe and a second information bit set excluded in the first A-MPDU subframe are scrambled.

S403: Send an acknowledgment feedback frame, where the acknowledgment feedback is used to indicate which MPDU in the A-MPDU is unsuccessfully received.

The receive end identifies the MPDU that is unsuccessfully received in the A-MPDU, and performs acknowledge feedback on the received MPDU, where the feedback includes no reply, and replying in manners such as a NACK, an ACK, a Block ACK, and a Multi-STA Block Ack. For details, refer to the descriptions in step S102. Optionally, the receive end feeds back that at least one first MPDU is unsuccessfully received, and the at least one first MPDU corresponds to at least one first A-MPDU subframe.

S404: Receive at least one retransmitted LDPC codeword that is obtained after the at least one first A-MPDU subframe is scrambled and encoded and that is sent by the transmit end, where the at least one retransmitted LDPC codeword includes a punctured codeword, the punctured codeword is all or some of encoded bits obtained after a scrambled second information bit set in a second LDPC codeword is punctured, and the second LDPC codeword is determined based on the information bits of the first LDPC codeword.

It should be noted that the receive end receives a PPDU carrying a retransmitted MPDU, where the PPDU includes the first MPDU in the first A-MPDU subframe, and the first MPDU is retransmitted. Optionally, the PPDU may further include another non-retransmitted MPDU, for example, an MPDU transmitted for the first time.

During the previous transmission, the at least one previously transmitted LDPC codeword obtained after the at least one first A-MPDU subframe is first scrambled and then encoded may include two types: a head-to-tail spanning LDPC codeword and a non-head-to-tail spanning LDPC codeword. Certainly, the at least one previously transmitted LDPC codeword may alternatively include only a head-to-tail spanning LDPC codeword.

Some information bits of the head-to-tail spanning LDPC codeword are included in bits obtained after the at least one first A-MPDU subframe (a subframe corresponding to the MPDU that needs to be retransmitted) is scrambled. All information bits of the non-head-to-tail spanning LDPC codeword are included in the bits obtained after the at least one first A-MPDU subframe (the subframe corresponding to the MPDU that needs to be retransmitted) is scrambled. The head-to-tail spanning LDPC codeword is a codeword whose head and tail span the MPDU that needs to be retransmitted or consecutive to-be-retransmitted MPDUs. The non-headto-tail spanning LDPC codeword is a codeword whose head and tail are included in the MPDU that needs to be retransmitted or the consecutive to-be-retransmitted MPDUs.

The at least one previously transmitted LDPC codeword includes the first LDPC codeword, and the first LDPC codeword is a head-to-tail spanning LDPC codeword. Optionally, the at least one previously transmitted LDPC codeword further includes a non-head-to-tail spanning LDPC codeword.

In a plurality of cases in which quantities and locations of to-be-retransmitted MPDUs are different, the first LDPC codeword also has a plurality of different cases. For a detailed description of the first LDPC codeword, refer to Embodiment 3. Details are not described herein again.

S405: Perform combined decoding or joint decoding on the at least one retransmitted LDPC codeword and the at least one previously received previously-transmitted LDPC codeword, to obtain the first A-MPDU subframe.

It should be noted that decoding and encoding are mutually corresponding operations. Therefore, an encoding parameter and a decoding parameter for same information need to match or correspond to each other.

The at least one retransmitted LDPC codeword further includes at least one unpunctured codeword, and all information bits of the at least one unpunctured codeword are included in the bits obtained after the at least one first A-MPDU subframe is scrambled. The at least one unpunctured codeword is a non-head-to-tail spanning LDPC codeword.

For the punctured codeword, before the combined decoding or joint decoding, the transmit end needs to supplement the scrambled second information bit set to the punctured codeword, to obtain the second LDPC codeword. For the unpunctured codeword, supplement is not required.

Further, the at least one retransmitted LDPC codeword and the at least one previously received previously-transmitted LDPC codeword are decoded by using a retransmission decoding parameter, to obtain scrambled information bits. Further, the scrambled information bits are descrambled by using a retransmission scrambling sequence, to obtain the first A-MPDU subframe. It should be noted that descrambled information bits include the second information bit set that is excluded in the at least one first A-MPDU subframe. Therefore, the second information bit set further needs to be deleted after descrambling, to obtain the at least one first A-MPDU subframe, so as to implement successful retransmission of the at least one first MPDU.

When the transmit end uses the first encoding manner, that is, a same scrambling sequence and a same encoding parameter are used for the repeatedly transmitted MPDU and a previously transmitted MPDU, correspondingly, the receive end uses a first decoding manner. A retransmission scrambling sequence used by the receive end during decoding is the same as a previously transmitted scrambling sequence, and a retransmission decoding parameter used by the receive end is the same as a previous-transmission decoding parameter. It may be understood that the decoding parameter corresponds to the encoding parameter.

When the transmit end uses the second encoding manner, that is, different scrambling sequences are used for the retransmitted MPDU and a previously transmitted MPDU, a retransmission scrambling sequence is a new scrambling sequence, a previous-transmission scrambling sequence is an old scrambling sequence, and used encoding parameters are the same, correspondingly, the receive end uses a second decoding manner. In this case, the transmit end needs to notify the receive end of a new scrambler seed (corresponding to a periodic scrambling sequence) used for the A-MPDU subframe including the retransmitted MPDU. The new scrambler seed may be indicated by using a physical layer preamble of a PPDU, including being indicated by several bits of a random field of the physical layer preamble, for example, a cyclic redundancy check (Cyclic redundancy check, CRC), but at the same time, bits in the scrambler seed are not all 0. For example, 1 bit is fixed to 1. Alternatively, the receive end is notified of the new scrambler seed in a manner agreed upon by both parties, for example, by using a previously transmitted old scrambler seed function. For example, the scrambler seed is obtained by adding 1 to an old scrambler seed.

Optionally, in the second decoding manner, the receive end needs to compare whether a bit obtained after the retransmitted MPDU that is scrambled by using the new scrambling sequence is encoded is the same as a bit obtained after the previously transmitted MPDU that is scrambled by using the old scrambling sequence is encoded. If an $n^{th}$ bit is the same, an LLR of the $n^{th}$ bit in encoded bits used to transmit the MPDU last time is not changed. If the $n^{th}$ bit is different, an LLR of the encoded bits used to transmit the MPDU last time is multiplied by −1, where n=1 . . . N, and N is a code length. Then, combined decoding or joint decoding is performed on an LLR of encoded bits of the retransmitted MPDU and the LLR of the encoded bits of the MPDU transmitted last time. Finally, decoded bits are descrambled, and a scrambler seed used for descrambling is the new scrambler seed for the retransmitted MPDU. Certainly, the method may alternatively be used to adjust a sign of the LLR of the encoded bits of the retransmitted MPDU instead of adjusting a sign of the LLR of the encoded bits of the previously transmitted MPDU. In this case, the scrambler seed used for descrambling is the old scrambler seed used to previously transmit the MPDU.

For HARQ CC, the receive end performs combined decoding on an LLR of an LDPC codeword of the retransmitted first MPDU and an LLR of an LDPC codeword of the previously received first MPDU. For HARQ IR, the receive end performs joint decoding on an LLR of the LDPC codeword of the retransmitted MPDU and an LLR of an LDPC codeword of an MPDU that is incorrectly received last time.

Optionally, the method further includes: performing acknowledgment feedback on each MPDU in the A-MPDU in the PPDU, where the acknowledgment feedback method includes manners such as no reply, a NACK, an ACK, a Block ACK, and a Multi-STA Block Ack. For specific details, refer to step S102. Details are not described herein again.

The descriptions mentioned in this embodiment are still applicable to another embodiment unless otherwise specified in the another embodiment.

According to the method in this embodiment of this application, an information bit corresponding to the retransmitted LDPC codeword is the same as an information bit corresponding to the previously transmitted LDPC codeword, and corresponding check bits are also the same. In this way, the receive end may directly perform combined decoding or joint decoding on an LLR of the retransmitted LDPC codeword and an LLR of the previously transmitted LDPC codeword, to reduce complexity and decoding time of the receive end, and improve transmission efficiency. In addition, in this embodiment, the retransmitted MPDU may be first scrambled and then encoded. This does not change an existing processing process, thereby improving compatibility, and reducing retransmission complexity of the transmit end. The method in this embodiment of this application may be applied to a scenario in which a plurality of MPDUs are aggregated, to implement MPDU retransmission based on an A-MPDU structure, and the method can support retransmission in a WLAN, to further improve stability of a WLAN system.

Embodiment 5 provides a physical layer protocol data unit (PPDU) sending method.

Figure 10:
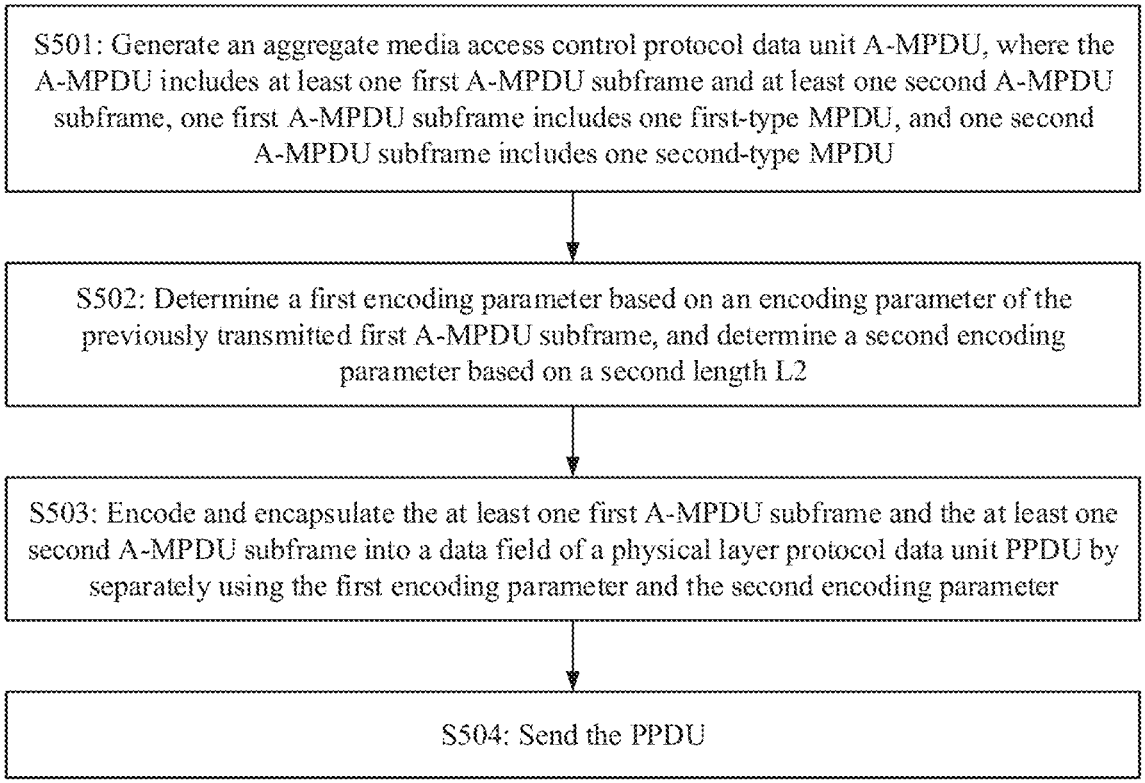
FIG. 10 is a schematic flowchart of a PPDU sending method according to an embodiment of this application.

FIG. 10 shows the physical layer protocol data unit sending method according to an embodiment of this application. The method is applied to a transmit end and includes the following steps.

S501: Generate an aggregate media access control protocol data unit A-MPDU, where the A-MPDU includes at least one first A-MPDU subframe and at least one second A-MPDU subframe, one first A-MPDU subframe includes one first-type retransmitted media access control protocol data unit MPDU, and one second A-MPDU subframe includes one second-type MPDU.

A total length of the at least one first A-MPDU subframe is a first length L1, a total length of the at least one second A-MPDU subframe is a second length L2, and a total length of the A-MPDU subframes is a third length L3. The third length L3 refers to lengths of all the A-MPDU subframes. The third length L3 may also be denoted as APEP_ LENGTH (in the 802.11ac and 802.11ax protocols). For an HT PPDU defined in the 802.11n standard, the third length L3 may be indicated by length in an HT-SIG A field.

In this embodiment of this application, the at least one first A-MPDU subframe is adjacent in the A-MPDU, that is, includes at least one first-type MPDU; and the at least one second A-MPDU subframe is also adjacent in the A-MPDU, that is, includes at least one second-type MPDU.

In an example, the first-type MPDU and the second-type MPDU may optionally be two service types with different priorities, and the two types of MPDUs need to be encoded by using different encoding parameters. In another example, the two types of MPDUs may optionally be two service types requiring different reliability, and also need to be encoded by using different encoding parameters. In another example, the two types of MPDUs may be retransmitted data and non-retransmitted data, and different encoding parameters are used.

In the following description, an example in which the first-type MPDU is a retransmitted MPDU, and the second-type MPDU is a non-retransmitted MPDU is used for description in this embodiment of this application. It may be understood that this solution is also applicable to another case. This is not limited in this application. It should be noted that the MPDU that needs to be retransmitted may be an MPDU that is unsuccessfully received during previous transmission, and is used for HARQ transmission. A receive end performs combined decoding or joint decoding on LLRs of the retransmitted MPDU and a corresponding MPDU that fails last time. The non-retransmitted MPDU may be an MPDU successfully received during the previous transmission, and further includes a retransmitted MPDU used for ARQ transmission. Although the MPDU is retransmitted, the receive end does not need to perform corresponding HARQ receiving processing on the retransmitted MPDU. For how to determine which MPDU needs to be retransmitted, refer to the foregoing embodiments. Details are not described herein again.

Transmission before step S501 further includes: The transmit end further sends the at least one first A-MPDU subframe, where one first A-MPDU includes a first-type MPDU, and an encoding parameter used for the first A-MPDU subframe is referred to as a previous-transmission encoding parameter, and includes a code rate, a code length, and the like. Bits obtained after other operations such as encoding and bits obtained after other operations such as encoding of another A-MPDU subframe are encapsulated into one PPDU. The PPDU is referred to as a previously transmitted PPDU, to be distinguished from that in step S502.

It should be noted that in an actual product, only one parity-check matrix is specified for one combination of a code length and a code rate. Therefore, the parity-check matrix is not mentioned in the encoding parameter herein. However, in academic theory, there may be different check matrices for one combination of a code rate and a code length. Therefore, in this case, the parity-check matrix needs to be considered.

S502: Determine a first encoding parameter based on an encoding parameter of the previously transmitted first A-MPDU subframe, and determine a second encoding parameter based on the second length L2.

The encoding parameter of the first A-MPDU subframe may alternatively be determined in another manner. This is not limited in the present disclosure.

5503: Encode and encapsulate the at least one first A-MPDU subframe and the at least one second A-MPDU subframe into a data field of a physical layer protocol data unit PPDU by separately using the first encoding parameter and the second encoding parameter.

The data field of the PPDU includes a first part obtained after the at least one first A-MPDU subframe is encoded by using the first encoding parameter and a second part obtained after the at least one second A-MPDU subframe is encoded by using the second encoding parameter. The first part includes N1 OFDM symbols, and the second part includes N2 OFDM symbols. For example, FIG. 11 is a schematic diagram of a PPDU. The PPDU includes a preamble and a data field, and optionally further includes a packet extension (packet extension, PE) field. The preamble field may further include a legacy preamble and a next-generation new preamble.

5504: Send the PPDU.

The first encoding parameter is an encoding parameter for encapsulating the at least first A-MPDU subframe, and the second encoding parameter is an encoding parameter for encapsulating the at least one second A-MPDU subframe.

In 802.11n, an LDPC code length used by each MPDU in an A-MPDU is determined by a length field in a high throughput signal field A (high throughput signal field A, HT-SIGA). The length field indicates a length of a PSDU. When the PPDU carries the A-MPDU, the length of the PSDU is a length of A-MPDU Pre-EOF Padding (mentioned above). In 802.11ac/ax, an LDPC code length used by each MPDU in an A-MPDU is determined by a length of A-MPDU Pre-EOF Padding, which is denoted as APEP_ LENGTH. 802.11ac is used as an example.

In this embodiment of this application, because there is a retransmitted MPDU and an MPDU that is transmitted for the first time, the second encoding parameter needs to be determined based on the second length L2. In other words, an LDPC code length used for the MPDU that is transmitted for the first time is determined. For the retransmitted MPDU, reference needs to be made to an encoding parameter used for transmitting the MPDU previously.

In an example, the first encoding parameter includes an encoding code length and an encoding code rate, and the encoding code length and the encoding code rate are the same as an encoding code length and an encoding code rate of the at least one previously transmitted first A-MPDU subframe. In another example, the first encoding parameter includes a parity-check matrix, and the parity-check matrix has a preset relationship with a parity-check matrix of the at least one previously transmitted first A-MPDU subframe.

Determining the second encoding parameter based on the second length L2 includes: determining, based on the second length L2, a quantity N2 of the OFDM symbols corresponding to the at least one second A-MPDU subframe; determining, based on the quantity N2 of the OFDM symbols, a quantity $N_{avbit}$ of encoded bits required by the at least one second A-MPDU subframe; and determining the second encoding parameter based on $N_{avbit}$.

In an implementation of this embodiment of this application, the transmit end may obtain $N_{avbit}$ through calculation based on the following formulas:

$$N2 = m_{STBC} \times \left\lceil \frac{8 \times L2 + N_{service}}{m_{STBC} \times N_{DBPS}} \right\rceil; \text{ and} \quad \text{(formula 1)}$$

$$N_{avbit} = N2 \times N_{CBPS}. \quad \text{(formula 2)}$$

When an STBC method is used for data, $m_{STBC}=2$, otherwise, $m_{STBC}=1$ $N_{DBPS}$ is a quantity of information bits that can be carried by each OFDM symbol. $N_{service}$ is a length of a service field in a PPDU structure. $N_{CBPS}$ is a quantity of encoded bits that can be carried by each OFDM symbol. $N_{service}$ is the length of the service field in the PPDU structure. Currently, the length is 16 bits, and may increase, decrease, or even decrease to 0 in the future.

It should be understood that, in an actual implementation process, there is a plurality of manners for the transmit end to obtain N2 and $N_{avbit}$. For example, $N_{avbit}$ may be obtained by directly substituting the (formula 1) into the (formula 2). Alternatively, $N_{avbit}$ may be obtained through calculation based on other equivalent deformations or simplified forms of the (formula 1) and the (formula 2). Alternatively, a mapping relationship table of parameters such as L2 and $N_{avbit}$ that are obtained through calculation based on the (formula 1) and the (formula 2) may be stored, and $N_{avbit}$ is determined by querying the table. In addition, in the 802.11ax protocol, because a packet extension feature is introduced, some last encoded bits do not necessarily occupy a complete OFDM symbol, and a quantity of the encoded bits may be 1/4, 1/2, 3/4, or 1 of a quantity of encoded bits carried in a single OFDM symbol. A total quantity of encoded bits $N_{avbit}=(N2-m_{STBC})\cdot N_{CBPS}+m_{STBC}\cdot N_{CBPS,last}$, where $N_{CBPS,last}$ is a quantity of encoded bits included in the last OFDM symbol. This is not specifically limited in this embodiment of this application. In addition, the transmit end may determine L2 based on the first length L1 and the third length L3, or may directly determine L2 based on a length of the at least one second A-MPDU subframe, or may determine L2 in another manner.

Further optionally, determining the second encoding parameter based on $N_{avbit}$ includes: determining, based on a preset correspondence between an encoded bit and a code length, an encoding code length included in the second encoding parameter. In an example, the preset correspondence between an encoded bit and a code length is shown in the following Table 1. An LDPC code length used to encode the at least one second A-MPDU subframe this time is obtained by querying the following table based on $N_{avbit}$. A code rate depends on a channel condition, and a higher coding rate may alternatively be used under a same channel condition.

TABLE 1

| Range of $N_{avbit}$ | Quantity of LDPC codewords | LDPC code length |
|---|---|---|
| $N_{avbit} \leq 648$ | 1 | If $N_{avbit} \geq N_{pld} + 912 \times (1-R)$, the code length is 1296, otherwise, the code length is 648 |
| $648 < N_{avbit} \leq 1296$ | 1 | If $N_{avbit} \geq N_{pld} + 1464 \times (1-R)$, the code length is 1944, otherwise, the code length is 1296 |
| $648 < N_{avbit} \leq 1296$ | 1 | 1944 |
| $648 < N_{avbit} \leq 1296$ | 2 | If $N_{avbit} \geq N_{pld} + 2916 \times (1-R)$, the code length is 1944, otherwise, the code length is 1296 |
| $648 < N_{avbit} \leq 1296$ | $\left\lceil \frac{N_{pld}}{1944 \times R} \right\rceil$ | 1944 |

$N_{pld}=8\times APEP\_LENGTH+N_{service}$. R is an LDPC code rate. Currently, LDPC code rates used in Wi-Fi are 1/2, 2/3, 3/4, and 5/6. APEP_LENGTH is the length of the A-MPDU Pre-EOF Padding, and is expressed in a quantity of bytes.

In this embodiment of this application, optionally, a preamble of the PPDU includes a length indication, and the length indication is used to indicate the first length L1 or the second length L2, so that the receive end may determine the decoding parameter based on the second length L2. In a first implementation, the length indication is used to indicate the first length L1. The receive end may determine L2 based on the length indication, for example, L2=L3−L1. In a second implementation, the length indication directly indicates the second length, and the receive end directly obtains the second length L2.

In a third implementation, the preamble of the PPDU includes information indicating a first decoding parameter of the first part and/or a second decoding parameter of the second part, and the information includes a code length, a code rate, and the like. The receive end directly determines, based on the information in the PPDU, the first decoding parameter and the second decoding parameter that need to be used.

The foregoing three implementations are all implemented in a manner of carrying an explicit indication in a physical layer preamble. In a fourth implementation, the transmit end may not indicate the length. Instead, the receive end feeds back the length to a PHY layer through a MAC layer of the receive end, so that the PHY layer of the receive end knows a total length L1 of an A-MPDU subframe that is incorrectly received during the previous transmission. Specifically, the MAC layer of the receive end searches for a first 4-byte MPDU delimiter of each A-MPDU subframe by using a 4-byte sliding window (where the MPDU delimiter is 4 bytes and includes MPDU length indication information, and a length of the A-MPDU subframe is also an integer multiple of 4 bytes), to obtain the total length of the incorrectly received A-MPDU subframe. If the entire A-MPDU is incorrect, the receive end may calculate the total length of all the A-MPDU subframes, namely, the length of the A-MPDU Pre-EOF Padding, by using a length field of an L-SIG field in the legacy preamble (Non-HT preamble) and a fixed preamble length of the PPDU.

The receive end may obtain the third length L3 of all the A-MPDU subframes, namely, the length of the A-MPDU Pre-EOF Padding, through calculation based on the length field of the L-SIG field in the legacy preamble (Non-HT preamble) and the preamble length of the PPDU.

In the foregoing method, a scrambler operation is not considered. If a scrambling operation performed by the transmit end is before the encoding operation, the A-MPDU construction manner further optionally includes: Different periodic scrambling sequences are used for the first A-MPDU subframe (including the retransmitted MPDU) and the second A-MPDU subframe (including a newly transmitted MPDU).

The first A-MPDU subframe uses a same scrambling sequence as that used to transmit the first A-MPDU last time or that used to transmit the first A-MPDU subframe for the first time, namely, a same periodic scrambler sequence (depending on a scrambler seed). In addition, a first bit or an $n^{th}$ bit of a scrambling sequence for the first A-MPDU (including the retransmitted MPDU) is the same as a first bit or an $n^{th}$ bit of a scrambling sequence that is used to transmit the A-MPDU subframe including the MPDU last time or used to initially transmit the A-MPDU subframe including the MPDU. The second A-MPDU subframe corresponding to the newly transmitted MPDU is scrambled by using another new periodic scrambling sequence. For example, a scrambler seed is generated by using an existing 802.11ac/ax method, a scrambler is the same as that used in 802.11ac/ax, and a periodic 127-bit sequence is generated.

The descriptions mentioned in this embodiment are still applicable to another embodiment unless otherwise specified in the another embodiment.

This embodiment of this application provides an A-MPDU (including a retransmitted MPDU and an MPDU transmitted for the first time) construction method. The method is applied to a scenario in which a plurality of MPDUs are aggregated, to implement MPDU retransmission based on an A-MPDU structure, and the method can support retransmission in a WLAN, to further improve stability of a WLAN system.

Embodiment 6 corresponds to Embodiment 5, and is a method applied to a receive end.

FIG. 12 shows a PPDU receiving method according to an embodiment of this application. The method is applied to the receive end and includes the following steps.

S601: Receive a physical layer protocol data unit PPDU, where a data field of the PPDU includes a first part obtained after at least one first A-MPDU subframe is encoded by using a first encoding parameter and a second part obtained after at least one second A-MPDU subframe is encoded by using a second encoding parameter, one first A-MPDU subframe includes one first-type MPDU, one second A-MPDU subframe includes one second-type MPDU.

A total length of the at least one first A-MPDU subframe is a first length L1, a total length of the at least one second A-MPDU subframe is a second length L2, and a total length of the A-MPDU subframes is a third length L3. The first part includes N1 OFDM symbols, and the second part includes N2 OFDM symbols.

For the first-type MPDU and the second-type MPDU, refer to the descriptions in S501 in the foregoing embodiment. Details are not described herein again. Similarly, in this embodiment of this application, an example in which the first-type MPDU is a retransmitted MPDU and the second-type MPDU is a non-retransmitted MPDU is used for description. The MPDU that needs to be retransmitted may be an MPDU that is unsuccessfully received during previous transmission, and is used for HARQ transmission. The receive end performs combined decoding or joint decoding on LLRs of the retransmitted MPDU and a corresponding MPDU that fails last time. The non-retransmitted MPDU (or referred to as an initially transmitted MPDU) may be an MPDU successfully received during the previous transmission, and further includes a retransmitted MPDU used for ARQ transmission. Although the MPDU is retransmitted, the receive end does not need to perform corresponding HARQ receiving processing on the retransmitted MPDU. For how to determine which MPDU needs to be retransmitted, refer to the foregoing embodiments. Details are not described herein again.

Transmission before step S601 further includes: The receive end further receives the at least one first A-MPDU subframe, where one first A-MPDU includes a first-type MPDU, and the first A-MPDU subframe is encoded by using a previous-transmission encoding parameter to encapsulate the first A-MPDU subframe into a PPDU. The PPDU is referred to as a previously transmitted PPDU, to be distinguished from that in step S601.

S602: Decode the PPDU by separately using a first encoding parameter and a second encoding parameter, to obtain the at least one first A-MPDU subframe and the at least one second A-MPDU subframe.

The first encoding parameter is determined based on the previous-transmission encoding parameter of the previously transmitted first A-MPDU subframe, or may be determined in another manner. This is not limited in the present disclosure. The second encoding parameter is determined based on the second length L2. It should be noted that the first encoding parameter actually corresponds to a first decoding parameter, and the second encoding parameter actually corresponds to a second decoding parameter. The first decoding parameter is used to decode the first part of the data field of the PPDU, and the second decoding parameter is used to decode the second part of the data field of the PPDU.

The first decoding parameter (corresponding to the first encoding parameter) includes an encoding code length and an encoding code rate, and the encoding code length and the encoding code rate are the same as a code length and a code rate of the at least one previously transmitted first A-MPDU subframe.

Alternatively, the first decoding parameter (corresponding to the first encoding parameter) includes a parity-check matrix, and the parity-check matrix has a preset relationship with a parity-check matrix of the at least one previously transmitted first A-MPDU subframe.

Optionally, the receive end may alternatively determine the second decoding parameter (corresponding to the second encoding parameter) based on the second length L2. Specifically, the following steps are included:
  determining, based on the second length L2, a quantity N2 of the OFDM symbols corresponding to the at least one second A-MPDU subframe;
  determining, based on the quantity N2 of the OFDM symbols, a quantity $N_{avbit}$ of encoded bits required by the at least one second A-MPDU subframe; and
  determining the second decoding parameter based on $N_{avbit}$.

In an implementation of this embodiment of this application, the receive end may obtain $N_{avbit}$ through calculation based on the following formulas:

$$N2 = m_{STBC} \times \left\lceil \frac{8 \times L2 + N_{service}}{m_{STBC} \times N_{DBPS}} \right\rceil; \quad \text{(formula 1)}$$

$$N_{avbit} = N2 \times N_{CBPS}. \quad \text{(formula 2)}$$

When an STBC method is used, $m_{STBC}=2$, otherwise, $m_{STBC}=1$. $N_{DBPS}$ is a quantity of information bits that can be carried by each OFDM symbol. $N_{service}$ is a length of a service field in a PPDU structure. $N_{CBPS}$ is a quantity of encoded bits that can be carried by each OFDM symbol. $N_{service}$ is a length of a service field in a PPDU structure. Currently, the length is 16 bits, and may increase, decrease, or even decrease to 0 in the future.

It should be understood that, in an actual implementation process, there is a plurality of manners for the receive end to obtain N2 and $N_{avbit}$. For example, $N_{avbit}$ may be obtained by directly substituting the (formula 1) into the (formula 2). Alternatively, $N_{avbit}$ may be obtained through calculation based on other equivalent deformations or simplified forms of the (formula 1) and the (formula 2). Alternatively, a mapping relationship table of parameters such as L2 and $N_{avbit}$ that are obtained through calculation based on the (formula 1) and the (formula 2) may be stored, and $N_{avbit}$ is determined by querying the table. In addition, in the 802.11ax protocol, because a packet extension feature is introduced, some last encoded bits do not necessarily occupy a complete OFDM symbol, and a quantity of the encoded bits may be 1/4, 1/2, 3/4, or 1 of a quantity of encoded bits carried in a single OFDM symbol. A total quantity of encoded bits $N_{avbit}=(N2-m_{STBC}) \cdot N_{CBPS} + m_{STBC} \cdot N_{CBPS,last}$ where $N_{CBPS,last}$ is a quantity of encoded bits included in the last OFDM symbol. This is not specifically limited in this embodiment of this application. In addition, the receive end may determine L2 based on the first length L1 and the third length L3, or may directly determine L2 based on the length of the at least one second A-MPDU subframe, or may determine L2 in another manner.

Further optionally, determining the second decoding parameter based on $N_{avbit}$ includes: determining, based on a preset correspondence between an encoded bit and a code length, an encoding code length included in the second encoding parameter. In an example, the preset correspondence between an encoded bit and a code length is shown in Table 1. The receive end may alternatively determine the second decoding parameter (corresponding to the second encoding parameter) by querying the table. For Table 1, refer to Embodiment 5, and details are not described herein again.

In the foregoing method, a scrambler operation is not considered. If a descrambling operation performed by the receive end is before the decoding operation, the A-MPDU construction manner further optionally includes: Different periodic scrambling sequences are used for the first A-MPDU subframe (including the retransmitted MPDU) and the second A-MPDU subframe (including a newly transmitted MPDU).

The first A-MPDU subframe uses a same scrambling sequence as that used to transmit the first A-MPDU last time or that used to transmit the first A-MPDU subframe for the first time, namely, a same periodic scrambler sequence (depending on a scrambler seed). In addition, a first bit or an $n^{th}$ bit of a scrambling sequence for the first A-MPDU (including the retransmitted MPDU) is the same as a first bit or an $n^{th}$ bit of a scrambling sequence that is used to transmit the A-MPDU subframe including the MPDU last time or used to initially transmit the A-MPDU subframe including the MPDU. The second A-MPDU subframe corresponding to the newly transmitted MPDU is scrambled by using another new periodic scrambling sequence. For example, a scrambler seed is generated by using an existing 802.11ac/ax method, a scrambler is the same as that used in 802.11ac/ax, and a periodic 127-bit sequence is generated.

The receive end descrambles the received first A-MPDU subframe by using the scrambling sequence used to transmit the first A-MPDU last time or the scrambling sequence used to transmit the first A-MPDU for the first time. The second A-MPDU subframe is descrambled by using the new periodic scrambling sequence. For example, an existing descrambling method is used. To be specific, a seed obtained by using a received scrambled service field is used to perform descrambling.

In this embodiment of this application, the receive end may determine the length L2 based on information carried in the preamble of the PPDU, to determine the decoding parameter, or may directly determine the decoding parameter based on the L-SIG in the PPDU and internal processing of the receive end. For specific details, refer to the description in Embodiment 5. Details are not described herein again.

The descriptions mentioned in this embodiment are still applicable to another embodiment unless otherwise specified in the another embodiment.

This embodiment of this application provides an A-MPDU (including a retransmitted MPDU and an MPDU transmitted for the first time) construction method. The method is applied to a scenario in which a plurality of MPDUs are aggregated, to implement MPDU retransmission based on an A-MPDU structure, and the method can support retransmission in a WLAN, to further improve stability of a WLAN system.

Embodiment 7 provides a retransmission indication method. The method includes: sending a physical layer protocol data unit PPDU, where the PPDU includes a physical layer preamble and a data field, the data field includes an A-MPDU, the A-MPDU includes at least one retransmitted MPDU and/or at least one non-retransmitted MPDU, and the physical layer preamble includes a plurality of types of retransmission indication information; and correspondingly, the receive end receives the PPDU, and parses the PPDU based on the plurality of types of retransmission indication information.

Optionally, the preamble of the PPDU includes an MPDU retransmission indication, used to indicate whether the PPDU includes a retransmitted MPDU. There may be one or more retransmitted MPDUs herein. For example, a first value of the MPDU retransmission indication is used to indicate that the PPDU includes a retransmitted MPDU, and a second value of the MPDU retransmission indication is used to indicate that the PPDU excludes a retransmitted PPDU. The MPDU that needs to be retransmitted may be an MPDU that is unsuccessfully received during previous transmission, and is used for HARQ transmission. The receive end performs combined decoding or joint decoding on LLRs of the retransmitted MPDU and a corresponding MPDU that fails last time. The non-retransmitted MPDU (or referred to as an initially transmitted MPDU) may be an MPDU successfully received during the previous transmission, and further includes a retransmitted MPDU used for ARQ transmission. Although the MPDU is retransmitted, the receive end does not need to perform corresponding HARQ receiving processing on the retransmitted MPDU. Optionally, the receive end that receives the retransmission indication may determine whether combined decoding or joint decoding needs to be performed on HARQ LLRs of the retransmitted MPDU in the current PPDU and a corresponding MPDU that is incorrectly received previously.

Optionally, the preamble of the PPDU includes a modulation and coding scheme indication. The modulation and coding scheme indication is a special value, and the special value is used to indicate that the PPDU includes only a retransmitted MPDU. Herein, there may be one or more retransmitted MPDUs. If all MPDUs included in the A-MPDU are retransmitted MPDUs, a special modulation and coding scheme for data may be used in the physical layer preamble for indication. The special modulation and coding scheme indication is a special value, for example, an unused or undefined value. Currently, in 802.11ax, a modulation and coding scheme is represented by 4 bits. Currently, modulation and coding schemes 0 to 11 are used, and modulation and coding schemes 12 to 15 are not used. Therefore, the special value may be 12 to 15.

Optionally, the preamble of the PPDU includes a retransmitted-MPDU length indication, used to indicate a total length of A-MPDU subframes including retransmitted MPDU in the PPDU. The total length is in a unit of byte. Alternatively, the length indicates total duration of the A-MPDU subframes including retransmitted MPDUs.

Optionally, the preamble of the PPDU includes a scrambler seed indication, used to indicate a scrambler seed used to scramble the retransmitted MPDU.

The A-MPDU subframe corresponding to the retransmitted MPDU needs to be placed at a preset location in the A-MPDU, for example, a start location, a middle location, or an end location. The A-MPDU may include one or more of a management frame, a control frame, and a data frame. Therefore, if only the data frame supports HARQ transmission, the retransmitted MPDU can be placed only at preset locations of all data frames or before all other A-MPDU subframes, for example, the start location, the middle location, or the end location. The preset location may be specified in a protocol, specified by an AP, or determined by the AP and a STA through negotiation. In another implementation, the A-MPDU subframe corresponding to the retransmitted MPDU is placed after the preamble of the existing PPDU and before a service field. Note: Fields included before and after the existing PPDU sequentially include the physical layer preamble, the service field, and the A-MPDU, and optionally further include a physical layer padding bit and a packet extension.

It should be noted that the solution in Embodiment 7 may be used as an independent embodiment, or may be applied to the solutions in Embodiment 1 to Embodiment 6, or may be combined with another implementation.

The retransmission indication method provided in this embodiment of this application may be applied to a scenario in which a plurality of MPDUs are aggregated, to implement MPDU retransmission based on an A-MPDU structure, and the method can support retransmission in a WLAN, to further improve stability of a WLAN system.

Next, in Embodiment 8 of this application, an MPDU retransmission method in this embodiment of this application is described by using an example in which an MPDU that needs to be retransmitted is an MPDU that is unsuccessfully received by a receive end, and channel encoding is performed by using an LDPC code. In an A-MPDU, an additional MPDU delimiter and a possible padding byte are required to form an A-MPDU subframe before an MPDU is sent. For ease of description, the following does not distinguish an MPDU from an A-MPDU subframe corresponding to the MPDU, and it may be understood that the MPDU and the A-MPDU subframe are the same.

In a first process, a transmit end first performs channel encoding on the A-MPDU and then scrambles the A-MPDU:

1. Channel encoding is first performed on the A-MPDU and then the A-MPDU is scrambled. Each time the A-MPDU is transmitted, a different scrambling sequence may be used.

2. An aggregated data packet A-MPDU is sent, where the A-MPDU includes one or more MPDUs. The A-MPDU is assembled at a MAC layer, and then the A-MPDU is transferred to a PHY physical layer. The physical side performs operations such as encoding, scrambling, and constellation point mapping on the A-MPDU, then adds a physical layer preamble (where the physical layer preamble usually includes a Non-HT (non-high throughput) (legacy) preamble and a next-generation physical layer preamble) to form a PPDU, and then send the PPDU. A process of assembling the PPDU is not described in detail. The present disclosure mainly focuses on a case of a plurality of MPDUs, but is also applicable to a case of one MPDU. In addition, an aggregated data packet sent by a station may be transmitted in single-user (Single-User, SU) mode, or may be sent in multi-user (Multi-User, MU) mode. The multi-user mode is further classified into an OFDMA mode, a MU-MIMO mode, or a hybrid mode of OFDMA and MU-MIMO.

3. An acknowledgment feedback sent by the station STA is received, where the acknowledgment feedback is used to notify the transmit end of which MPDU in the A-MPDU transmitted this time needs to be incorrectly received, and the transmit end determines, based on an acknowledgment feedback frame and a sending status of the transmit end, which MPDU needs to be retransmitted.

An acknowledgment feedback method is not limited in the present invention. The station may use a negative acknowledgment (NACK), or a bitmap in a block acknowledgment (Block Ack), or a bitmap in a Multi-STA Block Ack to notify the transmit end of which MPDU is not received, but a legacy preamble corresponding to the MPDU is correctly received, or information that can identify the transmit end and the receive end of the MPDU is correctly received. In other words, the transmit end is notified of an MPDU that can be retransmitted according to a HARQ rule. The NACK may be a single frame or a part of the Multi-STA Block Ack. Different from the current two reply manners: an acknowledgment frame and no reply, the NACK notifies the transmit end that all MPDUs sent this time are incorrectly received, where there may be one or more MPDUs that are incorrectly received, but a physical layer preamble corresponding to the MPDUs is correctly received, or information that can identify the transmit end and the receive end of all the MPDUs transmitted this time is correctly received.

4. For a to-be-retransmitted MPDU or consecutive to-be-retransmitted MPDUs, all related encoded LDPC codewords corresponding to last transmission of the MPDU or the MPDUs are found, including an LDPC codeword whose head and tail span the retransmitted MPDU or the consecutive retransmitted MPDUs and adjacent one or more correctly received MPDUs. The consecutive to-be-retransmitted MPDUs are adjacent MPDUs that are incorrectly transmitted in previous A-MPDU transmission or MPDUs having adjacent sequence numbers (Sequence Numbers) (either is available, the former one is preferred, and the former one is used as an example below). For example, an A-MPDU transmitted last time includes an MPDU 1, an MPDU 2, an MPDU 4, and an MPDU 5, the MPDU 2 and the MPDU 4 are incorrect, and other MPDUs are correctly received. In this case, the MPDU 2 and the MPDU 4 may be referred to as consecutive to-be-retransmitted MPDUs.

(1) For HARQ CC, a correctly received information bit in the LDPC codeword corresponding to the to-be-retransmitted MPDUs or the consecutive to-be-retransmitted MPDUs is punctured, that is, deleted. It should be noted that, how to obtain the LDPC codeword corresponding to the to-be-retransmitted MPDU or the consecutive to-be-retransmitted MPDUs is not limited in the present disclosure. The LDPC codeword may be previously stored, or may be regenerated through LDPC encoding based on a same parameter used for a stored incorrect MPDU.

(2) For HARQ IR, a new check bit is generated for an information bit included in the LDPC codeword corresponding to the to-be-retransmitted MPDU or the consecutive to-be-retransmitted MPDUs. The check bit and the corresponding information bit are combined to form a new LDPC codeword. Generally, an information bit set (including a bit quantity and corresponding bits) included in a new LDPC codeword is the same as an information bit set included in an LDPC codeword incorrectly transmitted last time. In other words, an initially transmitted LDPC codeword and a retransmitted LDPC codeword are generated by using a same mother LDPC codebook, that is, information bits included in the initially transmitted LDPC codeword and the retransmitted LDPC codeword are the same. Check bits are different subsets of check bits of the mother LDPC codeword (the different subsets may overlap).

A correctly received information bit that is included in the new LDPC codeword is punctured. Some or all information bits that are included in the LDPC and that are incorrectly received may be punctured. This depends on a codebook design in HARQ IR, and is not limited in the present disclosure. It should be understood that not all LDPC codewords include a correctly received information bit. It may be learned through observation that only an LDPC codeword that spans the retransmitted MPDU or the consecutive retransmitted MPDUs and one or more adjacent correctly received MPDUs includes the correctly received information bit.

5. Scrambling, constellation point mapping, and the like are performed on encoded bits of the retransmitted MPDU, where other baseband and radio frequency operations remain unchanged; and the retransmitted MPDU is sent.

For example, in the previously transmitted A-MPDU, as shown in FIG. 5a, the MPDU 2 and the MPDU 3 are incorrectly sent. When encoded bits of the MPDU 2 and the MPDU 3 are sent during retransmission, LDPC codewords 3 to 7 need to be retransmitted, but a correctly received information bit of the LDPC codeword 3 and a correctly received information bit of the LDPC codeword 7 need to be punctured, as shown in a gray part in FIG. 5b.

For another example, in initial A-MPDU transmission, as shown in FIG. 5a, the MPDU 2 and the MPDU 4 are incorrectly sent. When encoded bits of the MPDU 2 and the MPDU 4 are sent during retransmission, LDPC codewords 3 to 5 and LDPC codewords 7 to 9 need to be retransmitted, but correctly received information bits of the LDPC codeword 3, the LDPC codeword 5, the LDPC codeword 7, and the LDPC codeword 9 need to be punctured, as shown in gray and light gray parts in FIG. 8c. In another implementation, to simplify processing by the receive end, it is unnecessary to check whether LDPC encoded bits of each MPDU include a correct information bit. In a simple manner, only correct information bits included in LDPC encoded bits of the first and last MPDUs are punctured. For example, correctly received information bits (gray) of the LDPC codeword 3 and the LDPC codeword 9 need to be punctured, and correctly received information bits (light gray) of the LDPC codeword 5 and the LDPC codeword 7 are not punctured.

To support HARQ transmission, indication information indicating whether to include a retransmitted MPDU needs to be added to the physical layer preamble of the PPDU. The indication information of the retransmitted MPDU indicates the receive end whether combined decoding or joint decoding needs to be performed on HARQ LLRs of the retransmitted MPDU in the current PPDU and a corresponding MPDU that is incorrectly received last time.

If all MPDUs included in the A-MPDU are retransmitted MPDUs, a special modulation and coding scheme for data needs to be used in the physical layer preamble for indication. The special modulation and coding scheme indication is an unused value. Currently, in 802.11ax, a modulation and coding scheme is represented by 4 bits. Currently, modulation and coding schemes 0 to 11 are used, and modulation and coding schemes 12 to 15 are not used.

For the A-MPDU including the retransmitted MPDU, the physical layer preamble needs to indicate a total length, in a unit of byte, of an A-MPDU subframe including the retransmitted MPDU, or a duration of the A-MPDU subframe.

The retransmitted MPDU needs to be placed at a preset location in the A-MPDU, for example, a start location, a middle location, or an end location. The A-MPDU may include one or more of a management frame, a control frame, and a data frame. Therefore, if only the data frame supports HARQ transmission, the retransmitted MPDU can be placed only at preset locations of all data frames, for example, the start location, the middle location, or the end location. The preset location may be specified in a protocol, specified by an AP, or determined by the AP and the STA through negotiation.

At the receive end, the following steps are performed.

1. Constellation point demapping, descrambling, and decoding are performed on a received data packet once. Other radio frequency and baseband operations that are not mentioned remain unchanged. The decoding operation is discussed in detail below.

2. Acknowledgment feedback is performed on each MPDU in an A-MPDU in a received PPDU that excludes retransmitted-MPDU indication information, including manners such as no reply, a NACK, an ACK, a Block ACK, and a Multi-STA Block Ack.

3. For an A-MPDU in a received PPDU that includes the retransmitted-MPDU indication information, combined decoding or joint decoding needs to be performed on an LLR of an LDPC codeword of a retransmitted MPDU and an LLR of an LDPC codeword of an MPDU that is incorrectly received last time.

For HARQ CC, the station performs combined decoding on the LLR of the LDPC codeword of the retransmitted MPDU and the LLR of the LDPC codeword of the MPDU that is incorrectly received last time. For HARQ IR, the station performs combined decoding on the LLR of the LDPC codeword of the retransmitted MPDU and the LLR of the LDPC codeword of the MPDU that is incorrectly received last time.

For an LDPC codeword that spans a correct MPDU and an incorrect MPDU, the station needs to supplement a correctly received information bit, in the LDPC, that is punctured by the transmit end, and then perform decoding.

Finally, acknowledgment feedback is performed on each MPDU in the A-MPDU in the PPDU, including the manners such as no reply, a NACK, an ACK, a Block ACK, and a Multi-STA Block Ack.

In a second process, the transmit end first scrambles the A-MPDU and then performs channel encoding on the A-MPDU:

1. An existing sequence of channel encoding and scrambling operations is maintained, that is, the transmit end first performs scrambling, and then performs channel encoding.

2. An aggregated data packet A-MPDU is sent, where the A-MPDU includes one or more MPDUs. The A-MPDU is assembled at a MAC layer, and then the A-MPDU is transferred to a PHY physical layer. The physical side performs operations such as scrambling, encoding, and constellation point mapping on the A-MPDU, then adds a physical layer preamble (where the physical layer preamble usually includes aNon-HT (non-high throughput) (legacy) preamble and a next-generation physical layer preamble) to form a PPDU, and then send the PPDU. A process of assembling the PPDU is not described in detail. The present disclosure mainly focuses on a case of a plurality of MPDUs, but is also applicable to a case of one MPDU. In addition, an aggregated data packet sent by a station may be transmitted in single-user (Single-User, SU) mode, or may be sent in multi-user (Multi-User, MU) mode. The multi-user mode is further classified into an OFDMA mode, a MU-MIMO mode, or a hybrid mode of OFDMA and MU-MIMO.

3a. An acknowledgment feedback sent by the station STA is received, where the acknowledgment feedback is used to notify the transmit end of which MPDU in the A-MPDU transmitted this time needs to be incorrectly received, and the transmit end determines, based on an acknowledgment feedback frame and a sending status of the transmit end, which MPDU needs to be retransmitted.

An acknowledgment feedback method is not limited in the present disclosure. The station may use a negative acknowledgment (NACK), or a bitmap in a block acknowledgment (Block Ack), or a bitmap in a Multi-STA Block Ack to notify the transmit end of which MPDU is not received, but a legacy preamble corresponding to the MPDU is correctly received, or information that can identify the transmit end and the receive end of the MPDU is correctly received. In other words, the transmit end is notified of an MPDU that can be retransmitted according to a HARQ rule. The NACK may be a single frame or a part of the Multi-STA Block Ack. Different from the current two reply manners: an acknowledgment frame and no reply, the NACK notifies the transmit end that all MPDUs sent this time are incorrectly received, where there may be one or more MPDUs that are incorrectly received, but a physical layer preamble corresponding to the MPDUs is correctly received, or information that can identify the transmit end and the receive end of all the MPDUs transmitted this time is correctly received.

3b. The sent A-MPDU is scrambled, and the retransmitted MPDU and a newly transmitted MPDU may use different periodic scrambling sequences, that is, correspond to different scrambler seeds.

The to-be-retransmitted MPDU is scrambled by using a same scrambling sequence as that used to transmit the MPDU last time or that used to initially transmit the MPDU, that is, by using a periodic scrambler sequence generated by a same scrambler seed. In addition, a first bit or an $n^{th}$ bit of a scrambling sequence for the retransmitted MPDU is the same as a first bit or an $n^{th}$ bit of the same scrambling sequence used to transmit the MPDU last time or used to initially transmit the MPDU.

A periodic scrambler sequence generated by a same scrambler seed is used for the newly transmitted MPDU. The scrambler seed may be randomly generated, or may be generated according to a specific rule.

4. For a to-be-retransmitted MPDU or consecutive to-be-retransmitted MPDUs, all related encoded LDPC codewords corresponding to last transmission of the MPDU or the MPDUs are found, including an LDPC codeword whose head and tail span the retransmitted MPDU or the consecutive retransmitted MPDUs and adjacent one or more correctly received MPDUs. The consecutive to-be-retransmitted MPDUs are adjacent MPDUs that are incorrectly transmitted in previous A-MPDU transmission or MPDUs having adjacent sequence numbers (Sequence Numbers) (either is available, the former one is preferred, and the former one is used as an example below). For example, an A-MPDU transmitted last time includes an MPDU 1, an MPDU 2, an MPDU 4, and an MPDU 5, the MPDU 2 and the MPDU 4 are incorrect, and other MPDUs are correctly received. In this case, the MPDU 2 and the MPDU 4 may be referred to as consecutive to-be-retransmitted MPDUs.

(1) For HARQ CC, a correctly received scrambled information bit in the LDPC codeword corresponding to the to-be-retransmitted MPDUs or the consecutive to-be-retransmitted MPDUs is punctured, that is, deleted. It should be noted that, how to obtain the LDPC codeword corresponding to the to-be-retransmitted MPDU or the consecutive to-be-retransmitted MPDUs is not limited in the present disclosure. The LDPC codeword may be previously stored, or may be regenerated through LDPC encoding based on a same parameter used for a stored incorrect MPDU.

(2) For HARQ IR, a new check bit is generated for a scrambled information bit included in the LDPC codeword corresponding to the to-be-retransmitted MPDU or the consecutive to-be-retransmitted MPDUs. The check bit and the corresponding scrambled information bit are combined to form a new LDPC codeword. Generally, a scrambled information bit set (including a bit quantity and corresponding bits) included in a new LDPC codeword is the same as a scrambled information bit set included in an LDPC codeword incorrectly transmitted last time (because a same scrambling sequence as that used to transmit the MPDU last time is used, it is ensured that the scrambled information bit sets are the same). In other words, an initially transmitted LDPC codeword and a retransmitted LDPC codeword are generated by using a same mother LDPC codebook, that is, scrambled information bits included in the initially transmitted LDPC codeword and the retransmitted LDPC codeword are the same. Check bits are different subsets of check bits of the mother LDPC codeword (the different subsets may overlap).

A correctly received scrambled information bit that is included in the new LDPC codeword is punctured. Some or all scrambled information bits that are included in the LDPC and that are incorrectly received may be punctured. This depends on a codebook design in HARQ IR, and is not limited in the present disclosure.

Note: Not all LDPC codewords include correctly a received scrambled information bit. It may be learned through observation that only an LDPC codeword that spans the retransmitted MPDU or the consecutive retransmitted MPDUs and one or more adjacent correctly received MPDUs includes the correctly received scrambled information bit.

5. The codeword of the retransmitted MPDU is sent, and other baseband and radio frequency operations remain unchanged.

For example, in initial A-MPDU transmission, as shown in FIG. 8a, the MPDU 2 and the MPDU 3 are incorrectly sent. When encoded bits of the MPDU 2 and the MPDU 3 are sent during retransmission, LDPC codewords 3 to 7 need to be retransmitted, but a correctly received scrambled information bit of the LDPC codeword 3 and a correctly received scrambled information bit of the LDPC codeword 7 need to be punctured, as shown in a gray part in FIG. 8b.

For another example, in initial A-MPDU transmission, as shown in FIG. 8a, the MPDU 2 and the MPDU 4 are incorrectly sent. When encoded bits of the MPDU 2 and the MPDU 4 are sent during retransmission, LDPC codewords 3 to 5 and LDPC codewords 7 to 9 need to be retransmitted, but correctly received scrambled information bits of the LDPC codeword 3, the LDPC codeword 5, the LDPC codeword 7, and the LDPC codeword 9 need to be punctured, as shown in gray and light gray parts in FIG. 8c. In another implementation, to simplify processing by the receive end, it is unnecessary to check whether LDPC encoded bits of each MPDU include a correct scrambled information bit. In a simple manner, only correct scrambled information bits included in LDPC encoded bits of the first and last MPDUs are punctured. For example, correctly received scrambled information bits (gray) of the LDPC codeword 3 and the LDPC codeword 9 need to be punctured, as shown in a gray part in FIG. 8c, and correctly received scrambled information bits (light gray) of the LDPC codeword 5 and the LDPC codeword 7 are not punctured, as shown in a light gray part in FIG. 8c.

To support HARQ transmission, indication information indicating whether to include a retransmitted MPDU needs to be added to the physical layer preamble of the PPDU. The indication information of the retransmitted MPDU indicates the receive end whether combined decoding or joint decoding needs to be performed on HARQ LLRs of the retransmitted MPDU in the current PPDU and a corresponding MPDU that is incorrectly received last time.

If all MPDUs included in the A-MPDU are retransmitted MPDUs, a special modulation and coding scheme for data needs to be used in the physical layer preamble for indication. The special modulation and coding scheme indication is an unused value. Currently, in 802.11ax, a modulation and coding scheme is represented by 4 bits. Currently, modulation and coding schemes 0 to 11 are used, and modulation and coding schemes 12 to 15 are not used.

For the A-MPDU including the retransmitted MPDU, the physical layer preamble needs to indicate a total length, in a unit of byte, of an A-MPDU subframe including the retransmitted MPDU, or a duration of the A-MPDU subframe. Alternatively, for all A-MPDUs, the physical layer preamble needs to indicate a total length, in a unit of byte, of an A-MPDU subframe including the retransmitted MPDU, or a duration of the A-MPDU subframe. The length or duration being 0 indicates that the A-MPDU excludes a retransmitted MPDU.

The retransmitted MPDU needs to be placed at a preset location in the A-MPDU, for example, a start location, a middle location, or an end location. The A-MPDU may include one or more of a management frame, a control frame, and a data frame. Therefore, if only the data frame supports HARQ transmission, the retransmitted MPDU can be placed only at preset locations of all data frames, for example, the start location, the middle location, or the end location. The preset location may be specified in a protocol, specified by an AP, or determined by the AP and the STA through negotiation.

At the receive end, the following steps are performed.

1. Constellation point demapping, descrambling, and decoding are performed on the received data packet once. Other radio frequency and baseband operations that are not mentioned remain unchanged. The decoding operation is discussed in detail below.

2. Acknowledgment feedback is performed on each MPDU in an A-MPDU in a received PPDU that excludes retransmitted-MPDU indication information, including manners such as no reply, a NACK, an ACK, a Block ACK, and a Multi-STA Block Ack.

3. For an A-MPDU in a received PPDU that includes the retransmitted-MPDU indication information, combined decoding or joint decoding needs to be performed on an LLR of an LDPC codeword of a retransmitted MPDU and an LLR of an LDPC codeword of an MPDU that is incorrectly received last time.

For HARQ CC, the station performs combined decoding on the LLR of the LDPC codeword of the retransmitted MPDU and the LLR of the LDPC codeword of the MPDU that is incorrectly received last time. For HARQ IR, the station performs combined decoding on the LLR of the LDPC codeword of the retransmitted MPDU and the LLR of the LDPC codeword of the MPDU that is incorrectly received last time.

For an LDPC codeword that spans a correct MPDU and an incorrect MPDU, the station needs to supplement a correctly received scrambled information bit, in the LDPC, that is punctured by the transmit end, and then perform decoding.

4. A scrambled information bit obtained after decoding is descrambled. The retransmitted MPDU is descrambled by using a scrambling sequence that is used to transmit the MPDU last time or used to transmit the MPDU for the first time. The newly transmitted MPDU is descrambled by using another periodic scrambling sequence. A scrambler seed for generating the another periodic scrambling sequence may be indicated by using the physical layer preamble, including being indicated by several bits of a random field of the physical layer preamble, such as a CRC, but at the same time, bits in the scrambler seed are not all 0. For example, 1 bit is fixed to 1. Alternatively, the scrambler seed may be obtained by using an all-zero service field or a scrambled all-zero service field of 802.11a/g/n/ac/ax.

Finally, acknowledgment feedback is performed on each MPDU in the A-MPDU in the PPDU, including the manners such as no reply, a NACK, an ACK, a Block ACK, and a Multi-STA Block Ack.

In this embodiment, the to-be-retransmitted MPDU may alternatively be scrambled by using a scrambling sequence different from that used to transmit the MPDU last time or that used to initially transmit the MPDU, or using the same periodic scrambling sequence as that used to transmit the newly transmitted MPDU. In this case, the transmit end needs to notify the receive end of a scrambler seed (corresponding to the periodic scrambling sequence) used for the A-MPDU including the retransmitted MPDU. The scrambler seed may be indicated by using the physical layer preamble, including being indicated by several bits of a random field of the physical layer preamble, for example, a CRC, but at the same time, bits in the scrambler seed are not all 0. For example, 1 bit is fixed to 1. Alternatively, the receive end is notified of the scrambler seed in a manner agreed upon by both parties, for example, by using a scrambler seed function transmitted last time. For example, the scrambler seed is obtained by adding 1 to a previous scrambler seed.

The receive end needs to compare whether a bit obtained after the retransmitted MPDU that is scrambled by using the new scrambling sequence is encoded is the same as a bit obtained after the MPDU that is transmitted last time and that is scrambled by using the old scrambling sequence is encoded. If an $n^{th}$ bit is the same, an LLR of the $n^{th}$ bit in encoded bits used to transmit the MPDU last time is not changed. If the $n^{th}$ bit is different, an LLR of the encoded bits used to transmit the MPDU last time is multiplied by −1, where n=1 . . . N, and N is a code length. Then, combined decoding or joint decoding is performed on an LLR of encoded bits of the retransmitted MPDU and the LLR of the encoded bits of the MPDU transmitted last time. Finally, decoded bits are descrambled, and a scrambler seed used for descrambling is the scrambler seed for the retransmitted MPDU. Certainly, the method may alternatively be used to adjust a sign of the LLR of the encoded bits of the retransmitted MPDU instead of adjusting a sign of the LLR of the encoded bits of the MPDU transmitted last time. In this case, the scrambler seed used for descrambling is the scrambler seed used to transmit the MPDU last time. The descriptions mentioned in this embodiment are still applicable to another embodiment unless otherwise specified in the another embodiment.

Figure 13:
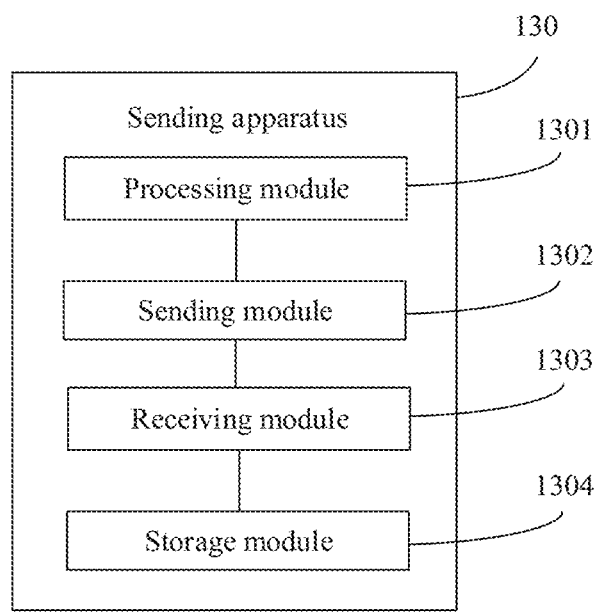
FIG. 13 is a schematic diagram of a structure of a sending apparatus according to an embodiment of this application.

FIG. 13 is a schematic diagram of a structure of a sending apparatus according to an embodiment of this application. The sending apparatus may be used for the transmit end or a chip in the transmit end according to any one of Embodiment 1, Embodiment 3, Embodiment 5, or Embodiment 7. The sending apparatus 130 includes a processing module 1301, a sending module 1302, and a receiving module 1303.

In an implementation, the sending apparatus may be configured to perform any function of the transmit end in Embodiment 1. An example is as follows:

The processing module 1301 is configured to determine at least one first MPDU that needs to be retransmitted in a previously transmitted A-MPDU. The at least one first MPDU is included in at least one first A-MPDU subframe. After being encoded, the first A-MPDU subframe includes at least one previously transmitted LDPC codeword. The at least one previously transmitted LDPC codeword includes a first LDPC codeword, and information bits of the first LDPC codeword include a first information bit set in the first A-MPDU subframe and a second information bit set that is excluded in the first A-MPDU subframe. The processing module 1301 is further configured to: determine a second LDPC codeword based on the information bits of the first LDPC, puncture the second information bit set of the second LDPC codeword, generate the at least one previously transmitted LDPC codeword, and generate at least one retransmitted LDPC codeword.

The sending module 1302 is configured to send an A-MPDU. The A-MPDU includes at least one A-MPDU subframe, the at least one A-MPDU subframe includes at least one first A-MPDU subframe, and the first A-MPDU subframe includes one first MPDU. The sending module 1302 is further configured to send at least one retransmitted LDPC codeword obtained after the at least one first A-MPDU subframe is encoded. The at least one retransmitted LDPC codeword includes a punctured codeword. The punctured codeword is all or some of encoded bits obtained after the second information bit set in the second LDPC codeword is punctured, and the second LDPC codeword is determined based on the information bits of the first LDPC codeword. For example, the sending module 1302 is configured to perform S101 or S104.

The receiving module 1303 is configured to receive acknowledgment feedback information. The acknowledgment feedback information is used to indicate which MPDU in the A-MPDU is unsuccessfully received. For example, the receiving module 1303 is configured to perform S104.

Optionally, a storage module 1304 may further be included.

In another embodiment, the sending apparatus may be configured to perform any function of the transmit end in Embodiment 3. An example is as follows:

The processing module 1301 is configured to determine at least one first MPDU that needs to be retransmitted in a previously transmitted A-MPDU. The at least one first MPDU is included in at least one first A-MPDU subframe. After being scrambled and encoded, the first A-MPDU subframe includes at least one previously transmitted LDPC codeword. The at least one previously transmitted LDPC codeword includes a first LDPC codeword, and information bits of the first LDPC codeword include information bits obtained after a first information bit set in the first A-MPDU subframe and a second information bit set excluded in the first A-MPDU subframe are scrambled. For example, the processing module 1301 is configured to perform S303. The processing module 1301 is further configured to: determine a second LDPC codeword based on the information bits of the first LDPC, puncture a scrambled second information bit set of the second LDPC codeword, and first scramble and then encode the first A-MPDU subframe to obtain the first LDPC codeword or the second LDPC codeword.

The sending module 1302 is configured to send an A-MPDU. The A-MPDU includes at least one A-MPDU subframe, and one first A-MPDU subframe includes one first MPDU. The sending module 1302 is further configured to send at least one retransmitted LDPC codeword obtained after the at least one first A-MPDU subframe is scrambled and encoded. The at least one retransmitted LDPC codeword includes a punctured codeword. The punctured codeword is all or some of encoded bits obtained after the scrambled second information bit set in the second LDPC codeword is punctured. The second LDPC codeword is determined based on the information bits of the first LDPC codeword. For example, the sending module 1302 is configured to perform S301 or S304.

The receiving module 1303 is configured to receive acknowledgment feedback information. The acknowledgment feedback information is used to indicate which MPDU in the A-MPDU is unsuccessfully received. For example, the receiving module 1303 is configured to perform S304.

In another embodiment, the sending apparatus may be configured to perform any function of the transmit end in Embodiment 5. An example is as follows:

The processing module 1301 is configured to generate an aggregate media access control protocol data unit A-MPDU. The A-MPDU includes at least one first A-MPDU subframe and at least one second A-MPDU subframe. One first A-MPDU subframe includes one first-type MPDU, and one second A-MPDU subframe includes one second-type MPDU. For example, the processing module 1301 is configured to perform S501. The processing module 1301 is further configured to determine a first encoding parameter based on an encoding parameter of the previously transmitted first A-MPDU subframe, and determine a second encoding parameter based on a second length L2. For example, the processing module 1301 is configured to perform S502. The processing module 1301 is further configured to encode and encapsulate the at least one first A-MPDU subframe and the at least one second A-MPDU subframe into a data field of a physical layer protocol data unit PPDU by separately using the first encoding parameter and the second encoding parameter. The processing module 1301 is further configured to: determine a second LDPC codeword based on information bits of a first LDPC, puncture a scrambled second information bit set of the second LDPC codeword, and first scramble and then encode the first A-MPDU subframe to obtain the first LDPC codeword or the second LDPC codeword.

The sending module 1302 is configured to send the at least one first A-MPDU subframe. One first A-MPDU subframe includes a first-type MPDU, and the first A-MPDU subframe is encoded by using a previous-transmission encoding parameter to be encapsulated into a previously transmitted PPDU. For example, the sending module 1302 is configured to perform S500. The sending module 1302 is further configured to send at least one retransmitted LDPC codeword obtained after the at least one first A-MPDU subframe is scrambled and encoded. The at least one retransmitted LDPC codeword includes a punctured codeword. The punctured codeword is all or some of encoded bits obtained after the scrambled second information bit set in the second LDPC codeword is punctured. The second LDPC codeword is determined based on the information bits of the first LDPC codeword. For example, the sending module 1302 is configured to perform S301 or S304.

Optionally, the receiving module 1303 is configured to receive acknowledgment feedback information. The acknowledgment feedback information is used to indicate which MPDU in the A-MPDU is unsuccessfully received.

In another embodiment, the sending apparatus may be configured to perform any function of the transmit end in Embodiment 7.

The processing module 1301 is configured to generate a physical layer protocol data unit PPDU. The PPDU includes a physical layer preamble and a data field. The data field includes an A-MPDU, and the A-MPDU includes at least one retransmitted MPDU and at least one non-retransmitted MPDU. The physical layer preamble includes a plurality of types of retransmission indication information.

The sending module 1302 is configured to send the physical layer protocol data unit PPDU.

In this embodiment of this application, the data transmission apparatus shown in FIG. 13 is used as an example to describe modules in a data transmission apparatus used for the transmit end. It should be understood that the sending apparatus used for the transmit end in this embodiment of this application has any function of the transmit end in the retransmitted data sending method shown in any one of Embodiment 1, Embodiment 3, Embodiment 5, or Embodiment 7.

Figure 14:
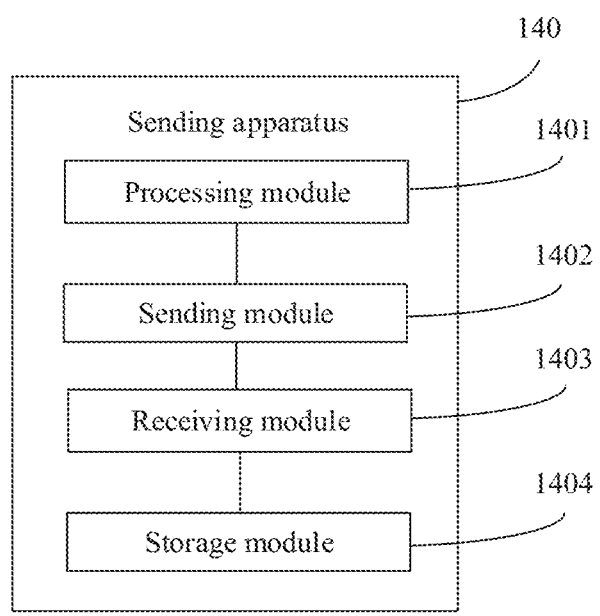
FIG. 14 is a schematic diagram of a structure of a receiving apparatus according to an embodiment of this application.

FIG. 14 is a schematic diagram of a structure of a receiving apparatus 1400 according to an embodiment of this application. The receiving apparatus 1400 may be used for the receive end or a chip in the receive end according to any one of Embodiment 2, Embodiment 4, Embodiment 6, or Embodiment 7. The receiving apparatus 1400 includes a processing module 1401, a sending module 1402, and a receiving module 1403.

In an implementation, the receiving apparatus may be configured to perform any function of the receive end in Embodiment 2. An example is as follows:

The processing module 1401 is configured to determine at least one first MPDU that needs to be retransmitted in a previously transmitted A-MPDU, where the first MPDU is included in a first A-MPDU subframe of the A-MPDU. The processing module 1401 is further configured to perform combined decoding or joint decoding on at least one retransmitted LDPC codeword and at least one previously received previously-transmitted LDPC codeword, to obtain the first A-MPDU subframe. The processing module 1401 is further configured to decode the at least one previously transmitted LDPC codeword, and decode the at least one retransmitted LDPC codeword. For example, the processing module 1302 is configured to perform S205 or S202.

The sending module 1402 is configured to send an acknowledgment feedback frame. The acknowledgment feedback is used to indicate which MPDU in the A-MPDU is unsuccessfully received. For example, the sending module 1402 is configured to perform S203.

The receiving module 1403 is configured to receive an aggregate media access control protocol data unit A-MPDU. The A-MPDU includes at least one A-MPDU subframe, the at least one A-MPDU subframe includes a first A-MPDU subframe, and the first A-MPDU subframe includes one first MPDU. For example, the receiving module 1403 is configured to perform S201. The receiving module 1403 is further configured to receive at least one retransmitted LDPC codeword obtained after the at least one first A-MPDU subframe is encoded. The at least one retransmitted LDPC codeword includes a punctured codeword. The punctured codeword is all or some of encoded bits obtained after a second information bit set in a second LDPC codeword is punctured, and the second LDPC codeword is determined based on information bits of a first LDPC codeword.

Optionally, a storage module 1404 may further be included.

In another embodiment, the sending apparatus may be configured to perform any function of the receive end in Embodiment 4. An example is as follows:

The processing module 1401 is configured to determine at least one first MPDU that needs to be retransmitted in a previously transmitted A-MPDU, where one first MPDU is included in one first A-MPDU subframe of the A-MPDU. The processing module 1401 is further configured to perform combined decoding or joint decoding on at least one retransmitted LDPC codeword and at least one previously received previously-transmitted LDPC codeword, to obtain the first A-MPDU subframe. The processing module 1401 is further configured to descramble the first A-MPDU subframe. Optionally, the processing module 1401 is further configured to determine a decoding parameter and a scrambling sequence. For example, the processing module 1401 is configured to perform S404 or S405.

The sending module 1402 is configured to send an acknowledgment feedback frame. The acknowledgment feedback is used to indicate which MPDU in the A-MPDU is unsuccessfully received. For example, the sending module 1402 is configured to perform S403.

The receiving module 1403 is configured to receive at least one retransmitted LDPC codeword that is obtained after at least one first A-MPDU subframe is scrambled and encoded and that is sent by a transmit end, and is further configured to receive an aggregate media access control protocol data unit A-MPDU. The A-MPDU includes at least one A-MPDU subframe. For example, the receiving module 1403 is configured to perform S404 or S401.

In another embodiment, the sending apparatus may be configured to perform any function of the receive end in Embodiment 6. An example is as follows:

The processing module 1401 is configured to decode a PPDU by separately using a first encoding parameter and a second encoding parameter, to obtain at least one first A-MPDU subframe and at least one second A-MPDU subframe. For example, the processing module 1401 is configured to perform S602.

The receiving module 1403 is configured to receive the physical layer protocol data unit PPDU. A data field of the PPDU includes a first part obtained after the at least one first A-MPDU subframe is encoded by using the first encoding parameter and a second part obtained after the at least one second A-MPDU subframe is encoded by using the second encoding parameter. For example, the receiving module 1403 is configured to perform S601.

Optionally, the sending module 1402 is configured to send acknowledgment feedback information, to indicate which MPDU is unsuccessfully received.

In another embodiment, the sending apparatus may be configured to perform any function of the receive end in Embodiment 7.

The processing module 1401 is configured to parse a physical layer protocol data unit PPDU. The PPDU includes a physical layer preamble and a data field. The data field includes an A-MPDU, and the A-MPDU includes at least one retransmitted MPDU and at least one non-retransmitted MPDU. The physical layer preamble includes a plurality of types of retransmission indication information.

The receiving module 1403 is configured to receive the physical layer protocol data unit PPDU.

In this embodiment of this application, the data transmission apparatus shown in FIG. 14 is used as an example to describe modules in a data transmission apparatus used for the receive end. It should be understood that the receiving apparatus used for the receive end in this embodiment of this application has any function of the receive end in the retransmitted data receiving method in any one of Embodiment 2, Embodiment 4, Embodiment 6, or Embodiment 7.

The sending apparatus (used for the transmit end) or the receiving apparatus (used for the receive end) provided in the embodiments of this application may be implemented in a plurality of product forms. For example, the sending apparatus or the receiving apparatus may be configured as a general processing system. For example, the sending apparatus or the receiving apparatus may be implemented by a general bus architecture. For example, the sending apparatus or the receiving apparatus may be implemented by using an application-specific integrated circuit (application-specific integrated circuit, ASIC). The following provides several possible product forms of the sending apparatus or the receiving apparatus in the embodiments of this application. It should be understood that the following is merely an example, and the possible product forms in the embodiments of this application are not limited thereto.

Figure 15:
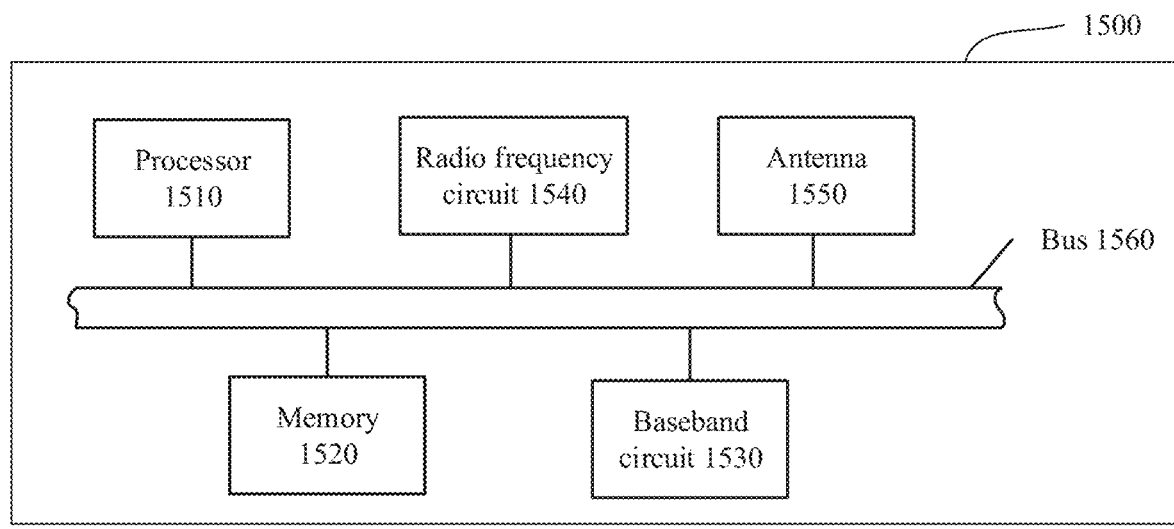
FIG. 15 is a schematic diagram of a structure of another sending apparatus according to an embodiment of this application.

In an example, FIG. 15 is a schematic block diagram of a sending apparatus 1500 according to an embodiment of this application. The apparatus 1500 in this embodiment of this application may be the transmit end in any one of the foregoing method embodiments, or may be one or more chips in the transmit end. The apparatus 1500 may be configured to perform some or all functions of the transmit end in the foregoing method embodiments.

The apparatus 1500 may be configured to perform some or all functions of the transmit end in the foregoing method embodiments. The apparatus 1500 may include a processor 1510, a baseband circuit 1530, a radio frequency circuit 1540, and an antenna 1550. Optionally, the apparatus 1500 may further include a memory 1520. Components of the apparatus 1500 are coupled together through a bus 1560. In addition to a data bus, the bus system 1560 further includes a power bus, a control bus, and a status signal bus. However, for clear description, various types of buses in the figure are marked as the bus system 1560.

The processor 1510 may be configured to control the transmit end, and configured to perform processing performed by the transmit end in the foregoing embodiments. The processor 1510 may perform a processing process related to the transmit end in the foregoing method embodiments and/or configured to perform another process of the technology described in this application. Further, the processor 1510 may run an operating system, be responsible for managing the bus, and execute a program or instructions stored in the memory.

The baseband circuit 1530, the radio frequency circuit 1540, and the antenna 1550 may be configured to support information receiving and sending between the transmit end and the receive end in the foregoing embodiment, to support wireless communication between the transmit end and the receive end.

In an example, at the transmit end, a retransmitted or initially transmitted MPDU is processed by the processor 1510, processed by the baseband circuit 1530 through baseband processing such as scrambling and encoding after being encapsulated into an A-MPDU according to a protocol, further processed by the radio frequency circuit 1540 through radio frequency processing such as analog conversion, filtering, amplification, and up-conversion, and transmitted through the antenna 1550. In another example, acknowledgment feedback information sent by the receive end is received through the antenna 1550, processed by the radio frequency circuit 1540 through filtering, amplification, down-conversion, digitization, and the like, processed by the baseband circuit 1530 through baseband processing such as decoding and protocol-based data decapsulation, and processed by the processor 1510, to recover the acknowledgment feedback information sent by the receive end.

The memory 1520 may be configured to store program code and data of the transmit end, and the memory 1520 may be the storage module 1530 in FIG. 15. It may be understood that the baseband circuit 1530, the radio frequency circuit 1540, and the antenna 1550 may further be configured to support communication between the transmit end and another network entity, for example, communication between the transmit end and a network element on a core network side. As shown in FIG. 15, the memory 1520 is separated from the processor 1510. However, a person skilled in the art easily understands that the memory 1520 or any part thereof may be located outside the channel resource allocation apparatus 1500. For example, the memory 1520 may include a transmission cable and/or a computer product separated from a wireless node. These media may be accessed by the processor 1510 through the bus interface 1560. Alternatively, the memory 1520 or any part thereof may be integrated into the processor 1510. For example, the memory 1520 or any part thereof may be a cache and/or a general-purpose register.

It may be understood that, FIG. 15 shows only a simplified design of the transmit end. For example, in actual application, the transmit end may include any quantity of transmitters, receivers, processors, memories, and the like, and all transmit ends that can implement the present disclosure fall within the protection scope of the present disclosure.

Figure 16:
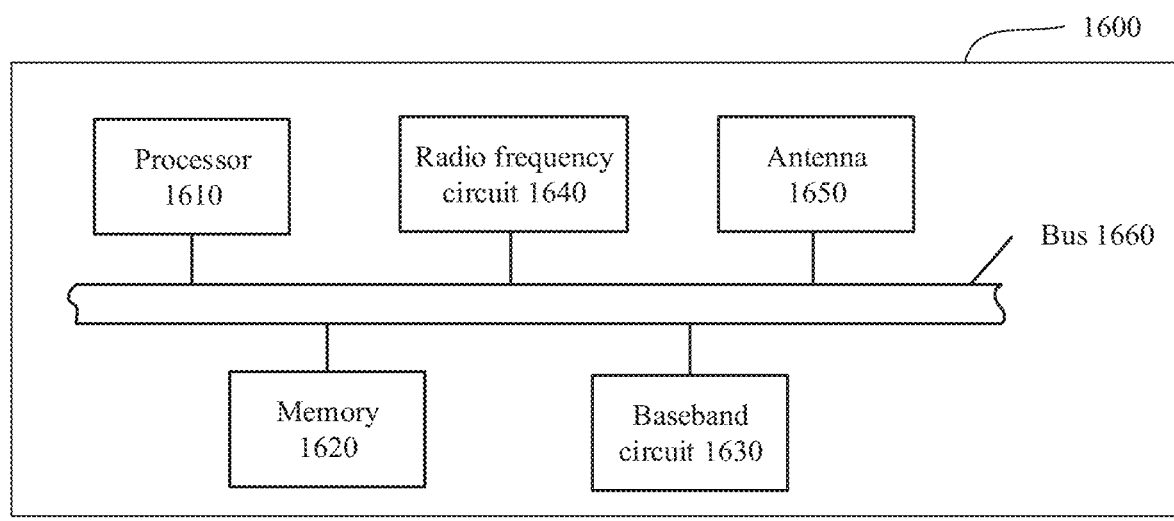
FIG. 16 is a schematic diagram of a structure of another receiving apparatus according to an embodiment of this application.

A schematic structure of the receiving apparatus is described in detail in the embodiments of this application. In an example, FIG. 16 is a schematic block diagram of a receiving apparatus 1600 according to an embodiment of this application. The apparatus 1600 in this embodiment of this application may be the receive end in any one of the foregoing method embodiments, or may be one or more chips in the receive end. The apparatus 1600 may be configured to perform some or all functions of the receive end in the foregoing method embodiments.

The apparatus 1600 may be configured to perform some or all functions of the receive end in any one of the foregoing method embodiments. The apparatus 1600 may include a processor 1610, a baseband circuit 1630, a radio frequency circuit 1640, and an antenna 1650. Optionally, the apparatus 1600 may further include a memory 1620. Components of the apparatus 1600 are coupled together through a bus 1660. In addition to a data bus, the bus system 1660 further includes a power bus, a control bus, and a status signal bus. However, for clear description, various types of buses in the figure are marked as the bus system 1660.

The processor 1610 may be configured to control the receive end, and configured to perform processing performed by the receive end in the foregoing embodiments. The processor 1610 may perform a processing process related to the transmit end in the foregoing method embodiments and/or configured to perform another process of the technology described in this application. Further, the processor 1610 may run an operating system, be responsible for managing the bus, and execute a program or instructions stored in the memory.

The baseband circuit 1630, the radio frequency circuit 1640, and the antenna 1650 may be configured to support information receiving and sending between the receive end and the transmit end in the foregoing embodiment, to support wireless communication between the receive end and the transmit end. In an example, a signal sent by the transmit end is received through the antenna 1650, processed by the radio frequency circuit through filtering, amplification, down-conversion, digitization, and the like, processed by the baseband circuit through baseband processing such as decoding and protocol-based data decapsulation, and processed by the processor 1610, to recover service data and signaling information that are sent by the transmit end. For example, the receive end decodes and decapsulates a received PPDU to obtain an A-MPDU, and then parses the A-MPDU by using the processor to obtain a retransmitted MPDU or an MPDU transmitted for the first time. In another example, acknowledgment feedback information of the receive end may be processed by the processor 1610, processed by the baseband circuit 1630 through baseband processing such as protocol-based encapsulation and encoding, further processed by the radio frequency circuit 1640 through radio frequency processing such as analog conversion, filtering, amplification, and up-conversion, and transmitted through the antenna 1650. The memory 1620 may be configured to store program code and data of the transmit end, and the memory 1620 may be a storage module. It may be understood that the baseband circuit 1630, the radio frequency circuit 1640, and the antenna 1650 may further be configured to support the receive end in communicating with another network entity.

It may be understood that, FIG. 16 shows only a simplified design of the receive end. For example, in actual application, the receive end may include any quantity of transmitters, receivers, processors, memories, and the like, and all receive ends that can implement the present disclosure fall within the protection scope of the present disclosure. The processor in each of the apparatus 1500 and the apparatus 1600 may be a general-purpose processor, for example, a general-purpose central processing unit (CPU), a network processor (Network Processor, NP for short), a microprocessor, or the like; or may be an application-specific integrated circuit (application-specific integrated circuit, ASIC for short), or one or more integrated circuits configured to control program execution in the solution of this application. The processor may also be a digital signal processor (Digital Signal Processor, DSP for short), a field-programmable gate array (Field-Programmable Gate Array, FPGA for short) or another programmable logic device, a discrete gate or a transistor logic device, or a discrete hardware component. Alternatively, a controller/processor may be a combination of processors implementing a computing function, for example, a combination of one or more microprocessors, or a combination of the DSP and the microprocessor. The processor usually performs logical and arithmetic operations according to program instructions stored in the memory.

The memory in each of the apparatus 1500 and the apparatus 1600 may further store an operating system and another application program. Specifically, the program may include program code, and the program code includes computer operation instructions. More specifically, the memory may be a read-only memory (read-only memory, ROM for short), another type of static storage device that can store static information and instructions, a random access memory (random access memory, RAM for short), another type of dynamic storage device that can store information and instructions, or a magnetic disk storage, or the like. The memory may be a combination of the foregoing memories. In addition, the computer-readable storage medium/memory may be located in the processor, or may be located outside the processor, or distributed in a plurality of entities including the processor or a processing circuit. The computer-readable storage medium/memory may be specifically embodied in a computer program product. For example, the computer program product may include a computer-readable medium in a packaging material.

An embodiment of this application further provides a chip system. The chip system includes a processor, configured to support a transmit end or a second receive end in implementing the function in any of the foregoing embodiments, for example, generating or processing data and/or information in the foregoing methods. In a possible design, the chip system may further include a memory. The memory is configured to store program instructions and data that are necessary for the transmit end or the receive end. The chip system may include a chip, or may include a chip and another discrete device.

An embodiment of this application further provides a processor, configured to be coupled to a memory, and configured to perform the method and the function related to the transmit end or the receive end in any one of the foregoing embodiments.

An embodiment of this application further provides a computer program product including instructions. When the computer program product runs on a computer, the computer is enabled to perform the method and the function that are related to the transmit end or the receive end in any one of the foregoing embodiments.

An embodiment of this application further provides an apparatus, configured to perform the method and the function that are related to the receive end or the transmit end in any one of the foregoing embodiments.

An embodiment of this application further provides a wireless communications system. The system includes at least one transmit end and at least one receive end in any one of the foregoing embodiments.

In the several embodiments provided in this application, it should be understood that the disclosed system, apparatus, and method may be implemented in other manners. For example, the described apparatus embodiments are merely an example. For example, division into the units is merely logical function division and may be other division during actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electrical, mechanical, or other forms. As still another possible product form, the data transmission apparatus may alternatively be implemented by using the following: a field programmable gate array (Field Programmable Gate Array, FPGA), a programmable logic device (Programmable Logic Device, PLD), a controller, a state machine, gate logic, a discrete hardware component, any other suitable circuit, or any combination of circuits that can perform various functions described in this application.

All or some of the foregoing embodiments may be implemented by software, hardware, firmware, or any combination thereof. When software is used to implement the embodiments, all or some of the embodiments may be implemented in a form of a computer program product. The computer program product includes one or more computer instructions. When the computer instructions are loaded and executed on a computer, the procedures or functions according to this application are all or partially generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line) or wireless (for example, infrared, radio, or microwave) manner. The computer-readable storage medium may be any usable medium accessible by the computer, or a data storage device, a server or a data center, integrating one or more usable media. The usable medium may be a magnetic medium (for example, a floppy disk, a hard disk, or a magnetic tape), an optical medium (for example, a DVD), a semiconductor medium (for example, a solid state disk (Solid State Disk)), or the like.

What is claimed is:

1. A retransmitted data sending method, applied to a transmit end, and comprising:
    determining a first media access control protocol data unit (MPDU) that needs to be retransmitted in a previously transmitted aggregate media access control protocol data unit (A-MPDU), wherein the first MPDU is comprised in a first A-MPDU subframe of the A-MPDU, wherein
    at least one previously transmitted low density parity check (LDPC) codeword obtained after the first A-MPDU subframe is encoded comprises a first LDPC codeword, and information bits of the first LDPC codeword correspond to a first information bit set comprised in the first A-MPDU subframe and a second information bit set not comprised in the first A-MPDU subframe;
    obtaining a second LDPC codeword based on the information bits of the first LDPC codeword; and
    sending at least one retransmitted LDPC codeword obtained after the first A-MPDU subframe is encoded, wherein the one or more retransmitted LDPC codewords comprise a punctured codeword, and the puncture codeword is all or some of encoded bits obtained after the second information bit set in the second LDPC codeword is punctured.

2. The method according to claim 1, wherein the at least one retransmitted LDPC codeword further comprises at least one unpunctured codeword, and all information bits corresponding to the at least one unpunctured codeword are comprised in the first A-MPDU subframe.

3. The method according to claim 1, wherein that information bits of the first LDPC codeword correspond to the first information bit set in the first A-MPDU subframe and the second information bit set not comprised in the first A-MPDU subframe comprises: the information bits of the first LDPC codeword are one of information bits obtained after the first information bit set and the second information bit set are scrambled by using a scrambling sequence, or information bits of the first LDPC codeword are the first information bit set and the second information bit set.

4. The method according to claim 1, wherein the obtaining a second LDPC codeword based on the information bits of the first LDPC codeword comprises one of:
   obtaining the previously transmitted first LDPC codeword as the second LDPC codeword; or
   encoding the information bits of the first LDPC codeword by using a retransmission parity-check matrix, to obtain the second LDPC codeword, wherein the retransmission parity-check matrix is the same as or has a preset relationship with a parity-check matrix used for the first LDPC codeword.

5. The method according to claim 1, wherein the information bits of the first LDPC codeword comprise the first information bit set and the second information bit set, and the obtaining a second LDPC codeword based on the information bits of the first LDPC codeword comprises:
   scrambling the information bits of the first LDPC codeword by using a retransmission scrambling sequence, to obtain scrambled to-be-encoded bits; and
   encoding the scrambled to-be-encoded information bits by using a retransmission parity-check matrix, to obtain the second LDPC codeword, wherein the retransmission scrambling sequence is the same as a scrambling sequence used to scramble the information bits of the first LDPC codeword, and the retransmission parity-check matrix is the same as or has a preset relationship with a parity-check matrix of the first LDPC codeword.

6. The method according to claim 1, wherein the at least one retransmitted codeword obtained after the first A-MPDU subframe is encoded is carried in a physical layer protocol data unit PPDU; and
   a preamble of the PPDU comprises at least one of the following:
   an MPDU retransmission indication, wherein a first value of the MPDU retransmission indication is used to indicate that the PPDU comprises a retransmitted MPDU;
   a modulation and coding scheme indication, wherein the modulation and coding scheme indication is a special value, and the special value is used to indicate that the PPDU comprises only a retransmitted MPDU;
   a retransmitted-MPDU length indication, used to indicate a total length of an A-MPDU subframe that comprises a retransmitted MPDU in the PPDU; or
   a scrambler seed indication, used to indicate a scrambler seed used to scramble a retransmitted MPDU.

7. A retransmitted data receiving method, applied to a receive end, and comprising:
   determining a first media access control protocol data unit (MPDU) that needs to be retransmitted in a previously transmitted first aggregate media access control protocol data unit (A-MPDU), wherein the first MPDU is comprised in a first A-MPDU subframe of the A-MPDU, wherein
   at least one previously transmitted low density parity check (LDPC) codeword obtained after the first A-MPDU subframe is encoded comprises a first LDPC codeword, and information bits of the first LDPC codeword correspond to a first information bit set comprised in the first A-MPDU subframe and a second information bit set not comprised in the first A-MPDU subframe;
   receiving at least one retransmitted LDPC codeword that is obtained after the first A-MPDU subframe is encoded and that is retransmitted by a transmit end, wherein the at least one retransmitted codeword comprises a punctured codeword, the punctured codeword is all or some of encoded bits obtained after the second information bit set of a second LDPC codeword is punctured, and the second LDPC codeword is generated based on the information bits of the first LDPC codeword; and
   performing one of combined decoding or joint decoding on log-likelihood ratios LLRs of the at least one retransmitted LDPC codeword and the at least one previously received previously-transmitted LDPC codeword, to obtain the first A-MPDU subframe.

8. The method according to claim 7, wherein the at least one retransmitted LDPC codeword further comprises at least one unpunctured codeword, and all information bits corresponding to the at least one unpunctured codeword are comprised in the first A-MPDU subframe.

9. The method according to claim 7, wherein the information bits of the first LDPC codeword correspond to the first information bit set comprised in the first A-MPDU subframe and the second information bit set not comprised in the first A-MPDU subframe, and the performing combined decoding or joint decoding comprises:
   supplementing the second information bit set to the punctured codeword, to obtain the second LDPC codeword; and
   decoding the at least one retransmitted LDPC codeword and the at least one previously received previously-transmitted LDPC codeword by using a retransmission parity-check matrix, to obtain the first A-MPDU subframe, wherein the retransmission parity-check matrix is the same as or has a preset relationship with a parity-check matrix used to decode the previously received previously-transmitted LDPC codeword.

10. The method according to claim 7, wherein the information bits of the first LDPC codeword are information bits obtained after the first information bit set and the second information bit set are scrambled by using a scrambling sequence, and the performing combined decoding or joint decoding comprises:
   supplementing the second information bit set to the punctured codeword, to obtain the second LDPC codeword;
   performing combined or joint decoding on the at least one retransmitted LDPC codeword and the at least one previously received previously-transmitted LDPC codeword by using a retransmission parity-check matrix, to obtain a scrambled first A-MPDU subframe; and
   descrambling the scrambled first A-MPDU subframe by using a retransmission scrambling sequence, to obtain a descrambled first A-MPDU subframe, wherein
   the retransmission parity-check matrix is the same as or has a preset relationship with a parity-check matrix used to decode the previously received first A-MPDU subframe, and the retransmission scrambling sequence is the same as a scrambling sequence used to descramble the previously received scrambled first A-MPDU subframe.

11. The method according to claim 9, wherein the performing combined decoding or joint decoding further comprises: deleting the second information bit set from information bits obtained after the combined decoding or joint decoding, to obtain the first A-MPDU subframe.

12. The method according to claim 7, wherein the at least one corresponding retransmitted codeword obtained after the first A-MPDU is encoded is carried in a physical layer protocol data unit, and a preamble of the PPDU comprises at least one of the following:

an MPDU retransmission indication, wherein a first value of the MPDU retransmission indication is used to indicate that the PPDU comprises a retransmitted MPDU;

a modulation and coding scheme indication, wherein the modulation and coding scheme indication is a special value, and the special value is used to indicate that the PPDU comprises only a retransmitted MPDU;

a retransmitted-MPDU length indication, used to indicate a total length of an A-MPDU subframe that comprises a retransmitted MPDU in the PPDU; or a scrambler seed indication, used to indicate a scrambler seed used to scramble a retransmitted MPDU.

13. A retransmitted data sending apparatus, applied to a transmit end, and comprising:

a processor; and a non-transitory medium storing instructions, that when executed by the processor cause the sending apparatus to perform steps comprising:

determining a first media access control protocol data unit (MPDU) that needs to be retransmitted in a previously transmitted aggregate media access control protocol data unit A-MPDU, wherein the first MPDU is comprised in a first A-MPDU subframe of the A-MPDU, wherein at least one previously transmitted low density parity check (LDPC) codeword obtained after the first A-MPDU subframe is encoded comprises a first LDPC codeword, and information bits of the first LDPC codeword correspond to a first information bit set comprised in the first A-MPDU subframe and a second information bit set not comprised in the first A-MPDU subframe, and obtaining a second LDPC codeword based on the information bits of the first LDPC codeword; and sending at least one retransmitted LDPC codeword obtained after the first A-MPDU subframe is encoded, wherein the at least one retransmitted LDPC codeword comprises a punctured codeword, and the puncture codeword is all or some of encoded bits obtained after the second information bit set in the second LDPC codeword is punctured.

14. The sending apparatus according to claim 13, wherein the at least one retransmitted LDPC codeword further comprises at least one unpunctured codeword, and all information bits corresponding to the at least one unpunctured codeword are comprised in the first A-MPDU subframe.

15. The sending apparatus according to claim 13, wherein that information bits of the first LDPC codeword correspond to a first information bit set in the first A-MPDU subframe and a second information bit set not comprised in the first A-MPDU subframe comprises: the information bits of the first LDPC codeword are one of information bits obtained after the first information bit set and the second information bit set are scrambled by using a scrambling sequence, or the information bits of the first LDPC codeword are the first information bit set and the second information bit set.

16. The sending apparatus according to claim 13, wherein the second LDPC codeword is obtained based on the information bits of the first LDPC codeword and the steps further comprise one of:

encoding the information bits of the first LDPC codeword by using a retransmission parity-check matrix, to obtain the second LDPC codeword, wherein the retransmission parity-check matrix is the same as a parity-check matrix used for the first LDPC codeword; or encoding the information bits of the first LDPC codeword by using a retransmission parity-check matrix, to obtain the second LDPC codeword, wherein the retransmission parity-check matrix has a preset relationship with a parity-check matrix of the first LDPC.

17. The sending apparatus according to claim 13, wherein the information bits of the first LDPC codeword comprise the first information bit set and the second information bit set, and the second LDPC codeword is obtained based on the information bits of the first LDPC codeword and the steps further comprise one of:

scrambling the information bits of the first LDPC codeword by using a retransmission scrambling sequence, to obtain scrambled to-be-encoded bits; and encode the scrambled to-be-encoded information bits by using a retransmission parity-check matrix, to obtain the second LDPC codeword, wherein the retransmission scrambling sequence is the same as a scrambling sequence used to scramble the information bits of the first LDPC codeword, and the retransmission parity-check matrix is the same as a parity-check matrix of the first LDPC codeword; or scrambling the information bits of the first LDPC codeword by using a retransmission scrambling sequence, to obtain scrambled to-be-encoded bits; and encode the scrambled to-be-encoded information bits by using a retransmission parity-check matrix, to obtain the second LDPC codeword, wherein the retransmission scrambling sequence is the same as a scrambling sequence used to scramble the information bits of the previously transmitted first LDPC codeword, and the retransmission parity-check matrix has a preset relationship with a parity-check matrix of the first LDPC codeword.

18. The sending apparatus according to claim 13, wherein the at least one retransmitted codeword obtained after the first A-MPDU subframe is encoded is carried in a physical layer protocol data unit PPDU; and a preamble of the PPDU comprises at least one of the following:

an MPDU retransmission indication, wherein a first value of the MPDU retransmission indication is used to indicate that the PPDU comprises a retransmitted MPDU;

a modulation and coding scheme indication, wherein the modulation and coding scheme indication is a special value, and the special value is used to indicate that the PPDU comprises only a retransmitted MPDU;

a retransmitted-MPDU length indication, used to indicate a total length of an A-MPDU subframe that comprises a retransmitted MPDU in the PPDU; or a scrambler seed indication, used to indicate a scrambler seed used to scramble a retransmitted MPDU.

19. A retransmitted data receiving apparatus, applied to a receive end, and comprising:

a processor; and a non-transitory medium storing instructions, that when executed by the processor cause the receiving apparatus to perform steps comprising:

determining a first media access control protocol data unit (MPDU) that needs to be retransmitted in a previously transmitted first aggregate media access control protocol data unit (A-MPDU), wherein the first MPDU is comprised in a first A-MPDU subframe of the A-MPDU, wherein at least one previously transmitted low density parity check (LDPC) codeword obtained after the first A-MPDU subframe is encoded comprises a first LDPC codeword, and information bits of the first LDPC codeword correspond to a first information bit set in the first A-MPDU subframe and a second information bit set not comprised in the first A-MPDU subframe; and receiving at least one retransmitted LDPC codeword that is obtained after the first A-MPDU subframe is encoded and that is retransmitted by a transmit end, wherein the at least one retransmitted codeword comprises a punctured codeword, the punctured codeword is all or some of encoded bits obtained after the second information bit set of a second LDPC codeword is punctured, and the second LDPC codeword is generated based on the information bits of the first LDPC codeword, wherein performing combined decoding or joint decoding on the at least one retransmitted LDPC codeword and the at least one previously received previously-transmitted LDPC codeword, to obtain the first A-MPDU subframe.

20. The receiving apparatus according to claim 19, wherein the at least one retransmitted LDPC codeword further comprises at least one unpunctured codeword, and all information bits corresponding to the at least one unpunctured codeword are comprised in the first A-MPDU subframe.

* * * * *